(12) United States Patent
Niki

(10) Patent No.: US 8,027,146 B2
(45) Date of Patent: Sep. 27, 2011

(54) ELECTRIC CIRCUIT DEVICE ENABLING IMPEDANCE REDUCTION

(75) Inventor: Kazuya Niki, Hirakata (JP)

(73) Assignee: SANYO Electric Co., Ltd., Moriguchi-shi, Osaka (JP)

( * ) Notice: Subject to any disclaimer, the term of this patent is extended or adjusted under 35 U.S.C. 154(b) by 677 days.

(21) Appl. No.: 12/159,104

(22) PCT Filed: Nov. 24, 2006

(86) PCT No.: PCT/JP2006/323451
§ 371 (c)(1),
(2), (4) Date: Jun. 25, 2008

(87) PCT Pub. No.: WO2007/074598
PCT Pub. Date: Jul. 5, 2007

(65) Prior Publication Data
US 2010/0277851 A1    Nov. 4, 2010

(30) Foreign Application Priority Data
Dec. 26, 2005 (JP) ................................. 2005-372844

(51) Int. Cl.
*H01G 4/228* (2006.01)
*H01G 4/005* (2006.01)

(52) U.S. Cl. ..................................... 361/306.1; 361/303

(58) Field of Classification Search ............... 361/306.1, 361/302, 303, 321.2, 306.3, 306.2
See application file for complete search history.

(56) References Cited

U.S. PATENT DOCUMENTS

| | | | |
|---|---|---|---|
| 6,185,091 B1 | 2/2001 | Tanahashi et al. | |
| 6,331,930 B1 | 12/2001 | Kuroda et al. | |
| 6,331,932 B1 | 12/2001 | Kobayashi et al. | |
| 6,388,863 B1 * | 5/2002 | Horie | 361/303 |
| 6,699,809 B2 | 3/2004 | Fujikawa et al. | |
| 6,768,630 B2 | 7/2004 | Togashi | |
| 6,922,329 B2 * | 7/2005 | Togashi | 361/309 |

(Continued)

FOREIGN PATENT DOCUMENTS

CN    1469402 A    1/2004

(Continued)

OTHER PUBLICATIONS

Japanese Office Action dated Sep. 28, 2010, issued in corresponding Japanese Patent Application No. 2006-195565.

(Continued)

*Primary Examiner* — Eric Thomas
*Assistant Examiner* — David M Sinclair
(74) *Attorney, Agent, or Firm* — Westerman, Hattori, Daniels & Adrian, LLP

(57) ABSTRACT

An electric circuit device (101) comprises an electric element (100) and a substrate (200). The electric element (100) comprises a conductive plate (11, 12), a conductive plate (21 to 23), a side anode electrode (10A, 10B) connected to the conductive plate (11, 12), and a side cathode electrode (20A, 20B, 20C, 20D) connected to the conductive plate (21-23). The conductive plate (11, 12) is alternately laminated with the conductive plate (21-23). The substrate (200) includes a dielectric (201) and a conductive plate (202-205). The conductive plate (202) is connected to the side anode electrode (10A). The conductive plate (203) is connected to the side anode electrode (10B). The conductive plate (204) is connected to the side cathode electrode (20A, 20B). The conductive plate (205) is connected to the side cathode electrode (20C, 20D).

6 Claims, 40 Drawing Sheets

U.S. PATENT DOCUMENTS

| | | |
|---|---|---|
| 7,016,176 B1 * | 3/2006 | Sundstrom ............... 361/309 |
| 7,019,957 B2 | 3/2006 | Togashi et al. |
| 7,031,141 B2 * | 4/2006 | Kuriyama ............... 361/528 |
| 7,050,289 B2 | 5/2006 | Togashi |
| 7,315,226 B2 * | 1/2008 | Tohya et al. ............ 333/182 |
| 7,355,835 B2 * | 4/2008 | Saitou et al. ........... 361/301.4 |
| 7,403,369 B2 * | 7/2008 | Roy ..................... 361/303 |
| 7,545,624 B2 * | 6/2009 | Lee et al. ............... 361/306.3 |
| 2003/0089514 A1 | 5/2003 | Hayama et al. |
| 2004/0008531 A1 * | 1/2004 | Arai et al. ............... 363/144 |
| 2004/0047540 A1 | 3/2004 | Moto et al. |
| 2007/0067066 A1 | 3/2007 | Niki |
| 2007/0076350 A1 * | 4/2007 | Watanabe et al. ........ 361/520 |
| 2007/0146099 A1 | 6/2007 | Ezaki et al. |
| 2007/0159272 A1 | 7/2007 | Niki |

FOREIGN PATENT DOCUMENTS

| | | | |
|---|---|---|---|
| CN | 1661741 A | | 8/2005 |
| EP | 0 936 642 A2 | | 8/1999 |
| EP | 1 372 167 A1 | | 12/2003 |
| JP | 54-180943 U | | 12/1979 |
| JP | 59-56831 U | | 4/1984 |
| JP | 59-127311 A | | 7/1984 |
| JP | 61-65609 U | | 5/1986 |
| JP | 63-45917 U | | 3/1988 |
| JP | 04-056207 A | | 2/1992 |
| JP | 4-103013 U | | 9/1992 |
| JP | 06-260364 A | | 9/1994 |
| JP | 06267802 A | * | 9/1994 |
| JP | 09-153752 A | | 6/1997 |
| JP | 10-004027 A | | 1/1998 |
| JP | 11-102839 A | | 4/1999 |
| JP | 11-144996 A | | 5/1999 |
| JP | 11-163656 A | | 6/1999 |
| JP | 11-251178 A | | 9/1999 |
| JP | 11-288846 A | | 10/1999 |
| JP | 2004-014961 A | | 1/2004 |
| JP | 2004-080773 A | | 3/2004 |
| JP | 2004-228552 A | | 8/2004 |
| JP | 2004-336041 A | | 11/2004 |
| JP | 2005-032900 A | | 2/2005 |
| JP | 2005-191504 A | | 7/2005 |
| JP | 2007-096272 A | | 4/2007 |
| WO | 01/099237 A1 | | 12/2001 |
| WO | 2007/074598 A1 | | 7/2007 |

OTHER PUBLICATIONS

International Search Report of PCT/JP2006/323451; date of mailing Feb. 27, 2007.

Japanese Office Action dated Nov. 30, 2010, issued in corresponding Japanese Patent Application No. 2006-220850.

Chinese Office Action issued Jan. 9, 2009 in related application 2006101717093.

Chinese Office Action issued Feb. 6, 2009 in related application 2006101725193.

* cited by examiner (a)

(b)

(c)

(d)

(e)

ELECTRIC CIRCUIT DEVICE ENABLING IMPEDANCE REDUCTION

TECHNICAL FIELD

The present invention relates to electric circuit devices. It particularly relates to electric circuit devices with low impedance.

BACKGROUND ART

In recent years, digital circuit technologies such as the LSI (Large Scale Integrated) circuit are used not only for computers or communication-related equipment, but also for home appliances or in-vehicle equipment.

A high-frequency current generated in, for example, an LSI does not stay in the vicinity of the LSI. The high-frequency current widely spreads in the mount circuit board such as a printed-circuit board, inductively couples to the signal wirings and ground wirings, and then leaks from, for example, the signal cables as an electromagnetic wave.

In mixed-signal circuits having both of an analog circuit and a digital circuit, such as a conventional analog circuit a part of which is replaced with a digital circuit or a digital circuit having an analog input/output, one of the serious problems is electromagnetic interference from the digital circuit to the analog circuit.

An effective solution for this problem is to separate the LSI, which is a source of the high-frequency current, from the power sourcing system with respect to the high-frequency current, that is to say, a power-source decoupling technique. A well known noise filter using this power source decoupling technique is a transmission-line type noise filter (Japanese Unexamined Patent Application Publication No. 2004-80773).

This transmission-line type noise filter comprises first and second electric conductors, a dielectric layer, and first and second anodes. Each of the first and second electric conductors is in the shape of a plate. The dielectric layer is disposed between the first and second electric conductors.

The first anode is connected to one end of the first electric conductor in the longitudinal direction, while the second anode is connected to the other end of the first electric conductor in the longitudinal direction. The second electric conductor functions as a cathode for connection to the reference potential. The first electric conductor, the dielectric layer and the second electric conductor constitute a capacitor. The thickness of the first electric conductor is set so as to substantially prevent temperature rise caused by the direct component of the current that flows across the first electric conductor.

The transmission-line type noise filter is connected between a power source and the LSI so as to feed a current from the power source to the LSI through a route formed of the first anode, the first electric conductor and the second anode while attenuating the alternating current generated in the LSI.

As described above, the transmission-line type noise filter constitutes a capacitor and utilizes the first and second electric conductors, which are two electrodes in the capacitor, as transmission lines.

Patent Document 1: Japanese Unexamined Patent Application Publication No. 2004-80773

DISCLOSURE OF THE INVENTION

The transmission-line type noise filter has, however, the impedance given by (inductance/capacitance)$^{1/2}$ and is provided with no means to reduce the inductance. In addition, as the frequency increases, the impedance is dominated more by the inductance than the capacitance. Therefore, unfortunately, the conventional transmission-line type noise filter cannot achieve the impedance lower than that determined by the inductance which the transmission-line type noise filter fundamentally has.

In addition to that, it is difficult to prevent an unwanted high-frequency current generated in an electric load circuit, such as a CPU, from leaking toward the power source.

Therefore, the present invention is aimed at solving the aforementioned problems, and one of its objects is to provide an electric circuit device enables impedance reduction by reducing the inductance.

Further, another object of the present invention is to provide an electric circuit device enables prevention of leakage of a high-frequency current generated in an electric load circuit toward the power source.

According to the present invention, an electric circuit device comprises an electric element and a current control member. The electric element is connected between first and second terminals. The current control member conducts the alternating component of a first current supplied from the first terminal at least to a conductive plate in the electric element, receives from the second terminal a second current that is the return current of the first current, and conducts the alternating component of the received second current at least to a conductive plate in the electric element. The electric element includes n (n is a positive integer) first conductive plate and m (m is a positive integer) second conductive plate. The n first conductive plate respectively conducts the alternating component of the first current at least from the first terminal side to the second terminal side. The m second conductive plate is alternately laminated with the n first conductive plate and respectively conducts the alternating component of the second current at least from the second terminal side to the first terminal side.

Preferably, the electric element further comprises first and second anode electrodes and first and second cathode electrodes. The first anode electrode is disposed on the first terminal side and connected to one end of the n first conductive plate. The second anode electrode is disposed on the second terminal side and connected to the other end of the n first conductive plate. The first cathode electrode is disposed on the first terminal side and connected to one end of the m second conductive plate. The second cathode electrode is disposed on the second terminal side and connected to the other end of the m second conductive plate. The current control member is connected to the first and the second cathode electrodes and includes a third conductive plate having the impedance larger than the impedance of the m second conductive plate.

Preferably, the electric element further comprises first and second anode electrodes and first and second cathode electrodes. The first anode electrode is disposed on the first terminal side and connected to one end of the n first conductive plate. The second anode electrode is disposed on the second terminal side and connected to the other end of the n first conductive plate. The first cathode electrode is disposed on the first terminal side and connected to one end of the m second conductive plate. The second cathode electrode is disposed on the second terminal side and connected to the other end of the m second conductive plate. The current control member conducts by the skin effect the alternating component of the first current to the n first conductive plate and conducts the direct component of the first current from the first anode electrode to the second anode electrode.

Further, according to the present invention, the electric circuit device comprises a substrate and an electric element. The electric element is disposed on the substrate and connected between first and second terminals. The electric element includes first and second anode electrodes, first and second cathode electrodes, n (n is a positive integer) first conductive plate, and m (m is a positive integer) second conductive plate. The first anode electrode is disposed on the first terminal side. The second anode electrode is disposed on the second terminal side. The first cathode electrode is disposed on the first terminal side. The second cathode electrode is disposed on the second terminal side. The n first conductive plate is connected to the first and the second anode electrodes. The m second conductive plate is alternately laminated with the n first conductive plate and connected to the first and the second cathode electrodes. The substrate includes first to fourth conductor parts. The first conductor part is connected to the first anode electrode. The second conductor part is formed separated from the first conductor part and connected to the second anode electrode. The third conductor part is connected to the first cathode electrode. The fourth conductor part is formed separated from the third conductor part and connected to the second cathode electrode.

Further, according to the present invention, the electric circuit device comprises a substrate and an electric element. The electric element is disposed on the substrate and connected between first and second terminals. The electric element includes first and second anode electrodes, first and second cathode electrodes, n (n is a positive integer) first conductive plate, and m (m is a positive integer) second conductive plate. The first anode electrode is disposed on the first terminal side. The second anode electrode is disposed on the second terminal side. The first cathode electrode is disposed on the first terminal side. The second cathode electrode is disposed on the second terminal side. The n first conductive plate is connected to the first and the second anode electrodes. The m second conductive plate is alternately laminated with the n first conductive plate and connected to the first and the second cathode electrodes. The substrate includes first to fourth conductor parts and first and second slits. The first conductor part is connected to the first anode electrode. The second conductor part is connected to the second anode electrode. The first slit is formed between the first conductor part and the second conductor part. The third conductor part is connected to the first cathode electrode. The fourth conductor part is connected to the second cathode electrode. The second slit is formed between the third conductor part and the fourth conductor part.

Preferably, the first slit is formed of the same slit as the second slit.

Further, according to the present invention, the electric circuit device comprises an electric element and a first conductive plate. The electric element is connected between first and second terminals. The first conductive plate is connected to both ends of the electric element. The electric element includes first and second anode electrodes, first and second cathode electrodes, n (n is a positive integer) second conductive plate, and m (m is a positive integer) third conductive plate. The first anode electrode is disposed on the first terminal side. The second anode electrode is disposed on the second terminal side. The first cathode electrode is disposed on the first terminal side. The second cathode electrode is disposed on the second terminal side. The n second conductive plate is connected to the first and the second anode electrodes. The m third conductive plate is alternately laminated with the n second conductive plate and connected to the first and the second cathode electrodes. The first conductive plate is connected between the first and the second anode electrodes and includes on the surface a ridged part having a depth equal to or greater than the minimum depth. The minimum depth is less than the skin depth $d_s$ caused by the skin effect and suppresses the alternating component of a current flowing by the skin effect across the surface layer of the first conductive plate when the surface of the first conductive plate is flat.

Preferably, the first conductive plate includes first and second connections. The first connection connects the first anode electrode. The second connection connects the second anode electrode. The first and second connections have a width wider than the width of the electric element.

Preferably, the first conductive plate includes first and second connections. The first connection connects the first anode electrode. The second connection connects the second anode electrode. The first and second connections have an extension extending out in the width direction of the electric element and/or the longitudinal direction of the electric element.

Preferably, the minimum depth is set to a depth being less than the skin depth determined by the highest frequency of the alternating current component generated by an electric load circuit connected to the electric element and suppressing the alternating current component having the highest frequency and flowing by the skin effect across the surface layer of the first conductive plate.

Preferably, the ridged part has a depth equal to or greater than the skin depth.

Preferably, the skin depth is determined by the highest frequency.

Preferably, the ridged part has a depth equal to or greater than the skin depth and equal to or less than the maximum depth. The maximum depth is determined, when the number of the electric load circuit is one, based on the cross-section area of the first conductive plate required to conduct a direct current supplied to the one electric load circuit to the first conductive plate, and when j (j is a positive integer equal to or larger than 2) electric load circuits are connected to the electric element in parallel with each other, determined based on the cross-section area of the first conductive plate required to conduct direct currents supplied to all of the j electric load circuits to the first conductive plate.

Preferably, the skin depth is the skin depth at the lowest frequency of the frequencies of the alternating current component generated by the electric load circuit.

In the electric circuit device according to the present invention, the alternating component of a current is conducted to the conductive plate in the electric element, while the alternating component of the return current of the current is conducted to another conductive plate in the electric element. As a result, the conductive plate magnetically connect with another conductive plate, and the effective inductance of the conductive plate becomes smaller than the self inductance of the conductive plate.

Therefore, according to the present invention, the impedance of the electric circuit device is reduced. Further, the alternating component of the return current is confined within the electric element and prevented from leaking toward the power source.

BEST MODES FOR CARRYING OUT THE INVENTION

The present invention will now be described in embodiments with reference to the drawings more specifically. In the figures, identical or like components are identically denoted by the same reference numbers and explanations thereof are not repeated.

Embodiment 1

Figure 1:
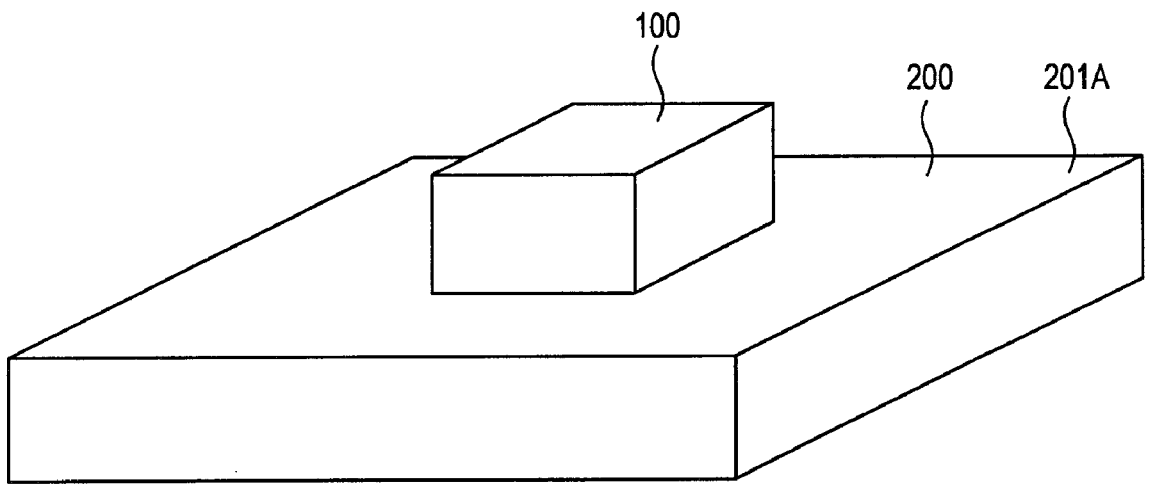
FIG. 1 is a schematic view illustrating the structure of an electric circuit device according to Embodiment 1 of the present invention.

FIG. 1 is a schematic view illustrating the structure of an electric circuit device according to Embodiment 1 of the present invention. With reference to FIG. 1, the electric circuit device 101 according to Embodiment 1 of the present invention comprises an electric element 100 and a substrate 200. The electric element 100 is disposed on a main surface 201A of the substrate 200.

Figure 2:
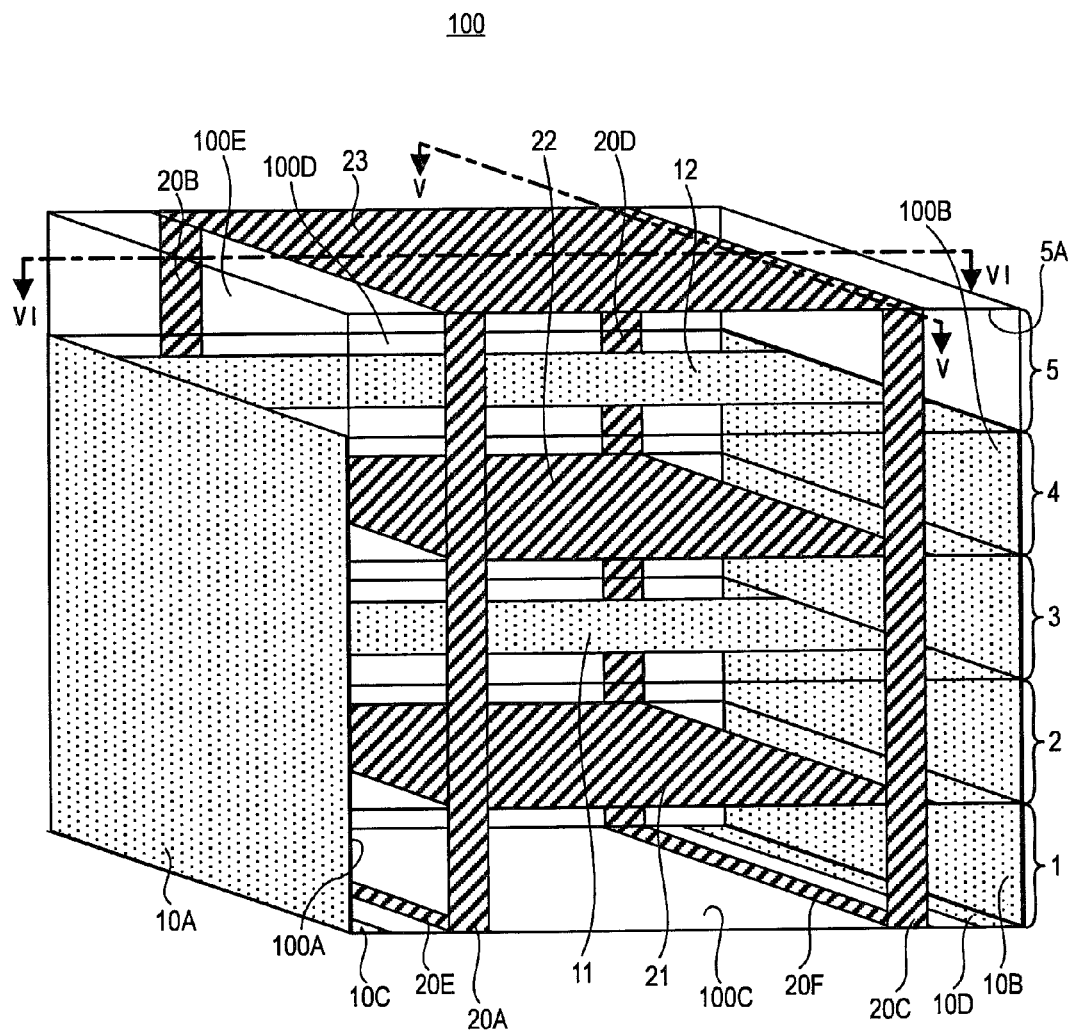
FIG. 2 is a schematic view illustrating the structure of the electric element shown in FIG. 1.

FIG. 2 is a schematic view illustrating the structure of the electric element 100 shown in FIG. 1. With reference to FIG. 2, the electric element 100 includes dielectric layers 1 to 5, conductive plates 11, 12, and 21 to 23, side anode electrodes 10A and 10B, anode electrodes 10C and 10D, side cathode electrodes 20A, 20B, 20C, and 20D and cathode electrodes 20E and 20F.

The dielectric layers 1 to 5 are sequentially laminated. Each of the conductive plates 11, 12, and 21 to 23 is in the shape of a plate. The conductive plate 21 is disposed between the dielectric layers 1 and 2, while the conductive plate 11 is disposed between the dielectric layers 2 and 3. The conductive plate 22 is disposed between the dielectric layers 3 and 4, while the conductive plate 12 is disposed between the dielectric layers 4 and 5. The conductive plate 23 is disposed on a main surface 5A of the dielectric layer 5. Accordingly, the dielectric layers 1 to 5 supports the conductive plates 21, 11, 22, 12, and 23, respectively.

The side anode electrode 10A is connected to one end of each of the conductive plates 11 and 12 and formed on the side surface 100A (which is formed of the side surfaces of the dielectric layers 1 to 4) of the electric element 100. The side anode electrode 10B is connected to the other end of each of the conductive plates 11 and 12 and formed on the side surface 100B (which formed of the side surfaces of the dielectric layers 1 to 4) facing the side surface 100A of the electric elements 100. Accordingly, the side anode electrode 10B is disposed facing the side anode electrode 10A.

The anode electrode 10C is disposed on the bottom surface 100C of the electric element 100 and connected to the side anode electrode 10A. The anode electrode 10D is disposed on the bottom surface 100C of the electric element 100 and is connected to the side anode electrode 10B.

The side cathode electrode 20A is connected to the conductive plates 21 to 23 on one end of each of the conductive plates 21 to 23 and disposed on the front surface 100D of the electric element 100. The side cathode electrode 20B is connected to the conductive plates 21 to 23 on one end of each of the conductive plates 21 to 23 and disposed on the back surface 100E facing the front surface 100D of the electric element 100. Accordingly, the side cathode electrode 20B is disposed facing the side cathode electrode 20A.

The side cathode electrode 20C is connected to the conductive plates 21 to 23 on the other end of each of the conductive plates 21 to 23 and disposed on the front surface 100D of the electric element 100. The side cathode electrode 20D is connected to the conductive plates 21 to 23 on the other end of each of the conductive plates 21 to 23 and is disposed on the back surface 100E facing the front surface 100D of the electric element 100. Accordingly, the side cathode electrode 20D is disposed facing the side cathode electrode 20C.

The cathode electrode 20E is connected to the side cathode electrodes 20A and 20B and disposed on the bottom surface 100C of the electric element 100. The cathode electrode 20F is connected to the side cathode electrodes 20C and 20D and disposed on the bottom surface 100C of the electric element 100.

As described above, in the electric element 100, the conductive plates 11, 12, and 21 to 23 and the dielectric layers 1 to 5 are alternately disposed. The electric element 100 also comprises the two anode electrodes 10C and 10D, and the two cathode electrodes 20E and 20F.

Each of the dielectric layers 1 to 5 includes, for example, barium titanate ($BaTiO_3$). Each of the side anode electrodes 10A and 10B, the anode electrodes 10C and 10D, the conductive plates 11, 12 and 21 to 23, the side cathode electrodes 20A, 20B, 20C, and 20D, and the cathode electrodes 20E and 20F includes, for example, nickel (Ni).

Figure 3:
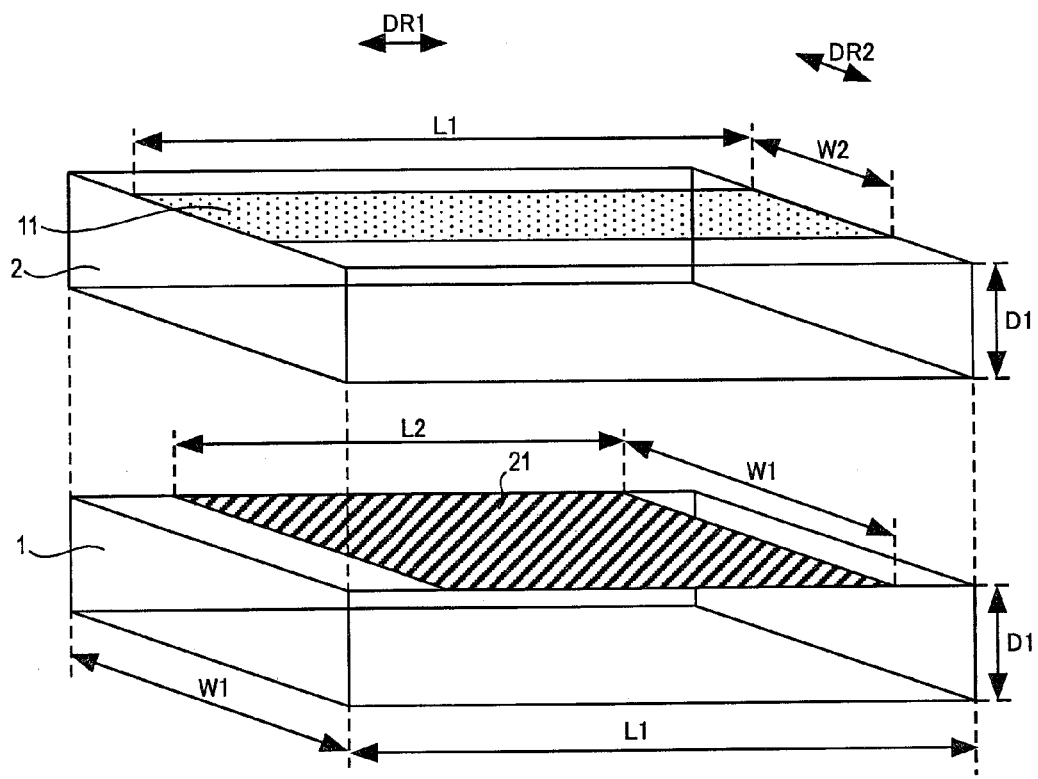
FIG. 3 illustrates the dimensions of the dielectric layers and the conductive plates shown in FIG. 1.

FIG. 3 illustrates the dimensions of the dielectric layers 1 and 2 and the conductive plates 11 and 21 shown in FIG. 1. With reference to FIG. 3, each of the dielectric layers 1 and 2 has a length L1 in the direction DR1 in which a current flows across the conductive plates 11 and 21, a width W1 in the direction DR2 perpendicular to the direction DR1, and a thickness D1. The length L1 is set to 15 mm, for example, and the width W1 is set to 13 mm, for example. The thickness D1 is set to 25 μm, for example.

The conductive plate 11 has the length L1 and a width W2. The W2 is set to 11 mm, for example. The conductive plate 21 has a length L2 and the width W1. The length L2 is set to 13 mm, for example. Each of the conductive plates 11 and 21 has a thickness of 10 μm to 20 μm.

Each of the dielectric layers 3 to 5 has the same length L1, the same width W1 and the same thickness D1 as the dielectric layers 1 and 2 shown in FIG. 3. The conductive plate 12 has the same length L1, the same width W2 and the same thickness as the conductive plate 11 shown in FIG. 3, while each of the conductive plates 22 and 23 has the same length L2, the same width W1 and the same thickness as the conductive plate 21 shown in FIG. 3.

As described above, the conductive plates 11 and 12 have a length and a width that are different from those of the conductive plates 21 to 23. This is to prevent the side anode electrodes 10A and 10B connected to the conductive plates 11 and 12 from shorting out with the side cathode electrodes 20A, 20B, 20C, and 20D connected to the conductive plates 21 to 23.

Figure 4:
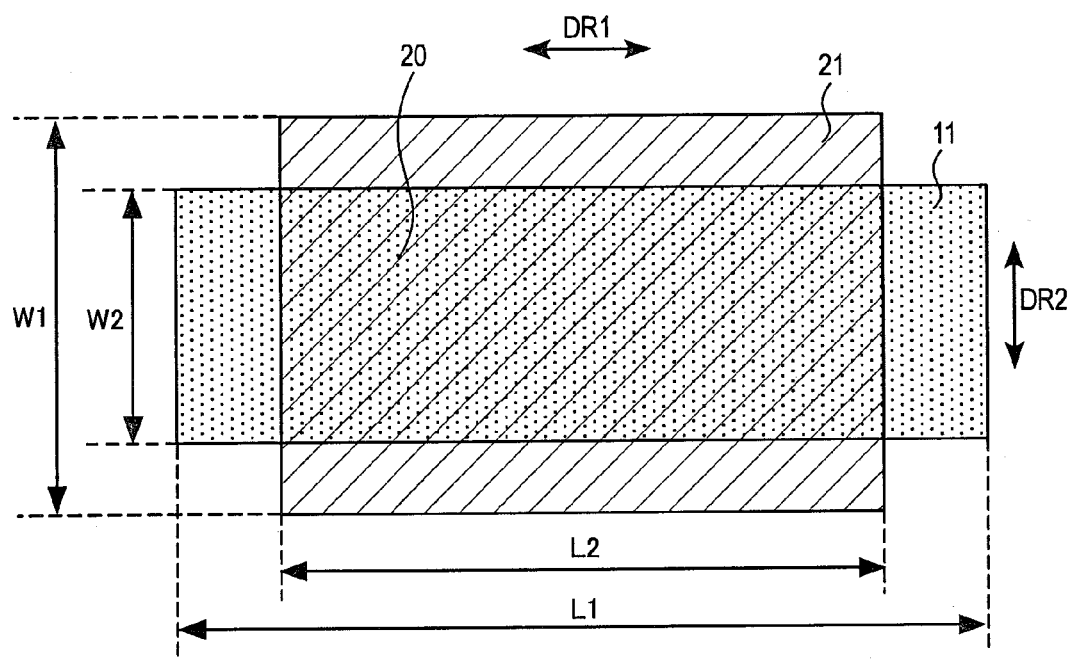
FIG. 4 is a plan view of two adjacent conductive plates.

FIG. 4 is a plan view of two adjacent conductive plates. With reference to FIG. 4, when projected onto a plain surface, the conductive plates 11 and 21 have an overlap 20. The overlap 20 between the conductive plates 11 and 21 has the length L2 and the width W2. Likewise, the overlap between the conductive plates 11 and 22, the overlap between the conductive plates 12 and 22 and the overlap between the conductive plates 12 and 23 have the same length L2 and the same width W2 as the overlap 20. In Embodiment 1, the length L2 and the width W2 are set to be $W2 \leq L2$.

Figure 5:
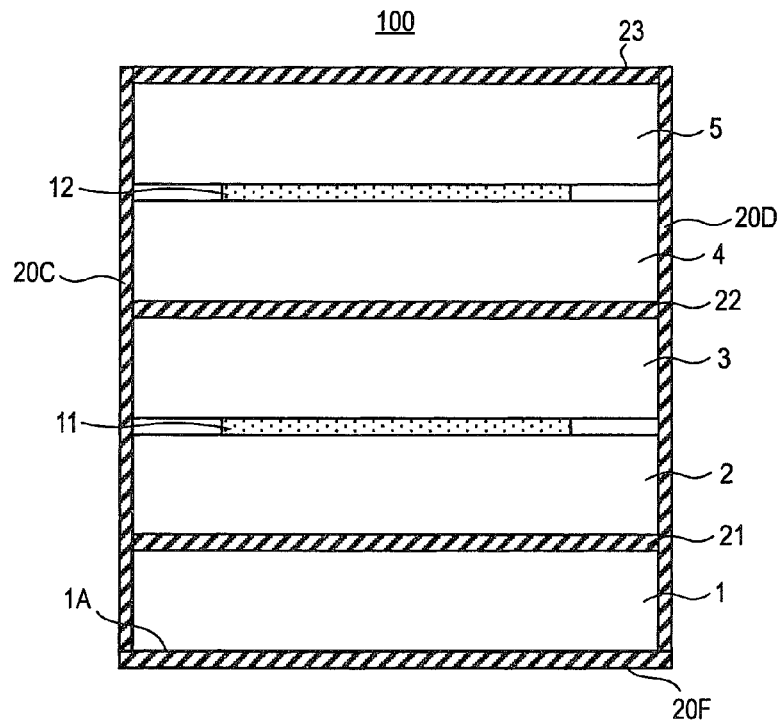
FIG. 5 is a cross sectional view of the electric element 100 taken along line V-V shown in FIG. 2.
Figure 6:
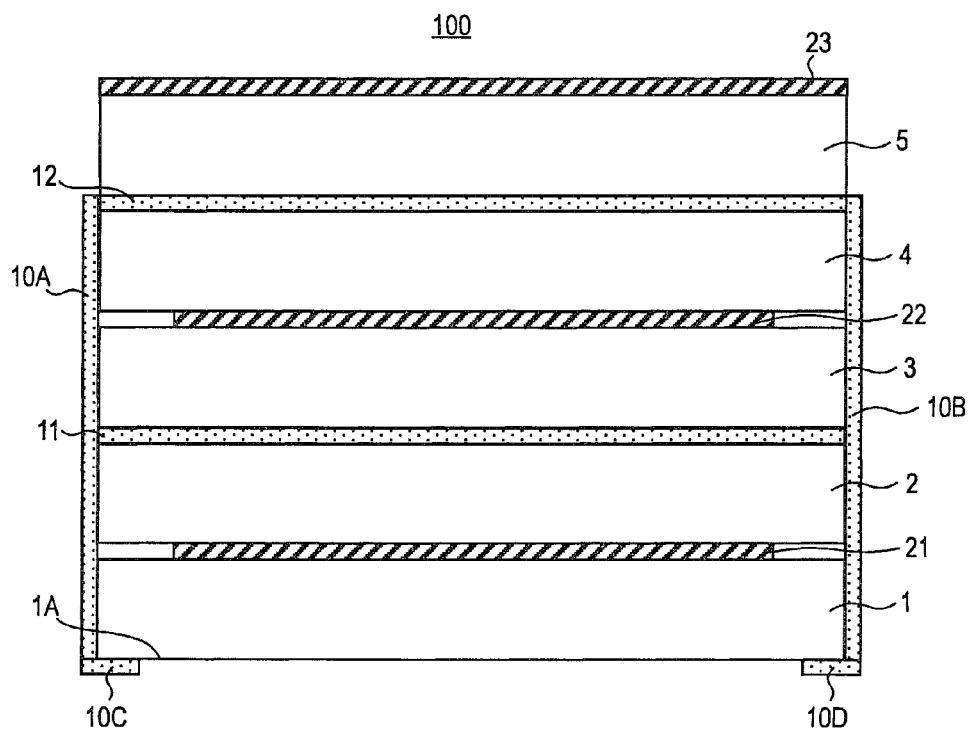
FIG. 6 is a cross sectional view of the electric element 100 taken along line VI-VI shown in FIG. 2.

FIG. 5 is a cross sectional view of the electric element 100 taken along line V-V shown in FIG. 2. FIG. 6 is a cross sectional view of the electric element 100 taken along line VI-VI shown in FIG. 2.

With reference to FIG. 5, the conductive plate 21 is in contact with both of the dielectric layers 1 and 2, while the conductive plate 11 is in contact with both of the dielectric layers 2 and 3. The conductive plate 22 is in contact with both of the dielectric layers 3 and 4, while the conductive plate 12 is in contact with both of the dielectric layers 4 and 5. Further, the conductive plate 23 is in contact with the dielectric layer 5.

The side cathode electrodes 20C and 20D are connected to the conductive plates 21 to 23, not to the conductive plates 11 and 12. The cathode electrode 20F is disposed on the back surface 1A of the dielectric layer 1 and connected to the side cathode electrodes 20C and 20D (see FIG. 5).

The side anode electrodes 10A and 10B are connected to the conductive plates 11 and 12, not to the conductive plates 21 to 23. The anode electrodes 10C and 10D are disposed on the back surface 1A of the dielectric layer 1 and connected to the side anode electrodes 10A and 10B, respectively (see FIG. 6).

Accordingly, sets of the conductive plate 21/the dielectric layer 2/the conductive plate 11, the conductive plate 11/the dielectric layer 3/the conductive plate 22, the conductive plate 22/the dielectric layer 4/the conductive plate 12, and the conductive plate 12/the dielectric layer 5/the conductive plate 23 constitute four capacitors connected in parallel with one another between the anode electrodes 10C and 10D and the cathode electrodes 20E and 20F.

In this case, the electrode area of each capacitor is equal to the area of the overlap 20 (see FIG. 4) between the two adjacent conductive plates.

Figure 7:
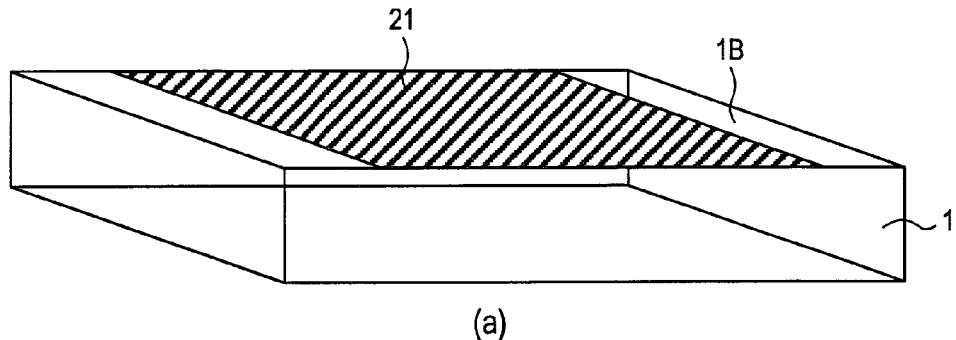
FIG. 7 is a first flowchart illustrating how the electric element shown in FIG. 2 is produced.

FIGS. 7 to 11 are first to fifth flowcharts each illustrating how the electric element 100 shown in FIG. 2 is produced, respectively. With reference to FIG. 7, an area having the length L2 and the width W1 in the surface 1B of a green sheet, which is to be the dielectric layer 1 (BaTiO$_3$) having the length L1, the width W1 and the thickness D1, is coated with Ni paste by screen printing to form the conductive plate 21 of Ni on the surface 1B of the dielectric layer 1.

Likewise, the dielectric layers 3 and 5 of BaTiO$_3$ are produced, and the conductive plates 22 and 23 of Ni are formed on the produced dielectric layers 3 and 5, respectively (see FIG. 7).

Then, an area having the length L1 and the width W2 in the surface 2A of a green sheet, which is to be the dielectric layer 2 (BaTiO$_3$) having the length L1, the width W1 and the thickness D1, is coated with Ni paste by screen printing to form the conductive plate 11 of Ni on the surface 2A of the dielectric layer 2.

Figure 8:
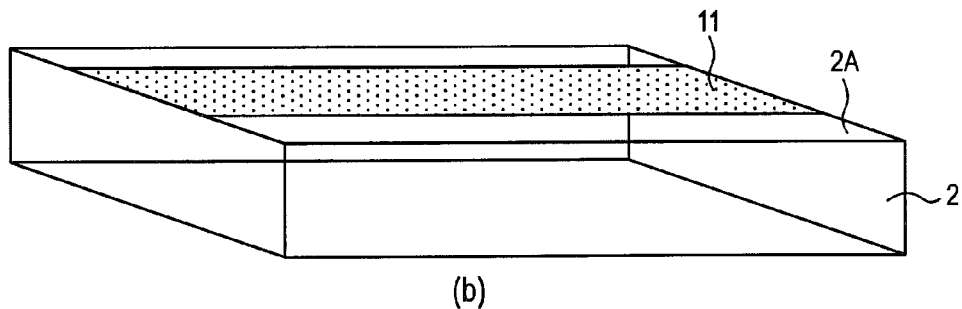
FIG. 8 is a second flowchart illustrating how the electric element shown in FIG. 2 is produced.

Likewise, the dielectric layer 4 of BaTiO$_3$ is produced, and the conductive plate 12 of Ni is formed on the produced dielectric layer 4 (see FIG. 8).

Figure 9:
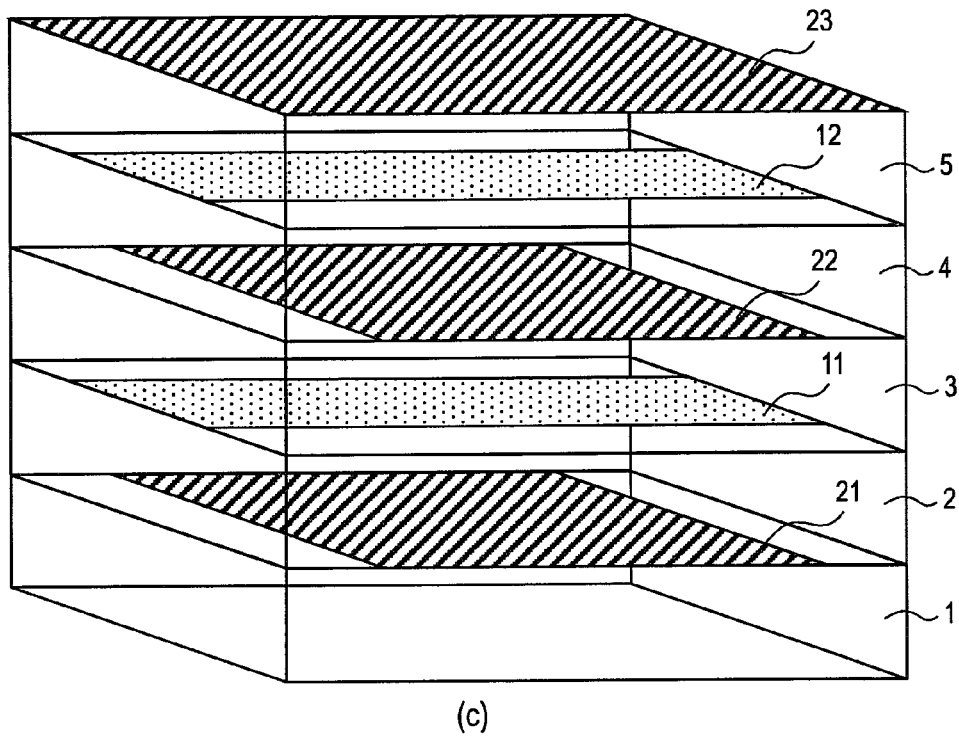
FIG. 9 is a third flowchart illustrating how the electric element shown in FIG. 2 is produced.

After that, the green sheets of the dielectric layers 1 to 5 on which the conductive plates 21, 11, 22, 12, and 23 are respectively formed are sequentially laminated (see FIG. 9). In this way, the conductive plates 11 and 12, which are connected to the anode electrodes 10C and 10D, and the conductive plates 21 to 23, which are connected to the cathode electrodes 20E and 20F, are alternately laminated.

Figure 10:
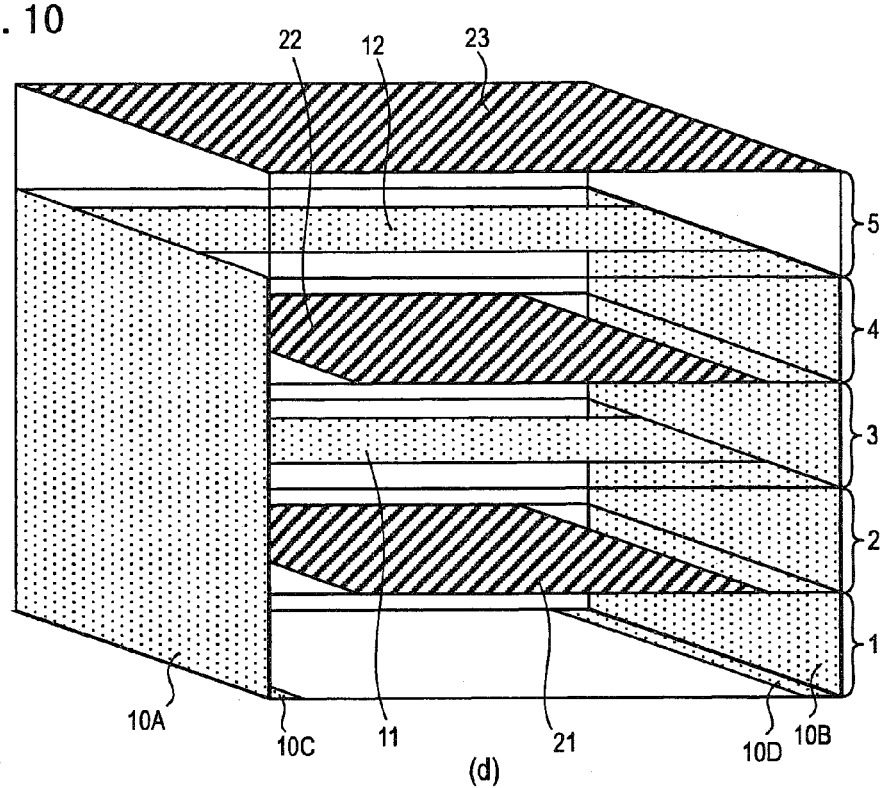
FIG. 10 is a fourth flowchart illustrating how the electric element shown in FIG. 2 is produced.
Figure 11:
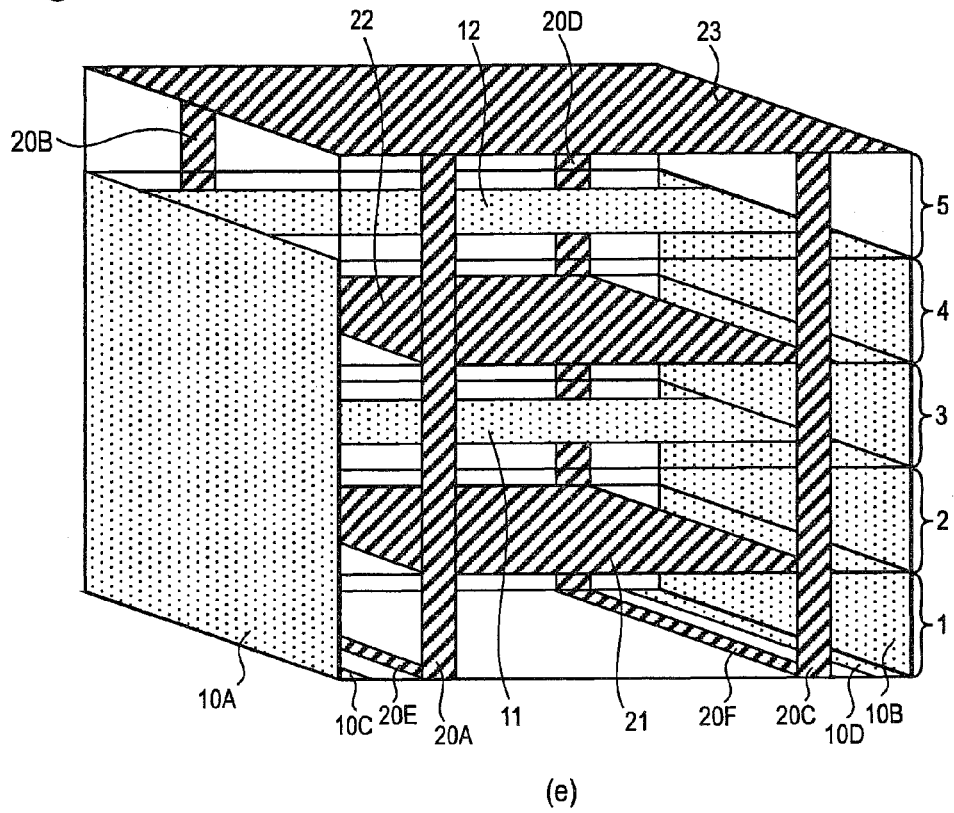
FIG. 11 is a fifth flowchart illustrating how the electric element shown in FIG. 2 is produced.

Further, Ni paste is applied by screen printing to form the side anode electrodes 10A and 10B, the anode electrodes 10C and 10D, the side cathode electrodes 20A, 20B, 20C, and 20D, and the cathode electrodes 20E and 20F (see FIG. 10 and FIG. 11.) After that, the element obtained at FIG. 11 is burned at 1350 degrees Celsius to complete the electric element 100. Or, a material with a lower melting point and higher conductivity than those of the internal electrodes (the conductive plates 11, 12, and 21 to 23) may be used, by means of post-firing, for the side electrode (the external electrode). Considering solder wettability or the like, the side electrode (the external electrode) may be plated with Ni, Au, Su, etc. after the burning, if necessary.

Note that the conductive plates 21, 11, 22, 12, and 23, and the dielectric layers 1 to 5 may be laminated without using a green sheet, but with repeating lamination steps of: printing and drying dielectric paste; printing a conductor thereon; and further printing dielectric paste.

Figure 12:
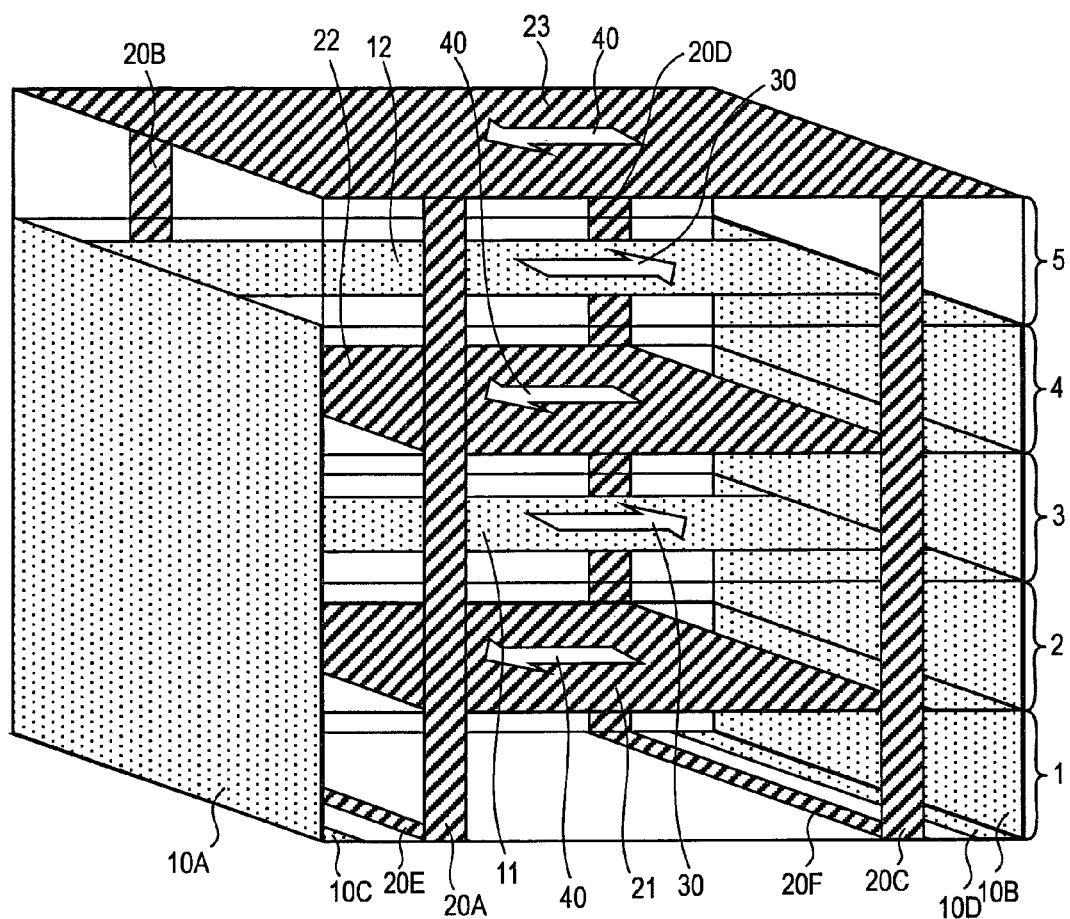
FIG. 12 is a perspective view explaining the functions of the electric element shown in FIG. 2.

FIG. 12 is a perspective view explaining the functions of the electric element 100 shown in FIG. 2. With reference to FIG. 12, when a current is applied to the electric element 100, the cathode electrodes 20E and 20F are connected to ground potential, and the current is applied so as to flow across the conductive plates 11 and 12 and across the conductive plates 21 to 23 in opposite directions.

For example, a current is applied across the electric element 100 so as to flow in the direction from the anode electrode 10C to the anode electrode 10D. In this case, the current flows from the anode electrode 10C to the conductive plates 11 and 12 through the side anode electrode 10A, and flows across the conductive plates 11 and 12 in the direction shown with the arrows 30, and then flows to the anode electrode 10D through the side anode electrode 10B.

The return current of the current flowing across the conductive plates 11 and 12 flows from the cathode electrode 20F to the conductive plates 21 to 23 through the side cathode electrodes 20C and 20D, and flows across the conductive plates 21 to 23 in the direction shown with the arrows 40, which is the opposite direction to the arrows 30, and then flows to the cathode electrode 20E through the side cathode electrodes 20A and 20B.

Accordingly, the current I1 flowing across the conductive plates 11 and 12 and the current I2 flowing across the conductive plates 21 to 23 have the same strength and flow in opposite directions.

Figure 13:
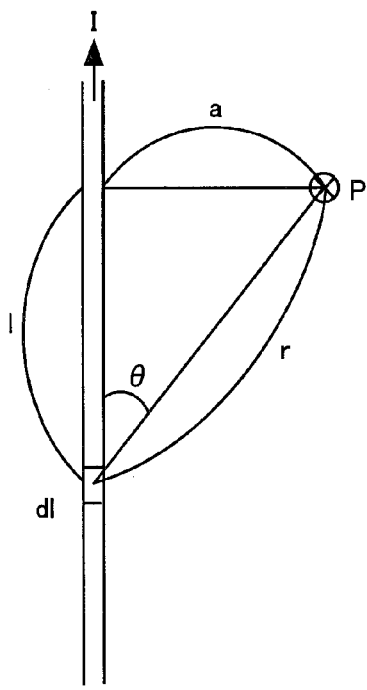
FIG. 13 is a diagram illustrating the magnetic flux density produced by a current flowing across a conductive wire.
Figure 14:
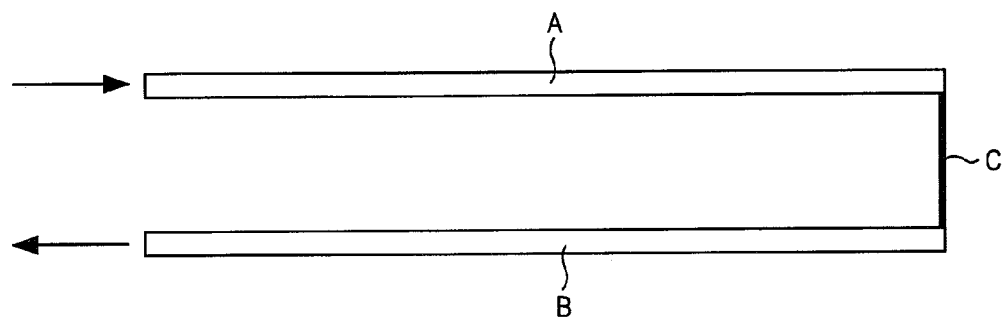
FIG. 14 is a diagram illustrating the effective inductance obtained when the two conductive wires magnetically interfere with each other.

FIG. 13 is a diagram illustrating the magnetic flux density produced by a current flowing across a conductive wire. FIG. 14 is a diagram illustrating the effective inductance obtained when the two conductive wires magnetically interfere with each other.

With reference to FIG. 13, when a current I is flowing across a straight conductive wire with infinite length, a magnetic flux density B produced at point P, which is distance-a away from the conductive wire, is given by the following equation:

[Equation 1]

$$B = \frac{\mu_0 I}{2\pi r} \quad (1)$$

Here, $\mu_0$ is space permeability.

If two conductive wires are given in FIG. 13 and magnetically interfere with each other, the mutual inductance $L_{12}$ of the two conductive wires is given by the following equation in which the self inductance of the two conductive wires is $L_{11}$ and $L_{22}$, respectively, and the coupling coefficient is k (0<k<1):

[Equation 2]

$$L_{12} = k \cdot \sqrt{L_{11} \cdot L_{22}}$$

Here, if $L_{11}$ is equal to $L_{22}$, the mutual inductance $L_{12}$ is given by the following equation:

[Equation 3]

$$L_{12} = k \cdot L_{11} \quad (3)$$

With reference to FIG. 14, if conductive wires A and B are connected through a lead wire C and currents of equal strength flow across the conductive wires A and B in opposite directions, the effective inductance $L_{11\,effective}$ of the conductive wire A is given by the following equation:

[Equation 4]

$$L_{11\,effective} = L_{11} - L_{12} \quad (4)$$

As described above, when the two conductive wires A and B magnetically interfere with each other, the effective inductance $L_{11\,effective}$ of the conductive wire A is smaller than the self inductance $L_{11}$ of the conductive wire A because of the mutual inductance $L_{12}$ with the conductive wire B. This is because, when the current I flows across the conductive wire A in the opposite direction to the current –I flowing across the conductive wire B, the magnetic interference between the conductive wires A and B becomes large, which results in the mutual inductance $L_{12}$ larger than the self inductance $L_{11}$ of the conductive wire A.

Figure 15:
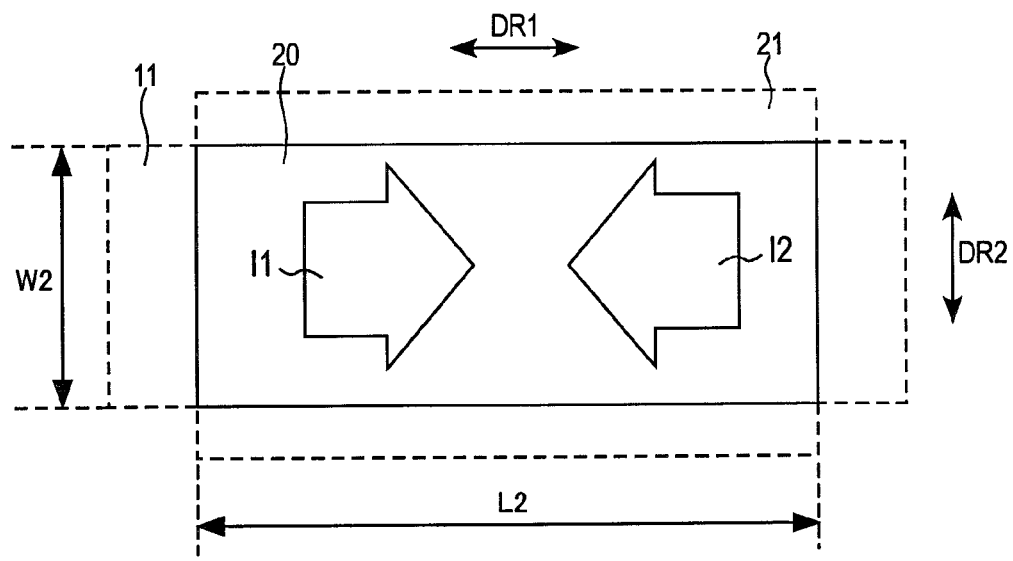
FIG. 15 is a first conceptual diagram illustrating how the inductance of the electric element shown in FIG. 2 decreases.
Figure 16:
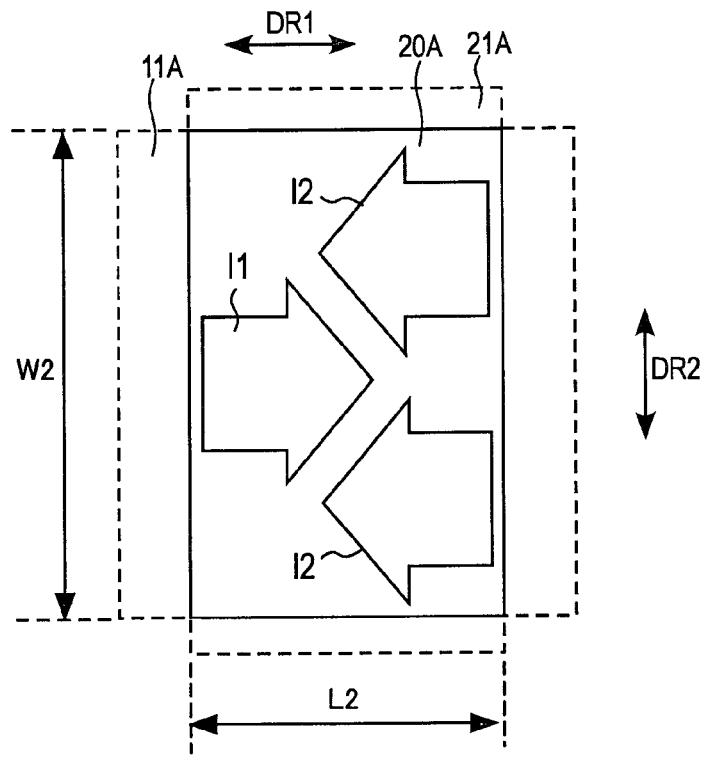
FIG. 16 is a second conceptual diagram illustrating how the inductance of the electric element shown in FIG. 2 decreases.

FIGS. 15 and 16 are first and second conceptual diagrams each illustrating how the inductance of the electric element 100 shown in FIG. 2 decreases, respectively. In the electric element 100, as described above, the conductive plate 11 is disposed at a position of 25 μm away from the conductive plates 21 and 22, while the conductive plate 12 is disposed at a position of 25 μm away from the conductive plates 22 and 23. Therefore, the conductive plate 11 and the conductive plate 12 magnetically interfere with the conductive plates 21 and 22, and the conductive plates 22 and 23, respectively. Since the current I1 flowing across the conductive plates 11 and 12 and the current I2 flowing across the conductive plates 21 to 23 have the same current strength and flow in opposite directions, the effective inductance of the conductive plates 11 and 12 is smaller than the self inductance of the conductive plates 11 and 12 because of the mutual inductance between the conductive plates 11 and 12 and the conductive plates 21 to 23.

In this case, when the length L2 of the overlap 20 between the conductive plates 11 and 12 and the conductive plates 21 to 23 is equal to or lager than the width W2, the self inductance of the conductive plates 11 and 12 decreases more rapidly than when the length L2 of the overlap 20 is shorter than the width W2. The reasons therefor are described below with reference to FIGS. 15 and 16.

FIG. 15 illustrates the overlap 20 having the length L2 equal to or longer than the width W2, while FIG. 16 illustrates the overlap 20 having the length L2 shorter than the width W2. Note that the arrows in FIGS. 15 and 16 represent currents which are broad in the direction DR2. In addition, in FIG. 15 and FIG. 16, the areas of the overlap 20 are equal to one another.

With reference to FIG. 15, the current I1 flows across the conductive plate 11, and the current I2 flows across the conductive plate 21. Then, when the length L2 of the overlap 20 is equal to or longer than its width W2, the currents I1 and I2 respectively flow across the conductive plates 11 and 21, spreading almost all over the width W2 of the overlap 20. Accordingly, the magnetic interference between the conductive plate 11 and the conductive plate 21 relatively increases and, because of the mutual inductance with the conductive plate 21, the effective inductance of the conductive plate 11 becomes smaller than the self inductance of the conductive plate 11 by a relatively large amount. The same is true for the effective inductance of the conductive plate 12 which becomes smaller than the self inductance of the conductive plate 12.

With reference to FIG. 16, when the length L2 of the overlap 20 is shorter than its width W2, the current I1 flows across the conductive plate 11 in the substantial center thereof in the direction DR2, and the current I2 flows near the ends of the conductive plate 21 in the direction DR2.

This is because, if the length L2 is shorter than the width W2, the impedance caused when the current I1, which is induced from the side anode electrode 10A to the conductive plate 11, flows in the longitudinal direction DR1 is smaller than the impedance caused when the current I1 spreads toward the width direction DR2 of the conductive plate 11.

Also because, if the length L2 is shorter than the width W2, the impedance caused when the current I2, which is induced from the side cathode electrodes 20C and 20D to the conductive plate 21, flows in the longitudinal direction DR1 of the conductive plate 21 is smaller than the impedance caused when the current I2 spreads toward the width direction DR2 of the conductive plate 21.

Accordingly, when the length L2 of the overlap 20 is shorter than the width W2, the current I1 flows across the overlap 20 in the substantial center thereof in the width direction DR2. The current I2 flows near the ends of the overlap 20 in the width direction DR2. As a result, the magnetic interference between the conductive plate 11 and the conductive plate 21 relatively decreases and, because of the mutual inductance with the conductive plate 21, the effective inductance of the conductive plate 11 becomes smaller than the self inductance of the conductive plate 11 by a relatively small amount. The same is true for the effective inductance of the conductive plate 12 which becomes smaller than the self inductance of the conductive plate 12.

As described above, when the length L2 of the overlap 20 is equal to or longer than its width W2, the effective inductance of the conductive plates 11 and 12 becomes smaller than the self inductance of the conductive plates 11 and 12 by a relatively large amount.

Accordingly, the effective inductance L of the overall electric element 100 decreases relatively rapidly.

The impedance Zs of the electric element 100 is given by the following equation in which C is the effective capacitance of the overall electric element 100:

[Equation 5]

$$Z_S \cong \sqrt{\frac{L}{C}} \quad (5)$$

In the electric element 100, as described above, the four capacitors connected in parallel with each other are formed and therefore, compared to the case where one capacitor is formed, the effective capacitance C becomes larger.

Therefore, in the electric element 100, in the low-frequency range where the capacitance is dominant, the impedance Zs decreases in response to an increase in the effective capacitance C. In the high-frequency range where the inductance is dominant, the impedance Zs decreases in response to a decrease in the effective inductance L as described above.

Accordingly, the electric element 100 has the relatively low impedance Zs in a wide range of frequencies.

Figure 17:
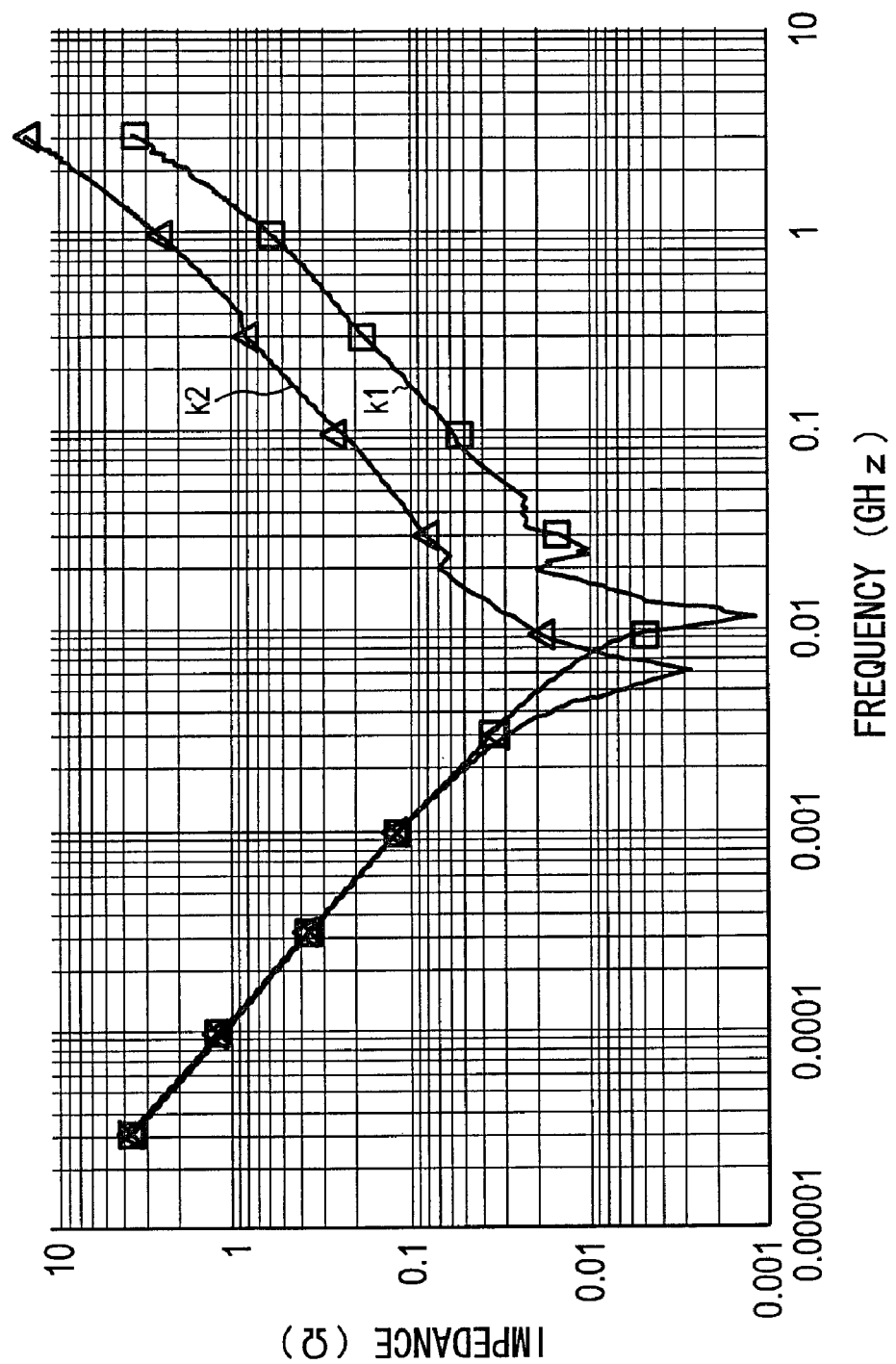
FIG. 17 is a graph illustrating the dependence of the impedance on the frequency in the electric element shown in FIG. 2.

FIG. 17 is a graph illustrating the dependence of the impedance on the frequency in the electric element 100 shown in FIG. 2. In FIG. 17, the abscissa axis represents the frequency, and the longitudinal axis represents the impedance. Curve k1 represents the dependence of the impedance on the frequency obtained when the length L2 of the overlap 20 is equal to or longer than its width W2. Curve k2 represents the dependence of the impedance on the frequency obtained when the length L2 of the overlap 20 is shorter than its width W2.

With reference to FIG. 17, in the low frequency range of 0.006 GHz or lower, the capacitance is dominant. In the high frequency range of 0.01 GHz or higher, the inductance is dominant. As described above, when the length L2 of the overlap 20 is equal to or longer than its width W2 and when the length L2 of the overlap 20 is shorter than its width W2, since the areas of the overlap 20 are equal to one another, in the low frequency range of 0.006 GHz or lower where the capacitance is dominant, the impedance (curve k1) of the electric element 100 having the overlap 20 the length L2 of which is equal to or longer than the width W2 is the substantially same as the impedance (curve k2) of the electric element having the overlap 20 the length L2 of which is shorter than the width W2.

On the other hand, when the length L2 of the overlap 20 is equal to or longer than its width W2, compared to the case where the length L2 of the overlap 20 is shorter than its width W2, the inductance of the electric element 100 decreases relatively rapidly. Therefore, in the high frequency range of 0.01 GHz or higher where the inductance is dominant, the impedance (curve k1) of the electric element 100 having the overlap 20 the length L2 of which is equal to or longer than its width W2 is smaller than the impedance (curve k2) of the electric element having the overlap 20 the length L2 of which is shorter than its width W2.

Accordingly, by setting the length L2 of the overlap 20 between the conductive plates 11 and 12 and the conductive plates 21 to 23 so as to be equal to or longer than the width W2, the impedance of the electric element 100 is reduced in a frequency range where the inductance is dominant.

Figure 18:
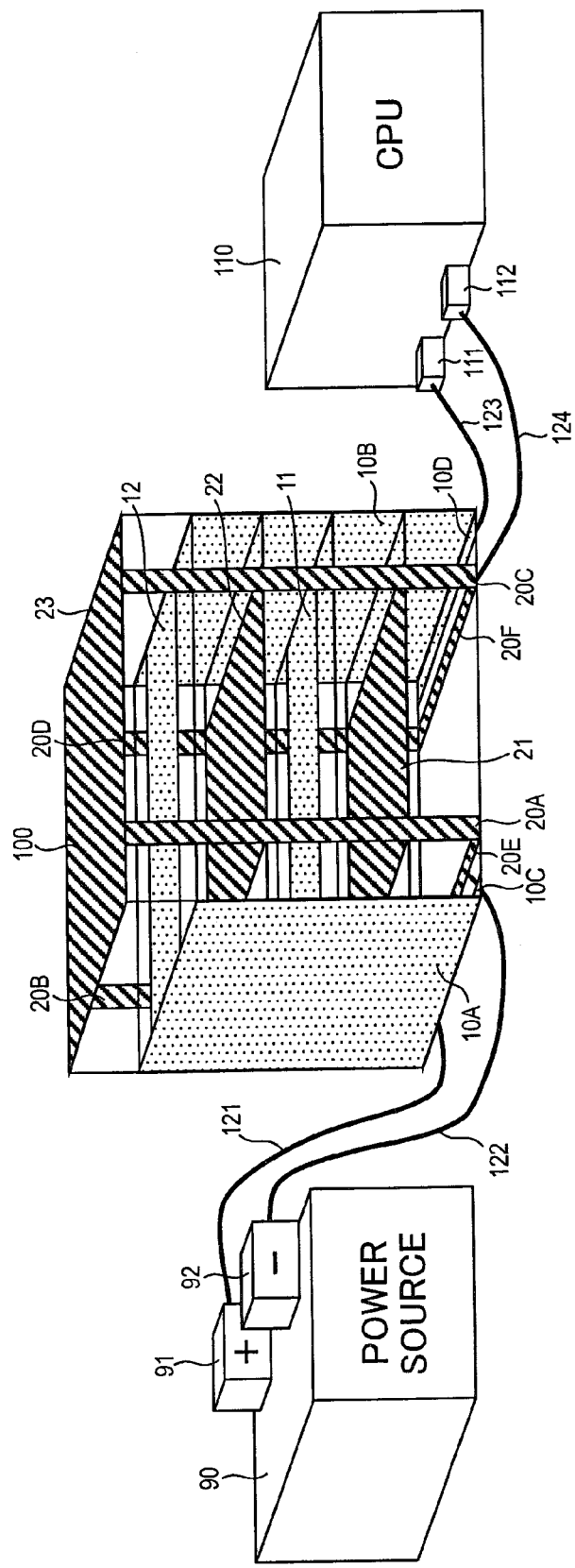
FIG. 18 is a conceptual view of the electric element shown in FIG. 2 in a state of use.

FIG. 18 is a conceptual view of the electric element 100 shown in FIG. 2 in a state of use. With reference to FIG. 18, the electric element 100 is connected between a power source 90 and a CPU (Central Processing Unit) 110. The cathode electrodes 20E and 20F of the electric element 100 is connected to ground potential. The power source 90 includes a positive terminal 91 and a negative terminal 92. The CPU 110 includes a positive terminal 111 and a negative terminal 112.

One end of a lead wire 121 is connected to the positive terminal 91 of the power source 90, and the other end is connected to the anode electrode 10C of the electric element 100. One end of a lead wire 122 is connected to the negative terminal 92 of the power source 90, and the other end is connected to the cathode electrode 20E of the electric element 100.

One end of a lead wire 123 is connected to the anode electrode 10D of the electric element 100, and the other end is connected to the positive terminal 111 of the CPU 110. One end of a lead wire 124 is connected to the cathode electrode 20F of the electric element 100, and the other end is connected to the negative terminal 112 of the CPU 110.

Then, the current I output from the positive terminal 91 of the power source 90 flows across the anode electrode 10C of the electric element 100 through the lead wire 121, and then flows across the electric element 100 in order of the side anode electrode 10A, the conductive plates 11 and 12, the side anode electrode 10B, and the anode electrode 10D. Then, the current I flows into the CPU 110 from the anode electrode 10D via the lead wire 123 and the positive terminal 111.

In this way, the current I is supplied to the CPU 110 as a power source current. Then, the CPU 110 is driven by the current I and outputs from the negative terminal 112 a return current Ir, which has the same strength as the current I.

Then, the return current Ir flows across the cathode electrode 20F of the electric element 100 through the lead wire 124, and flows across the electric element 100 in order of the side cathode electrodes 20C and 20D, the conductive plates 21 to 23, the side cathode electrodes 20A and 20B, and the cathode electrode 20E. The return current Ir flows into the power source 90 from the cathode electrode 20E through the lead wire 122 and the negative terminal 92.

As a result, in the electric element 100, the current I flows across the conductive plates 11 and 12 in the direction from the power source 90 to the CPU 110, and the return current Ir flows across the conductive plates 21 to 23 in the direction from the CPU 110 to the power source 90. Therefore, the effective inductance L of the electric element 100 decreases relatively rapidly, as described above. Further, the electric element 100 includes the four capacitors connected in parallel with each other and therefore, the effective capacitance C of the electric element 100 is large. Accordingly, the impedance Zs of the electric element 100 is reduced.

The CPU 110 is driven by the current I supplied from the power source 90 via the electric element 100 and generates an unwanted high frequency current. This unwanted high frequency current leaks into the electric element 100 through the lead wires 123 and 124. The electric element 100, however, has the low impedance Zs as described above, and the unwanted high frequency current circulates in a circuit formed of the electric element 100 and the CPU 110 and prevented from leaking from the electric element 100 toward the power source 90.

The operating frequency of the CPU 110 tends to shift toward the high frequency, and the operation at some 1 GHz is envisaged. In the range of such a high operating frequency, the impedance Zs of the electric element 100 is determined mainly by the effective inductance L. Since the effective inductance L decreases relatively rapidly as described above, the electric element 100 functions as a noise filter to confine the unwanted high frequency current, which is generated by the CPU 110 operating at a high operating frequency, within the vicinity of the CPU 110.

In Embodiment 1, the length L2 and the width W2 of the overlap 20 are set to be L2≧W2. As the operating frequency of the CPU 110 relatively increases, L2/W2 is set to relatively large values. In this way, the impedance of the electric element 100 in the high frequency range decreases rapidly.

As described above, the electric element 100 is connected between the power source 90 and the CPU 110 and functions as a noise filter to confine the unwanted high frequency current, which is generated by the CPU 110, within the vicinity of the CPU 110. When the electric element 100 is connected between the power source 90 and the CPU 110, the conductive plates 11, 12 and 21 to 23 are connected as transmission lines. More specifically, the capacitor comprising the conductive plates 11 and 12, which are connected to the anode electrodes 10C and 10D, and the conductive plates 21 to 23, which are connected to the cathode electrodes 20E and 20F, are not connected to transmission lines via the terminals: the conductive plates 11, 12 and 21 to 23 are connected as a part of the transmission lines. Therefore, the conductive plates 11 and 12 are conductors for the current I output from the power source 90 to flow in the direction from the power source 90 to the CPU 110, while the conductive plates 21 to 23 are conductors for the return current Ir to flow in the direction from the CPU 110 to the power source 90. As a result, the equivalent series inductance is avoided as much as possible.

Further, in the electric element 100, by setting the current flowing across the conductive plates 11 and 12 connected to the anode electrodes 10C and 10D so as to flow in the opposite direction to the current flowing across the conductive plates 21 to 23 connected to the cathode electrodes 20E and 20F, magnetic interference is produced between the conductive plates 11 and 12 and the conductive plates 21 to 23 in order to decrease the self inductance of the conductive plates 11 and 12 by means of the mutual inductance between the conductive plates 11 and 12 and the conductive plates 21 to 23. In this way, the effective inductance of the electric element 100 is reduced, which results in the reduced impedance Zs of the electric element 100.

As described above, the present invention is firstly characterized in that the conductive plates 11, 12 and 21 to 23 constituting the electrodes of the capacitor are connected as a part of transmission lines. The present invention is secondly characterized in that the effective inductance of the conductive plates 11 and 12 is reduced to be smaller than the self inductance of the conductive plates 11 and 12 to reduce the impedance Zs of the electric element 100, by respectively applying currents that flow in opposite directions to the conductive plates 11 and 12, which are connected to the anode electrodes 10C and 10D, and to the conductive plates 21 to 23, which are connected to the cathode electrodes 20E and 20F, to produce magnetic interference between the conductive plates 11 and 12 and the conductive plates 21 to 23. The present invention is thirdly characterized in that each of the conductive plates 11 and 12, which conduct a current constituting the power source current, is disposed between two conductive plates (the conductive plates 21 and 22 or the conductive plates 22 and 23) connected to ground potential.

The above-described second characteristic is realized by employing the constitution in which the return current Ir from the CPU 110 is conducted to the conductive plates 21 to 23 disposed in the electric element 100.

With the first characteristic, the equivalent series inductance is avoided as much as possible. With the second characteristic, the unwanted high frequency current is confined within the vicinity of the CPU 110. Further, with the third characteristic, the noise of the electric element 100 is prevented from escaping out, while the electric element 100 is protected from influence by external noise.

Figure 19:
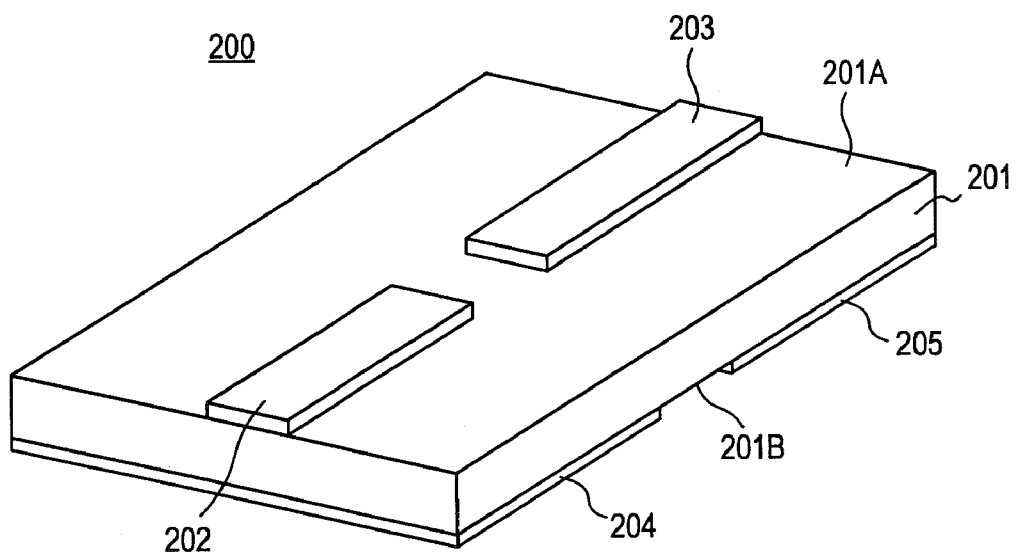
FIG. 19 is a perspective view illustrating the structure of the substrate shown in FIG. 1.

FIG. 19 is a perspective view illustrating the structure of the substrate 200 shown in FIG. 1. With reference to FIG. 19, the substrate 200 includes a dielectric 201, signal lines 202 and 203, and conductive plates 204 and 205.

The signal lines 202 and 203 are disposed with a certain distance from each other on a main surface 201A of the dielectric 201. The conductive plates 204 and 205 are disposed with a certain distance from each other on a main surface 201B facing the main surface 201A of the dielectric 201. As described above, the substrate 200 comprises a microstripline substrate where the signal lines 202 and 203 are disposed on one main surface 201A and the conductive plates 204 and 205 are disposed on the other main surface 201B.

Here, when the substrate 200 is used for the electric circuit device 101, the conductive plates 204 and 205 are grounded.

Figure 20:
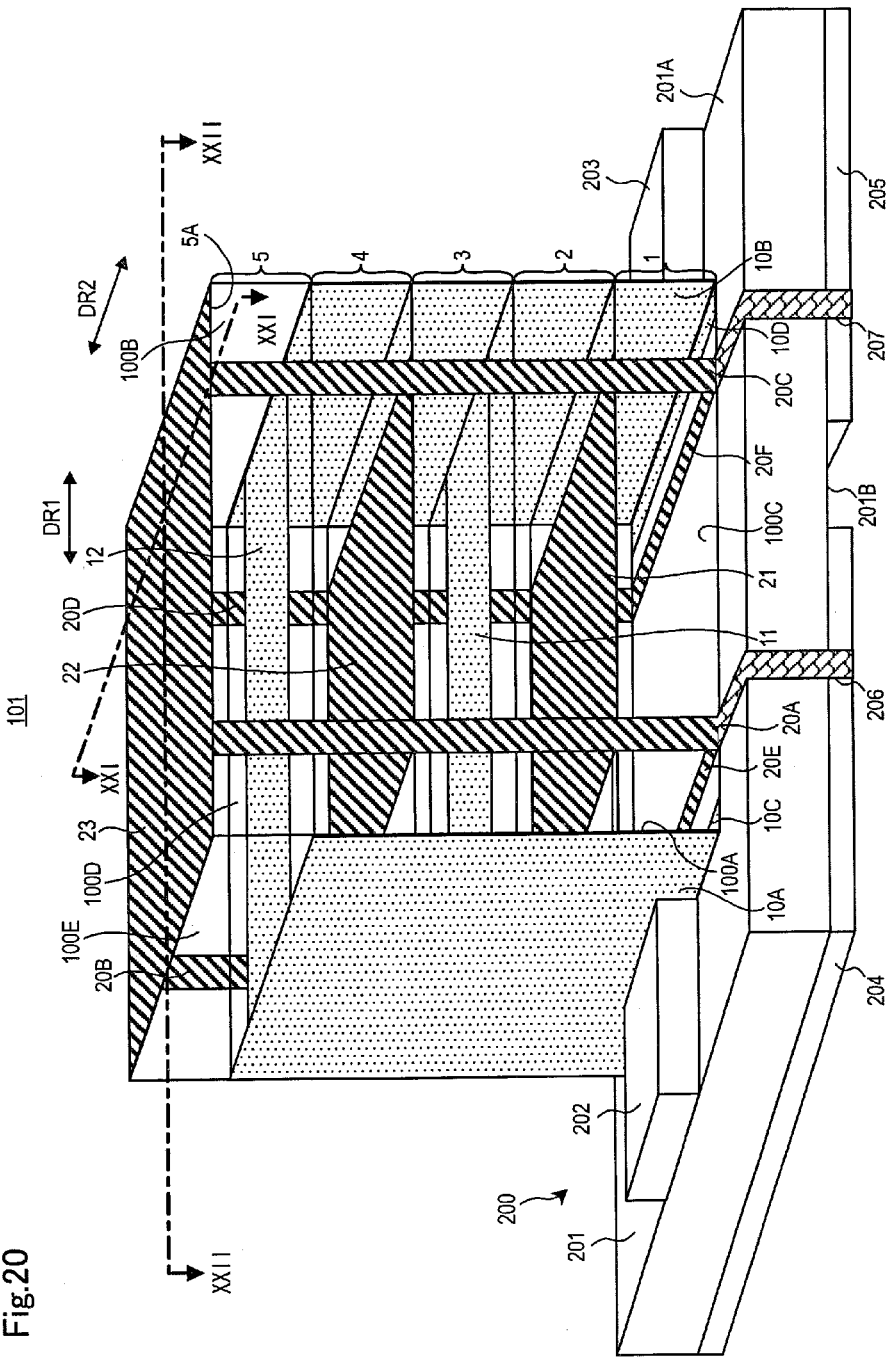
FIG. 20 is a perspective view illustrating in detail the electric circuit device shown in FIG. 1.

FIG. 20 is a perspective view illustrating in detail the electric circuit device 101 shown in FIG. 1. With reference to FIG. 20, the dielectric layers 1 to 5, the conductive plates 11, 12 and 21 to 23, the side anode electrodes 10A and 10B, the anode electrodes 10C and 10D, the side cathode electrodes 20A, 20B, 20C, and 20D, and the cathode electrodes 20E and 20F are disposed on the main surface 201A of the dielectric 201 in the substrate 200.

The side anode electrode 10A and the anode electrode 10C are connected to the signal line 202, while the side anode electrode 10B and the anode electrode 10D are connected to the signal line 203. The side cathode electrode 20A and the cathode electrode 20E are connected to the conductive plate 204 via the conductor 206, while the side cathode electrode 20C and the cathode electrode 20F are connected to the conductive plate 205 via the conductor 207. Note that, though not illustrated in FIG. 20, the side cathode electrode 20B is connected to the conductive plate 204 via a conductor (not illustrated), and the side cathode electrode 20D is connected to the conductive plate 205 via a conductor (not illustrated).

The conductive plates 204 and 205 are for the return current Ir, which is generated when the current I flows across the conductive plates 11 and 12, to flow across. The return current Ir flows from the conductive plate 205 to the side cathode electrodes 20C and 20D through the conductor 207 and the conductor (not illustrated), and then to the side cathode electrodes 20A and 20B through the conductive plates 21 to 23.

After flowing across the side cathode electrodes 20A and 20B, the return current Ir flows to the conductive plate 204 through the conductor 206 and the conductor (not illustrated), and then to the outside of the electric circuit device 101 through the conductive plate 204.

As described above, the substrate 200 comprises the conductive plates 204 and 205 conducting the return current Ir to the conductive plates 21 to 23 in the electric circuit device 101.

Figure 21:
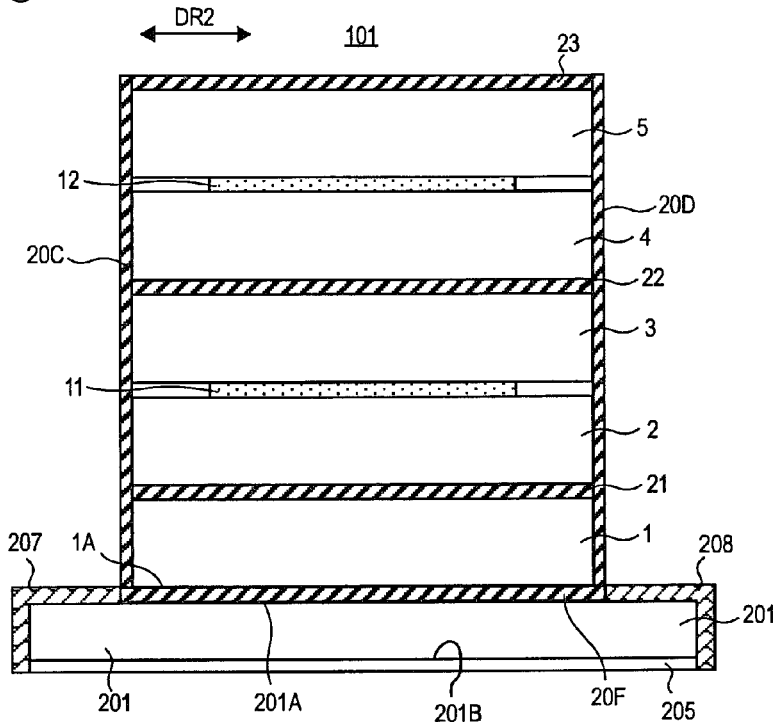
FIG. 21 is a cross sectional view of the electric circuit device taken along line XXI-XXI shown in FIG. 20.
Figure 22:
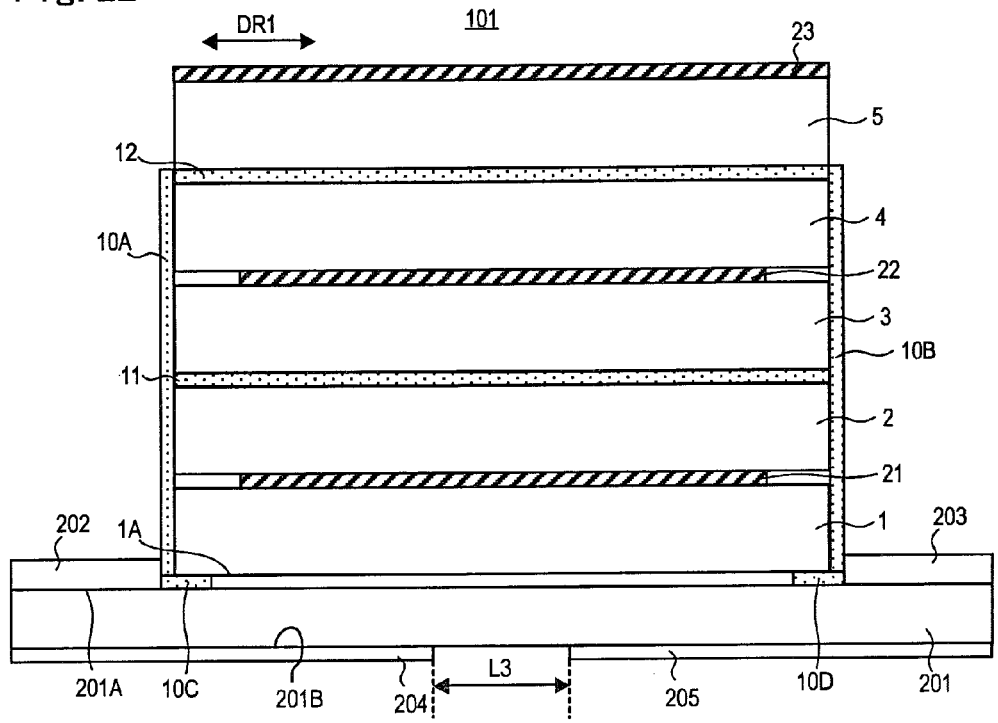
FIG. 22 is a cross sectional view of the electric circuit device taken along line XXII-XXII shown in FIG. 20.

FIG. 21 is a cross sectional view of the electric circuit device 101 taken along line XXI-XXI shown in FIG. 20. FIG. 22 is a cross sectional view of the electric circuit device 101 taken along line XXII-XXII shown in FIG. 20.

With reference to FIG. 21, the cathode electrode 20F is disposed on the main surface 201A of the dielectric 201. The conductive plate 205 is disposed on the main surface 201B of the dielectric 201 to the whole width of the dielectric 201. The conductive plates 205 is connected to the side cathode electrode 20C and the cathode electrode 20F via the conductor 207, and to the side cathode electrode 20D and the cathode electrode 20F via the conductor 208.

Note that the conductive plate 204 is connected to the side cathode electrodes 20A and 20B and the cathode electrode 20E in the same way as the conductive plate 205.

With reference to FIG. 22, the signal line 202 is connected to the side anode electrodes 10A and the anode electrode 10C. The signal line 203 is connected to the side anode electrode 10B and the anode electrode 10D.

The conductive plate 204 is disposed on the main surface 201B with a certain distance L3 from the conductive plate 205. The certain distance L3 is basically set to a distance enough to prevent the return current Ir of a certain frequency from flowing from the conductive plate 204 to the conductive plate 205.

As described above, by disposing the conductive plates 204 and 205 with the certain distance L3 from each other on the main surface 201B of the dielectric 201, the return current Ir is conducted to the conductive plates 21 to 23 in the electric circuit device 101, without flowing the return current Ir between the conductive plates 204 and 205.

As a result, the magnetic connection between the conductive plates 11 and 12 and the conductive plates 21 to 23 is relatively increased, and as is described above, the effective inductance of the conductive plates 11 and 12 becomes considerably smaller than the self inductance of the conductive plates 11 and 12.

Figure 23:
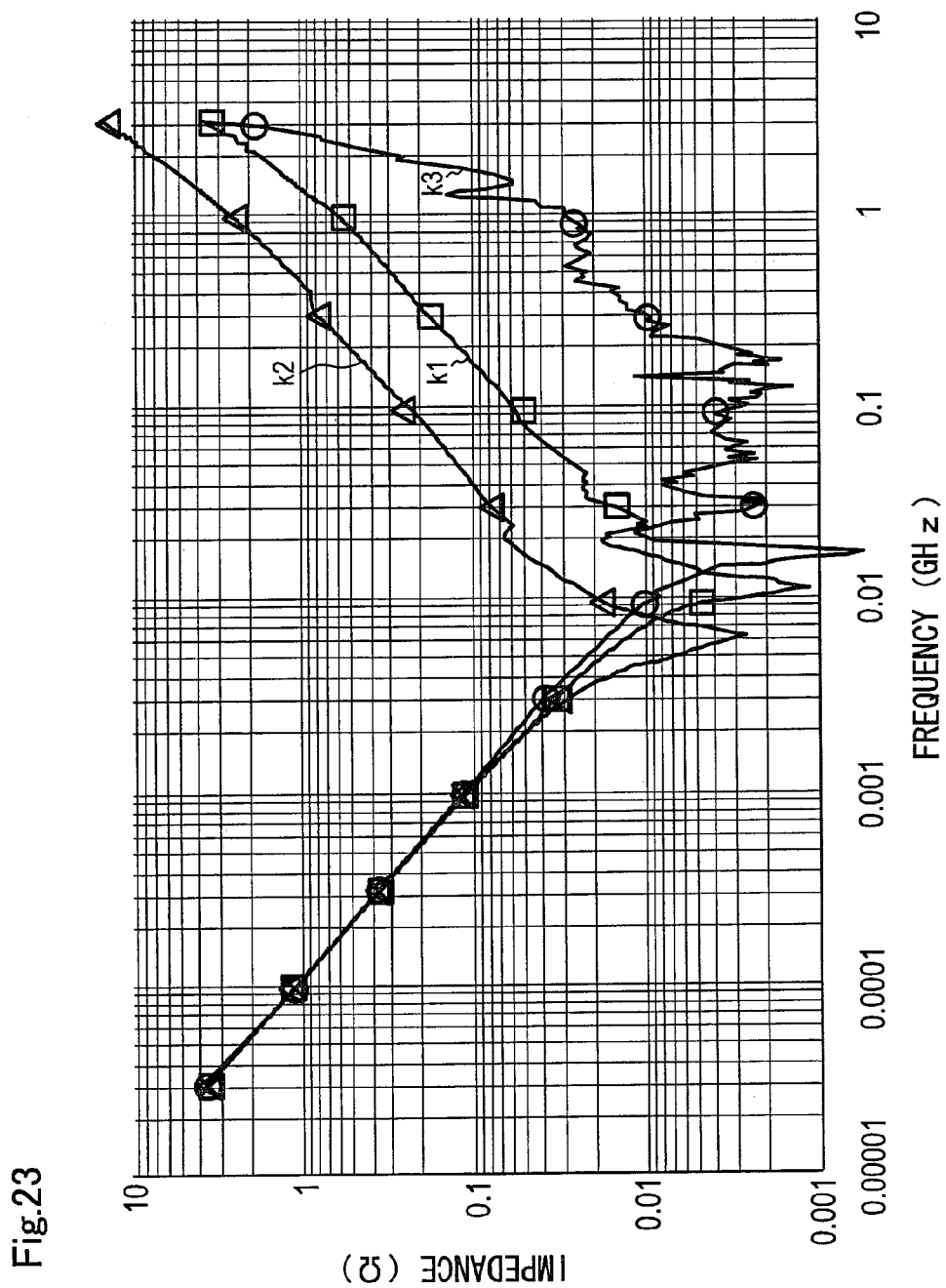
FIG. 23 is a graph illustrating the dependence of the impedance on the frequency in the electric circuit device shown in FIG. 20.

FIG. 23 is a graph illustrating the dependence of the impedance on the frequency in the electric circuit device 101 shown in FIG. 20. In FIG. 23, the longitudinal axis represents the impedance, and the abscissa axis represents the frequency. Curve k3 is the dependence of the impedance on the frequency in the electric circuit device 101.

With reference to FIG. 23, in the low frequency range of 0.006 GHz or lower where the capacitance is dominant, the impedance of the electric circuit device 101 is almost equal to the impedance of the electric element 100 (see curves k1 and k3).

On the other hand, in the high frequency range of 0.01 GHz or higher where the inductance is dominant, the impedance of the electric circuit device 101 is considerably smaller than the impedance of the electric element 100 (see curves k1 and k3).

Therefore, by using the substrate 200 in which the two conductive plates 204 and 205 are disposed with the certain distance L3 from each other, the return current Ir is conducted to the conductive plates 21 to 23 in the electric element 100, which results in confining the unwanted high frequency current generated in the CPU 110, which is an electric load circuit, within the electric element 100.

Figure 24:
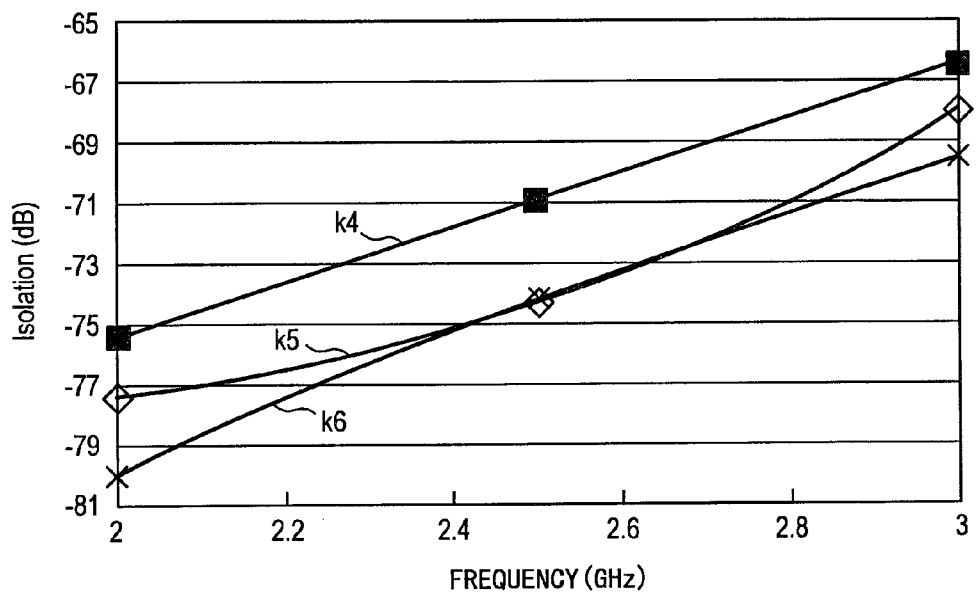
FIG. 24 is a graph illustrating the relationship between the electrical isolation and the frequency between the two conductive plates shown in FIG. 20.

FIG. 24 is a graph illustrating the relationship between the electrical isolation and the frequency between the two conductive plates 204 and 205 shown in FIG. 20. In FIG. 24, the longitudinal axis represents the isolation, and the abscissa axis represents the frequency. The smaller the isolation value is, the greater the electrical isolation is. The curves k4, k5 and k6 represents cases where the certain distance L3 is 1.5 mm, 3.0 mm and 4.5 mm, respectively.

With reference to FIG. 24, by increasing the certain distance L3 from 1.5 mm to 3.0 mm, the isolation value between the conductive plates 204 and 205 decreases in the frequency range of 2 to 3 GHz, and the electrical isolation between the conductive plates 204 and 205 increases. Here, even if the certain distance L3 is increased from 3.0 mm to 4.5 mm, the isolation between the conductive plates 204 and 205 hardly changes in the frequency range of 2 to 3 GHz. Therefore, preferably, the certain distance L3 is set to 3.0 mm or longer.

As described above, the electric circuit device 101 comprises the electric element 100, in which the conductive plates 11 and 12 and the conductive plates 21 to 23 are alternately laminated, and the substrate 200 comprising the conductive plates 204 and 205 disposed with the certain distance L3 from each other. Therefore, the electric circuit device 101 has the relatively low impedance because of a decrease in the effective inductance as described above, and the substrate 200 conducts a current from the conductive plate 202 to the conductive plates 11 and 12 in the electric element 100, and the return current Ir of the current I to the conductive plates 21 to 23 in the electric element 100. More specifically, the substrate 200 has a function to conduct a current to the conductive plates 11, 12 and 21 to 23 in the electric element 100. Therefore, the electric circuit device 101 supplies a DC current from the power source 90 to the CPU 110 and confines an unwanted high frequency current generated in the CPU 110 within the electric element 100.

Figure 25:
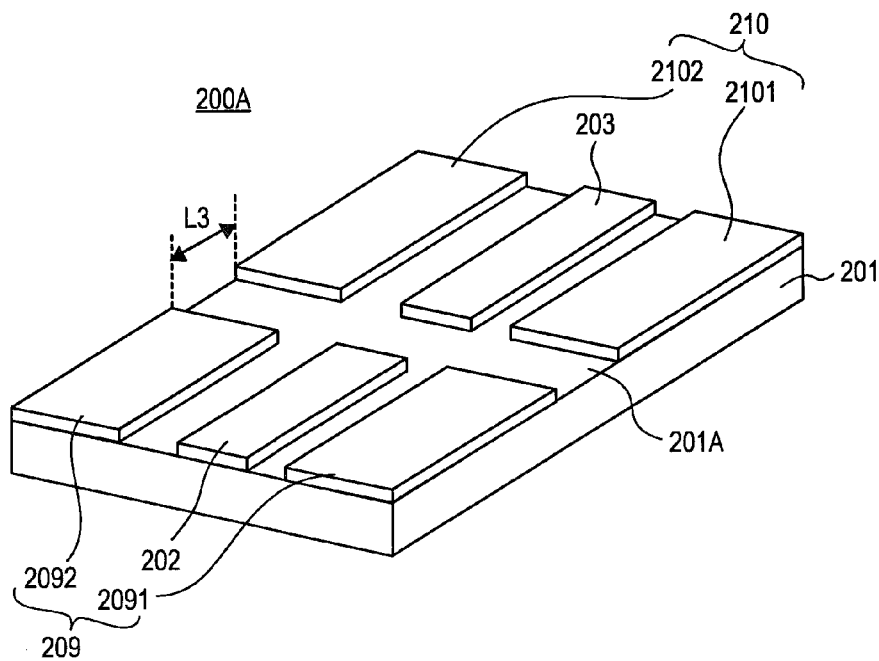
FIG. 25 is another perspective view illustrating the structure of the substrate shown in FIG. 1.

FIG. 25 is another perspective view illustrating the structure of the substrate 200 shown in FIG. 1. The substrate 200 shown in FIG. 1 may comprise a substrate 200A shown in FIG. 25. With reference to FIG. 25, the substrate 200A is identical with the substrate 200 shown in FIG. 19 except that the conductive plates 204 and 205 of the substrate 200 are respectively replaced with conductive plates 209 and 210.

The conductive plate 209 is disposed on the main surface 201A of the dielectric 201 and includes plate members 2091 and 2092. The plate members 2091 and 2092 are disposed on both sides of the signal line 202 on the main surface 201A of the dielectric 201.

The conductive plate 210 is disposed on the main surface 201A of the dielectric 201 and includes plate members 2101 and 2102. The plate members 2101 and 2102 are disposed on both sides of the signal line 203 on the main surface 201A of the dielectric 201. The distances between the plate member 2091 and the plate member 2101 and between the plate member 2092 and the plate member 2102 are set to the certain distance L3.

As described above, in the substrate 200A, the conductive plates 209 and 210 are disposed with the certain distance L3 from each other on the main surface 201A together with the signal lines 202 and 203. The conductive plates 209 and 210 respectively comprises the plate members 2091 and 2092, and 2101 and 2102 disposed on both sides of the signal lines 202 and 203. Therefore, the substrate 200A comprises a coplanar substrate.

When the substrate 200A is applied to the electric circuit device 101, the plate member 2091 of the conductive plate 209 is connected to the side cathode electrode 20A and the cathode electrode 20E via a conductor (not illustrated), while the plate member 2092 is connected to the side cathode electrode 20B and the cathode electrode 20E via a conductor (not illustrated). The plate member 2101 of the conductive plate 210 is connected to the side cathode electrode 20C and the cathode electrode 20F via a conductor (not illustrated), while the plate member 2102 is connected to the side cathode electrode 20D and the cathode electrode 20F via a conductor (not illustrated). The conductive plates 209 and 210 are grounded.

The substrate 200A comprises the two conductive plates 209 and 210 disposed with the certain distance L3 from each other and therefore conducts the current I to the conductive plates 11 and 12 in the electric element 100, and the return current Ir to the conductive plates 21 to 23 in the electric element 100. Accordingly, in the electric circuit device 101 using the substrate 200A, the conductive plates 11 to 12 magnetically connect with the conductive plates 21 to 23, and the effective inductance of the conductive plates 11 and 12 becomes smaller than the self inductance of the conductive plates 11 and 12.

Therefore, the substrate 200A also allows for considerable reduction in the impedance of the circuit device 101.

In the electric circuit device 101 comprising the substrate 200A, a direct current is supplied from the power source 90 to the CPU 110, and an unwanted high frequency current generated in the CPU 110 is confined within the electric element 100.

Figure 26:
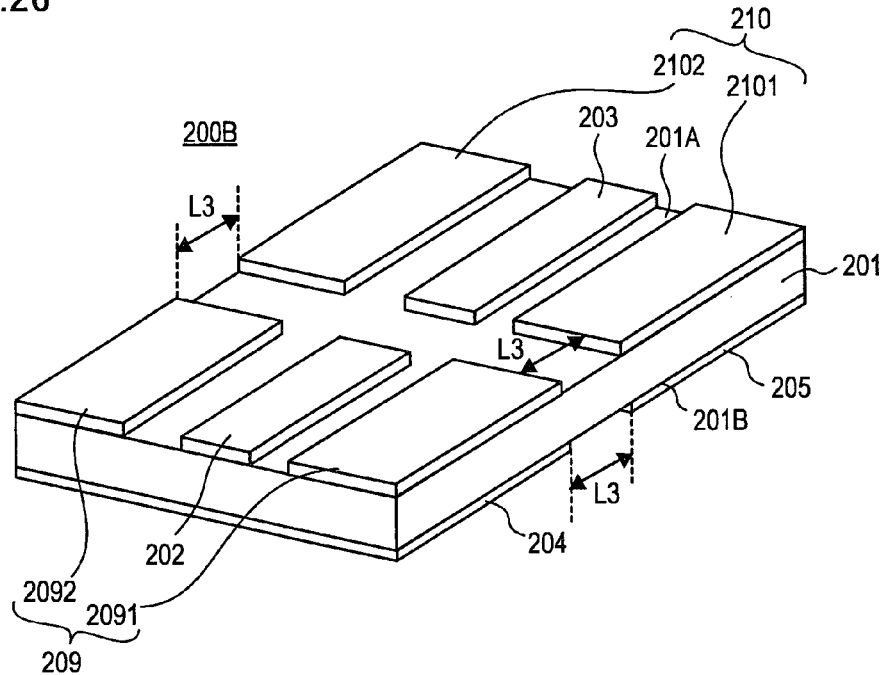
FIG. 26 is another perspective view illustrating the structure of the substrate shown in FIG. 1.

FIG. 26 is another perspective view illustrating the structure of the substrate 200 shown in FIG. 1. The substrate 200 shown in FIG. 1 may comprise a substrate 200B shown in FIG. 26. With reference to FIG. 26, the substrate 200B is identical with the substrate 200 shown in FIG. 19 except that the conductive plates 209 and 210 are added. The conductive plates 209 and 210 are described above with reference to FIG. 25.

Therefore, the substrate 200B comprises the conductive plates 209 and 210, which are disposed with the certain distance L3 from each other on the main surface 201A together with the signal lines 202 and 203, and the conductive plates 204 and 205, which are disposed with the certain distance L3 from each other on the main surface 201B facing against the main surface 201A on which the signal lines 202 and 203 are disposed. When the substrate 200B is applied to the electric circuit device 101, the conductive plates 204, 205, 209, and 210 are grounded. A substrate like the substrate 200B is called a coplanar substrate with a back surface GND.

When the substrate 200B is applied to the electric circuit device 101, the plate member 2091 of the conductive plate 209 and the conductive plate 204 are connected to the side cathode electrode 20A and the cathode electrode 20E via a conductor (not illustrated), while the plate member 2092 of the conductive plate 209 and the conductive plate 204 are connected to the side cathode electrode 20B and the cathode electrode 20E via a conductor (not illustrated). The plate member 2101 of the conductive plate 210 and the conductive plate 205 are connected to the side cathode electrode 20C and the cathode electrode 20F via a conductor (not illustrated), while the plate member 2102 of the conductive plate 210 and the conductive plate 205 are connected to the side cathode electrode 20D and the cathode electrode 20F via a conductor (not illustrated). The conductive plates 204, 205, 209, and 210 are then grounded.

The substrate 200B comprises the two conductive plates 204 and 205, which are disposed with the certain distance L3 from each other, and the two conductive plates 209 and 210, which are disposed with the certain distance L3 from each other. Therefore, the substrate 200B conducts the current I to the conductive plates 11 and 12 in the electric element 100, and the return current Ir to the conductive plates 21 to 23 in the electric element 100. Accordingly, in the electric circuit device 101 using the substrate 200B, the conductive plates 11 and 12 magnetically connect with the conductive plates 21 to 23, and the effective inductance of the conductive plates 11 and 12 becomes smaller than the self inductance of the conductive plates 11 and 12.

Therefore, the substrate 200B also allows for considerable reduction in the impedance of the electric circuit device 101.

Further, in the electric circuit device 101 comprising the substrate 200B, a direct current is supplied from the power source 90 to the CPU 110, and an unwanted high frequency current generated in the CPU 110 is confined within the electric element 100.

Figure 27:
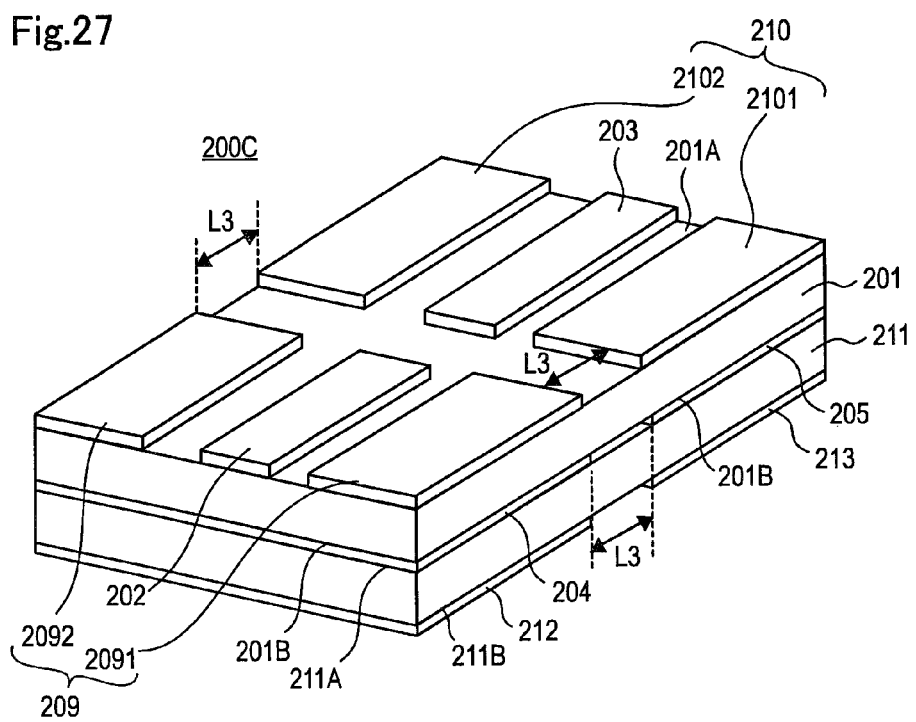
FIG. 27 is another perspective view illustrating the structure of the substrate shown in FIG. 1.

FIG. 27 is another perspective view illustrating the structure of the substrate 200 shown in FIG. 1. The substrate 200 shown in FIG. 1 may comprise a substrate 200C shown in FIG. 27. With reference to FIG. 27, the substrate 200C is identical with the substrate 200B shown in FIG. 26 except that a dielectric 211 and conductive plates 212 and 213 are added.

The dielectric 211 is disposed so that its main surface 211A is in contact with the conductive plates 204 and 205. The conductive plates 212 and 213 are disposed with the certain distance L3 from each other on a main surface 211B facing the main surface 211A of the dielectric 211.

Therefore, the substrate 200C comprises the plurality of laminated dielectrics 201 and 211 and the conductive plates 204, 205, 209, 210, 212, and 213 disposed with the certain distance L3 from each other on the front and back surfaces of each of the plurality of laminated dielectrics 201 and 211. The conductive plates 204, 205, 209, 210, 212, and 213 are grounded. A substrate like the substrate 200C is called a multilevel substrate.

When the substrate 200C is applied to the electric circuit device 101, the plate member 2091 of the conductive plate 209 and the conductive plates 204 and 212 are connected to the side cathode electrode 20A and the cathode electrode 20E via a conductor (not illustrated), while the plate member 2092 of the conductive plate 209 and the conductive plates 204 and 212 are connected to the side cathode electrode 20B and the cathode electrode 20E via a conductor (not illustrated). The plate member 2101 of the conductive plate 210 and the conductive plates 205 and 213 are connected to the side cathode electrode 20C and the cathode electrode 20F via a conductor (not illustrated), while the plate member 2102 of the conductive plate 210 and the conductive plates 205 and 215 are connected to the side cathode electrode 20D and the cathode electrode 20F via a conductor (not illustrated). The conductive plates 204, 205, 209, 210, 212, and 213 are then grounded.

The substrate 200C comprises the two conductive plates 204 and 205, which are disposed with the certain distance L3 from each other, the two conductive plates 209 and 210, which are disposed with the certain distance L3 from each other, and the two conductive plates 212 and 213, which are disposed with the certain distance L3 from each other. Therefore, the substrate 200C conducts the current I to the conductive plates 11 and 12 in the electric element 100, and the return current Ir to the conductive plates 21 to 23 in the electric element 100. Accordingly, in the electric circuit device 101 using the substrate 200C, the conductive plates 11 and 12 magnetically connect with the conductive plates 21 to 23, and the effective inductance of the conductive plates 11 and 12 becomes smaller than the self inductance of the conductive plates 11 and 12.

Therefore, the substrate 200C also allows for considerable reduction in the impedance of the electric circuit device 101.

In the electric circuit device 101 comprising the substrate 200C, a direct current is supplied from the power source 90 to the CPU 110, and an unwanted high frequency current generated in the CPU 110 is confined within the electric element 100.

In the above, it is described that the substrate 200C includes the two dielectrics 201 and 211, however, the present invention is not limited to that: the substrate 200C may include three or more dielectrics and, generally, has only to include a plurality of dielectrics.

Figure 28:
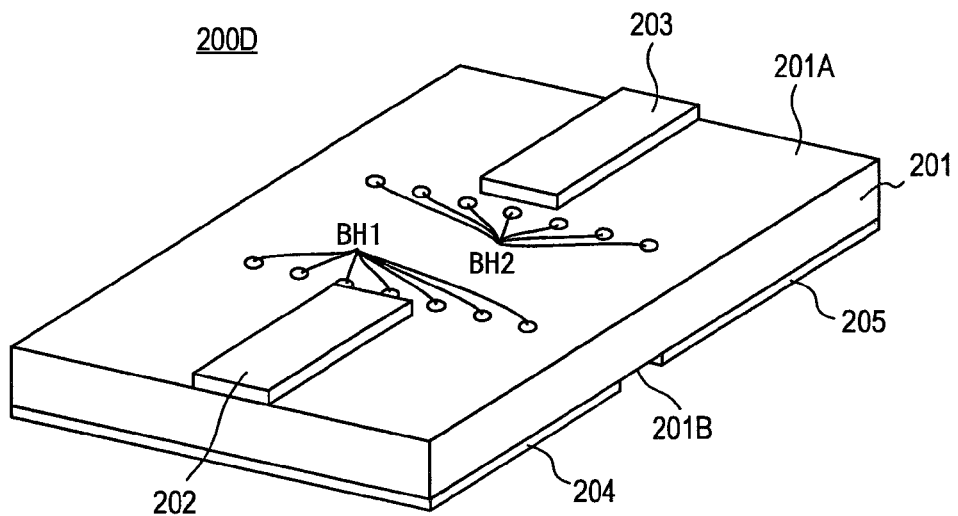
FIG. 28 is another perspective view illustrating the structure of the substrate shown in FIG. 1.

FIG. 28 is another perspective view illustrating the structure of the substrate 200 shown in FIG. 1. The substrate 200 shown in FIG. 1 may comprise a substrate 200D shown in FIG. 28. With reference to FIG. 28, the substrate 200D is identical with the substrate 200 shown in FIG. 19 except that via holes BH1 and BH2 are added.

The via holes BH1 are provided on the signal line 202 side, penetrate through the dielectric 201, and are connected to the conductive plate 204. The via holes BH2 are provided on the signal line 203 side, penetrate through the dielectric 201, and are connected to the conductive plate 205.

When the substrate 200D is applied to the electric circuit device 101, the signal line 202 is connected to the side anode electrode 10A, while the signal line 203 is connected to the side anode electrode 10B. The via holes BH1 are connected to the cathode electrode 20E, while the via holes BH2 are connected to the cathode electrode 20F.

As described above, when the substrate 200D is applied to the electric circuit device 101, the cathode electrodes 20E and 20F are respectively connected to the grounded conductive plates 204 and 205 through the via holes BH1 and BH2. Therefore, the return current Ir flows across in order of the conductive plate 205, the via holes BH2, the cathode electrode 20F, the side cathode electrodes 20C and 20D, the conductive plates 21 and 22, the side cathode electrodes 20A and 20B, the cathode electrode 20E, the via holes BH1 and the conductive plate 204, and the effective inductance of the conductive plates 11 and 12 becomes smaller than the self inductance of the conductive plates 11 and 12.

The substrate 200D comprises the two conductive plates 204 and 205, which are disposed with the certain distance L3 from each other, and the via holes BH1 and BH2 respectively connected to the two conductive plates 204 and 205. Therefore, the substrate 200D conducts the current I to the conductive plates 11 and 12 in the electric element 100, and the return current Ir to the conductive plates 21 to 23 in the electric element 100. As a result, in the electric circuit device 101 using the substrate 200D, the conductive plates 11 and 12 magnetically connect with the conductive plates 21 to 23, and the effective inductance of the conductive plates 11 and 12 becomes smaller than the self inductance of the conductive plates 11 and 12.

Therefore, the substrate 200D also allows for considerable reduction in the impedance of the electric circuit device 101.

Further, in the electric circuit device 101 comprising the substrate 200D, a direct current is supplied from the power source 90 to the CPU 110, and an unwanted high frequency current generated in the CPU 110 is confined within the electric element 100.

Figure 29:
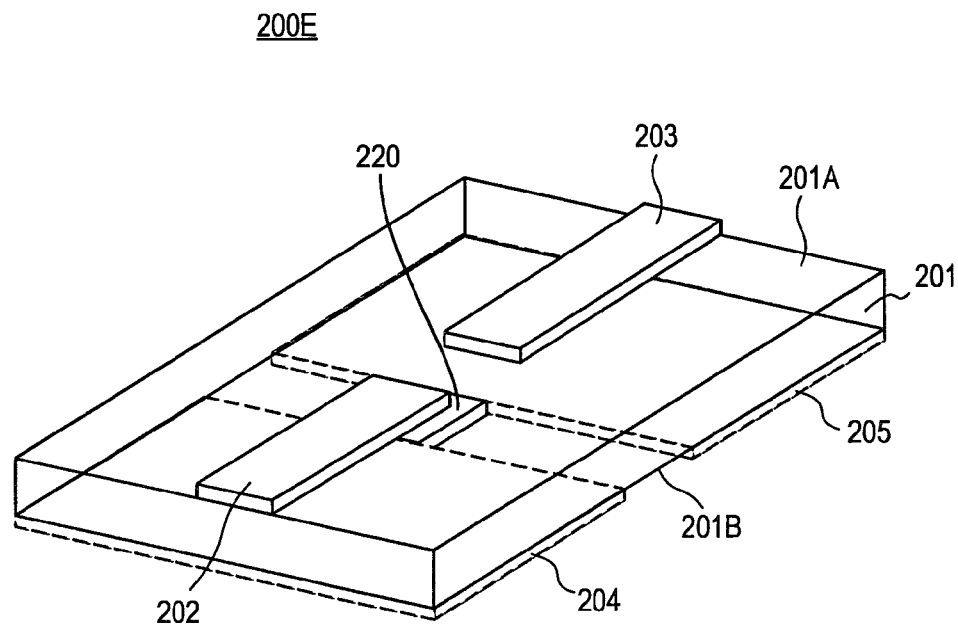
FIG. 29 is another perspective view illustrating the structure of the substrate shown in FIG. 1.

FIG. 29 is another perspective view illustrating the structure of the substrate 200 shown in FIG. 1. The substrate 200 shown in FIG. 1 may comprise a substrate 200E shown in FIG. 29. With reference to FIG. 29, the substrate 200E is identical with the substrate 200 shown in FIG. 19 except that a current suppressor 220 is added.

The current suppressor 220 comprises, for example, an impedance. One end of the current suppressor 220 is connected to the conductive plate 204, and the other end is connected to the conductive plate 205. Here, of the return current Ir, a current Ir1 flows across the conductive plates 21 to 23 in the electric element 100, and a current Ir2 flows from the conductive plate 205 to the conductive plate 204 through the current suppressor 220. The current Ir2 is made to be smaller than the current Ir1 by the current suppressor 220. In other words, the conductive plates 204 and 205 and the current suppressor 220 constitute a conductive plate having the impedance larger than that of the conductive plates 21 to 23.

As a result, the return current Ir mainly flows across the electric element 100 through the conductive plates 21 to 23, and the inductance of the conductive plates 11 and 12 becomes smaller than the self inductance of the conductive plates 11 and 12.

When the substrate 200E is applied to the electric circuit device 101, the conductive plate 204 is connected to the side cathode electrodes 20A and 20B and the cathode electrode 20E via a conductor (not illustrated), while the conductive plate 205 is connected to the side cathode electrodes 20C and 20D and the cathode electrode 20F via a conductor (not illustrated). The conductive plates 204 and 205 are then grounded.

The substrate 200E comprises the two conductive plates 204 and 205, which are disposed with the certain distance L3 from each other, and the current suppressor 220, which more suppresses the current Ir2 flowing across the two conductive plates 204 and 205 than the current Ir1 flowing across the conductive plates 21 to 23. Therefore, the substrate 200E conducts the current I to the conductive plates 11 and 12 in the electric element 100, and the return current Ir to the conductive plates 21 to 23 in the electric element 100. Accordingly, in the electric circuit device 101 using the substrate 200E, the conductive plates 11 and 12 magnetically connect with the conductive plates 21 to 23, and the effective inductance of the conductive plates 11 and 12 becomes smaller than the self inductance of the conductive plates 11 and 12.

Therefore, the substrate 200E also allows for considerable reduction in the impedance of the electric circuit device 101.

In the electric circuit device 101 comprising the substrate 200E, a direct current is supplied from the power source 90 to the CPU 110, and an unwanted high frequency current generated in the CPU 110 is confined within the electric element 100.

Note that the substrate 200 shown in FIG. 1 may comprise one of the following substrates: the substrate 200A shown in FIG. 25 to which the current suppressor 220 is added between the plate members 2091 and 2101 and between the plate members 2092 and 2102; the substrate 200B shown in FIG. 26 to which the current suppressor 220 is added between the conductive plates 204 and 205, between the plate members 2091 and 2101, and between the plate members 2092 and 2102; the substrate 200C shown in FIG. 27 to which the current suppressor 220 is added between the conductive plates 204 and 205, between the plate members 2091 and 2101, between the plate members 2092 and 2102, and between the conductive plates 212 and 213; and the substrate 200D shown in FIG. 28 to which the current suppressor 220 is added between the conductive plates 204 and 205. When the above substrates are used, the impedance of the electric circuit device 101 is also reduced in the high frequency range where the inductance is dominant.

Figure 30:
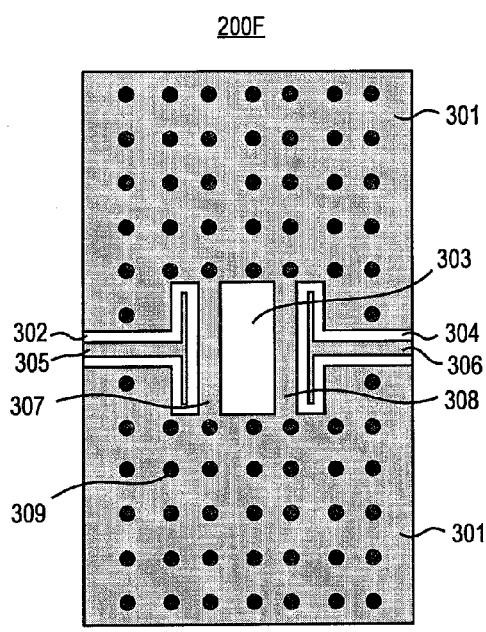
FIG. 30 is a plan view illustrating another structure of the substrate shown in FIG. 1.

FIGS. 30 to 33 are plan views illustrating other structures of the substrate 200 shown in FIG. 1. With reference to FIG. 30, the substrate 200F comprises a conductive plate 301, slits 302 to 304, and via holes 309. The conductive plate 301 is formed on an entire main surface of a dielectric (not illustrated). The slits 302 to 304 are formed in a main surface of the dielectric (not illustrated) by cutting-out a part of the conductive plate 301. By forming the slits 302 to 304 in the main surface of the dielectric (not illustrated), conductor parts 305 to 308 are formed in the main surface of the dielectric (not illustrated).

Although not illustrated in FIG. 30, the substrate 200F comprises another conductive plate formed on the other main surface of the dielectric (not illustrated) so as to face against the conductive plate 301. The via holes 309 are formed in a grid so as to electrically connect the conductive plate 301 and the other conductive plate.

Upon producing an electric circuit device with the substrate 200F, the conductor parts 305 and 306 constitute signal lines. The conductive plate 301 and the other conductive plate are connected to ground potential. The anode electrodes 10C and 10D are respectively connected to the conductor parts 305 and 306, while the cathode electrodes 20E and 20F are respectively connected to the conductor parts 307 and 308. Accordingly, more return current flows across the conductive plates 21 to 23 of the substrate 200F than across the conductive plate 301 and the other conductive plate.

As described above, the substrate 200F comprises the slits 302 to 304 and the conductor parts 305 to 308. Therefore, the substrate 200F conducts the current I to the conductive plates 11 and 12 in the electric element 100, and the return current Ir to the conductive plates 21 to 23 in the electric element 100. As a result, in the electric circuit device 101 using the substrate 200F, the conductive plates 11 and 12 magnetically connect with the conductive plates 21 to 23, and the effective inductance of the conductive plates 11 and 12 becomes smaller than the self inductance of the conductive plates 11 and 12.

Therefore, the substrate 200F also allows for considerable reduction in the impedance of the electric circuit device 101.

In the electric circuit device 101 comprising the substrate 200F, a direct current is supplied from the power source 90 to the CPU 110, and an unwanted high frequency current generated in the CPU 110 is confined within the electric element 100.

Figure 31:
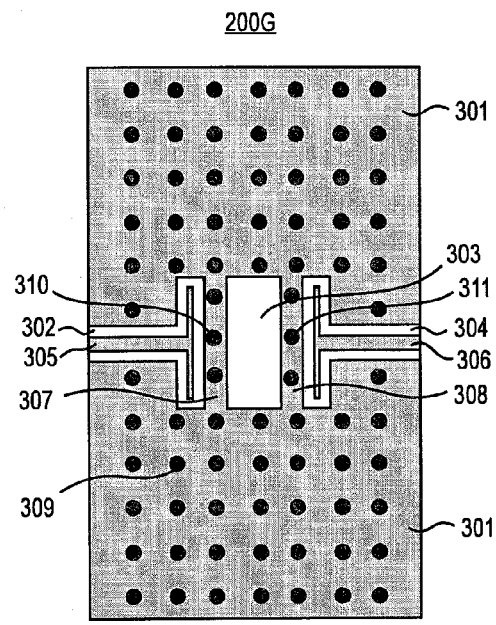
FIG. 31 is a plan view illustrating another structure of the substrate shown in FIG. 1.

With reference to FIG. 31, the substrate 200G is identical with the substrate 200F shown in FIG. 30 except that via holes 310 and 311 are added. The via holes 310 and 311 are respectively formed in the conductor parts 307 and 308.

Upon producing an electric circuit device with the substrate 200G, the conductor parts 305 and 306 constitute signal lines. The conductive plate 301 and the other conductive plate are connected to ground potential. The anode electrodes 10C and 10D are respectively connected to the conductor parts 305 and 306, while the cathode electrodes 20E and 20F are respectively connected to the conductor parts 307 and 308. As a result, more return current flows across the conductive plates 21 to 23 of the substrate 200G than across the conductive plate 301 and the other conductive plate.

As described above, the substrate 200G comprises the slits 302 to 304, the conductor parts 305 to 308, and the via holes 310 and 311. Therefore, the substrate 200G conducts the current I to the conductive plates 11 and 12 in the electric element 100, and the return current Ir to the conductive plates 21 to 23 in the electric element 100. As a result, in the electric circuit device 101 using the substrate 200G, the conductive plates 11 and 12 magnetically connect with the conductive plates 21 to 23, and the effective inductance of the conductive plates 11 and 12 becomes smaller than the self inductance of the conductive plates 11 and 12.

Therefore, the substrate 200G also allows for considerable reduction in the impedance of the electric circuit device 101.

In the electric circuit device 101 comprising the substrate 200G, a direct current is supplied from the power source 90 to the CPU 110, and an unwanted high frequency current generated in the CPU 110 is confined within the electric element 100.

Figure 32:
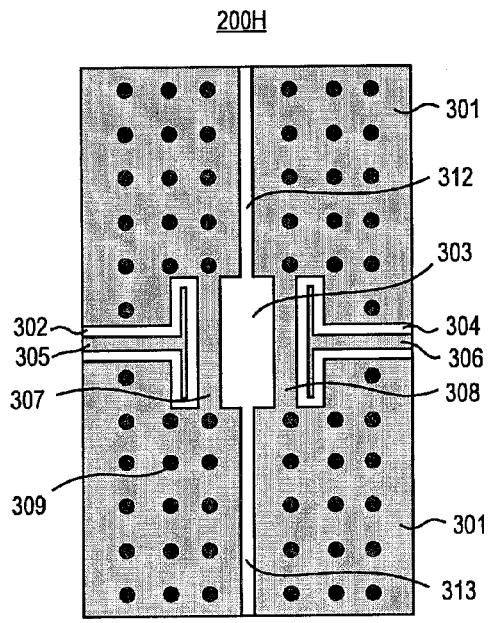
FIG. 32 is a plan view illustrating another structure of the substrate shown in FIG. 1.

With reference to FIG. 32, the substrate 200H is identical with the substrate 200F except that slits 312 and 313 are added. The slits 312 and 313 are formed, so as to be connected to the slit 303, in a main surface of the dielectric (not illustrated) by cutting-out a part of the conductive plate 301. The combined slits 303, 312 and 313 are formed from one end to the other end of the substrate 200H in the direction perpendicular to the longitudinal direction of the conductor parts 305 and 306 that constitute the signal lines.

Upon producing an electric circuit device with the substrate 200H, the conductor parts 305 and 306 constitute signal lines. The conductive plate 301 and the other conductive plate are connected to ground potential. The anode electrodes 10C and 10D are respectively connected to the conductor parts 305 and 306, while the cathode electrodes 20E and 20F are respectively connected to the conductor parts 307 and 308. As a result, more return current flows across the conductive plates 21 to 23 of the substrate 200H than across the conductive plate 301 and the other conductive plate.

As described above, the substrate 200H comprises the slits 302 to 304, 312 and 313, and the conductor parts 305 to 308. Therefore, the substrate 200H conducts the current I to the conductive plates 11 and 12 in the electric element 100, and the return current Ir to the conductive plates 21 to 23 in the electric element 100. Accordingly, in the electric circuit device 101 using the substrate 200H, the conductive plates 11 and 12 magnetically connect with the conductive plates 21 to 23, and the effective inductance of the conductive plates 11 and 12 becomes smaller than the self inductance of the conductive plates 11 and 12.

Therefore, the substrate 200H also allows for considerable reduction in the impedance of the electric circuit device 101

Further, in the electric circuit device 101 comprising the substrate 200H, a direct current is supplied from the power source 90 to the CPU 110, and an unwanted high frequency current generated in the CPU 110 is confined within the electric element 100.

Figure 33:
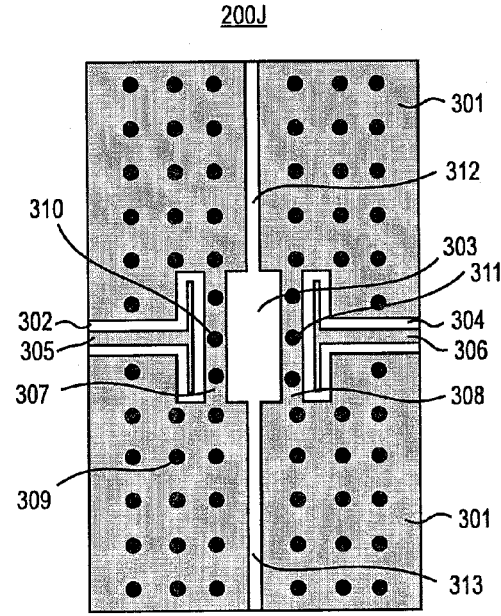
FIG. 33 is a plan view illustrating another structure of the substrate shown in FIG. 1.

With reference to FIG. 33, the substrate 200J is identical with the substrate 200G except that the slits 312 and 313 are added. In the substrate 200J, the slits 312 and 313 are also formed, so as to be connected to the slit 303, in the main surface of the dielectric (not illustrated) by cutting-out a part of the conductive plate 301. The combined slits 303, 312 and 313 are formed from one end to the other end of the substrate 200J in the direction perpendicular to the longitudinal direction of the conductor parts 305 and 306 that constitute signal lines.

Upon producing an electric circuit device with the substrate 200J, the conductor parts 305 and 306 constitute signal lines. The conductive plate 301 and the other conductive plate are connected to ground potential. The anode electrodes 10C and 10D are respectively connected to the conductor parts 305 and 306, while the cathode electrodes 20E and 20F are respectively connected to the conductor parts 307 and 308. As a result, more return current flows across the conductive plates 21 to 23 of the substrate 200J than across the conductive plate 301 and the other conductive plate.

As described above, the substrate 200J comprises the slits 302 to 304, 312 and 313, the conductor parts 305 to 308, and the via holes 310 and 311. Therefore, the substrate 200J conducts the current Ito the conductive plates 11 and 12 in the electric element 100, and the return current Ir to the conductive plates 21 to 23 in the electric element 100. Accordingly, in the electric circuit device 101 using the substrate 200J, the conductive plates 11 and 12 magnetically connect with the conductive plates 21 to 23, and the effective inductance of the conductive plates 11 and 12 becomes smaller than the self inductance of the conductive plates 11 and 12.

Therefore, the substrate 200J also allows for considerable reduction in the impedance of the electric circuit device 101.

In the electric circuit device 101 comprising the substrate 200J, a direct current is supplied from the power source 90 to the CPU 110, and an unwanted high frequency current generated in the CPU 110 is confined within the electric element 100.

Figure 34:
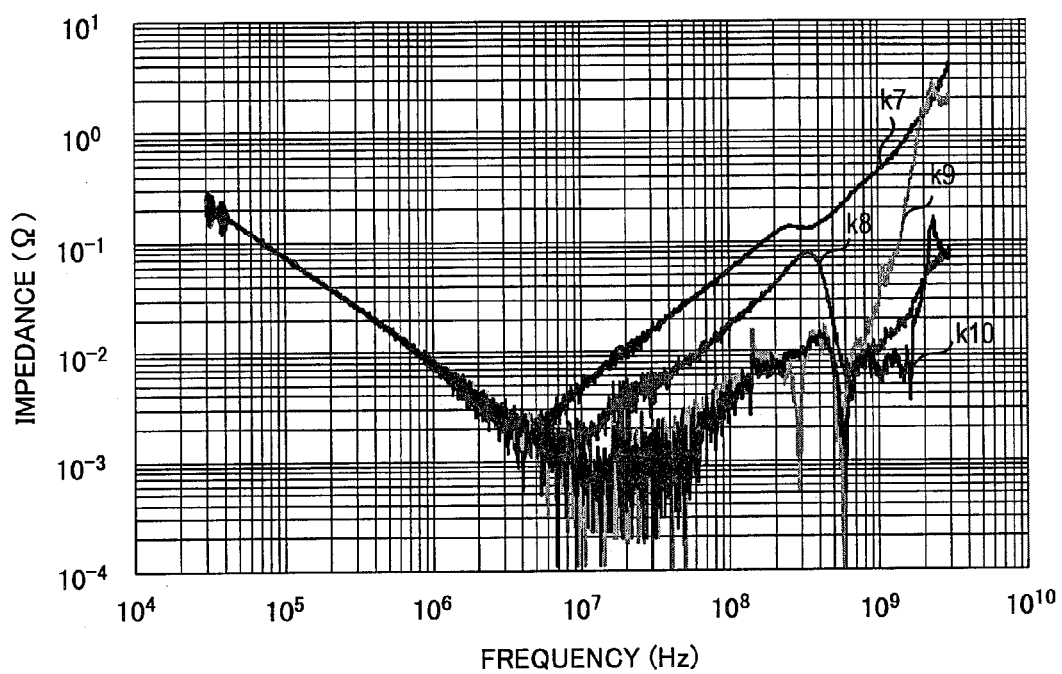
FIG. 34 is a graph illustrating the relationship between the impedance and the frequency of the electric circuit devices respectively using the substrates shown in FIGS. 30 to 33.

FIG. 34 is a graph illustrating the relationship between the impedance and the frequency of the electric circuit devices 101 using the substrates 200F, 200G, 200H, and 200J shown in FIGS. 30 to 33, respectively. In FIG. 34, the abscissa axis represents the frequency, and the longitudinal axis represents the impedance. Curve k7 represents the case where the substrate 200F is used. Curve k8 represents the case where the substrate 200G is used. Curve k9 represents the case where the substrate 200H is used. Curve k10 represents the case where the substrate 200J is used.

By forming the via holes 310 and 311 in the conductor parts 307 and 308, to which the cathode electrodes 20E and 20F are respectively connected, the impedance decreases in the frequency range of about 10 MHz or higher where the inductance is dominant (see curves k7 and k8).

In addition, by forming the slits 312 and 313 longer than the slit 303 between the conductor parts 307 and 308, to which the cathode electrodes 20E and 20F are respectively connected, the impedance decreases in the frequency range of about 10 MHz or higher where the inductance is dominant (see curves k7 to k9).

Further, by forming the via holes 310 and 311 in the conductor parts 307 and 308 to which the cathode electrodes 20E and 20F are respectively connected, and by forming the slits 312 and 313 longer than the slit 303 between the conductor parts 307 and 308, the impedance decreases in the frequency range of about 1 GHz or higher (see curves k9 and k10). This is because, a current stream flowing from the conductive plate 301, which is formed on one side of the slits 312 and 313, to the conductive plate 301, which is formed on the other side of the slits 312 and 313, is cut off by the slits 312 and 313 and therefore flows across the conductive plates 21 to 23, 21A, 22A and 23A in the electric element.

Figure 35:
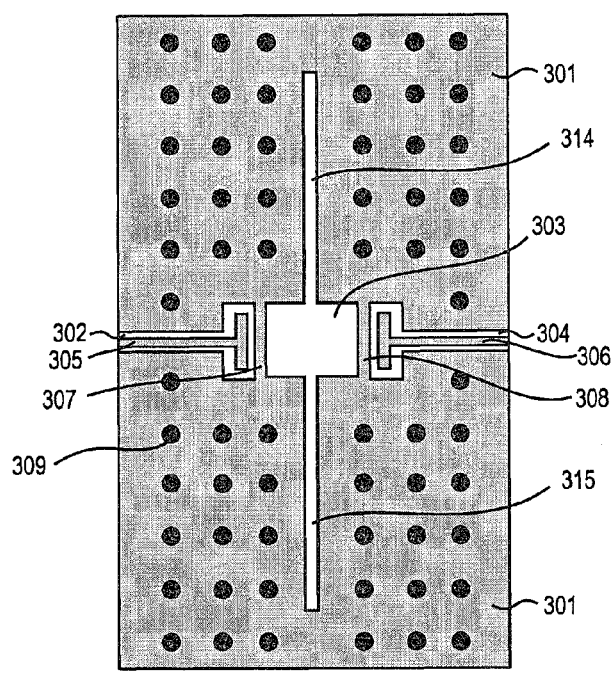
FIG. 35 is a plan view illustrating another structure of the substrate shown in FIG. 1.

FIG. 35 is a plan view illustrating another structure of the substrate 200 shown in FIG. 1. With reference to FIG. 35, the substrate 200K is identical with the substrate 200G shown in FIG. 31 except that slits 314 and 315 are added. The slits 314 and 315 are formed, so as to be connected to the slit 303, in the main surface of the dielectric (not illustrated) by cutting-out a part of the conductive plate 301. The combined slits 303, 314 and 315 are formed in a part of the substrate 200K in the direction perpendicular to the longitudinal direction of the conductor parts 305 and 306 that constitute signal lines.

Figure 36:
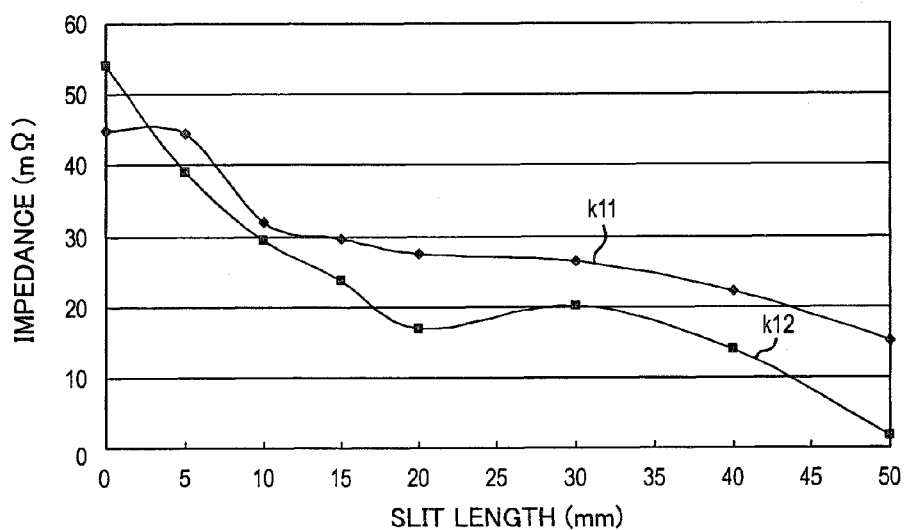
FIG. 36 is a graph illustrating changes in the impedance according to the length of the combined three slits, obtained when an electric circuit device is produced with the substrate shown in FIG. 35.

FIG. 36 is a graph illustrating changes in the impedance according to the length of the combined three slits 303, 314 and 315, obtained when an electric circuit device is produced with the substrate 200K shown in FIG. 35.

In FIG. 36, the abscissa axis represents the length of the slit, and the longitudinal axis represents the impedance. Curve k11 illustrates the simulation result, and curve k12 shows the actual measurement value. The width of the slit 303 is 5 mm, and the frequency is 100 MHz.

According to the result shown in FIG. 36, by setting the length of the combined slits 303, 314 and 315 to 5 mm or longer, the impedance decreases. More specifically, by setting the length of the combined slits 303, 314 and 315 to be longer than the width (=5 mm) of the slit 303, the impedance decreases. As described above, by forming the combined slits 303, 314 and 315 in a part of the substrate 200K, the impedance of the electric circuit device 101 decreases.

As described above, the substrate 200K comprises the slits 302 to 304, 314 and 315 and the conductor parts 305 to 308. Therefore, the substrate 200K conducts the current I to the conductive plates 11 and 12 in the electric element 100, and the return current Ir to the conductive plates 21 to 23 in the electric element 100. As a result, in the electric circuit device 101 using the substrate 200K, the conductive plates 11 and 12 magnetically connect with the conductive plates 21 to 23, and the effective inductance of the conductive plates 11 and 12 becomes smaller than the self inductance of the conductive plates 11 and 12.

Therefore, the substrate 200K also allows for considerable reduction in the impedance of the electric circuit device 101.

Further, in the electric circuit device 101 comprising the substrate 200K, a direct current is supplied from the power source 90 to the CPU 110, and an unwanted high frequency current generated in the CPU 110 is confined within the electric element 100.

Figure 37:
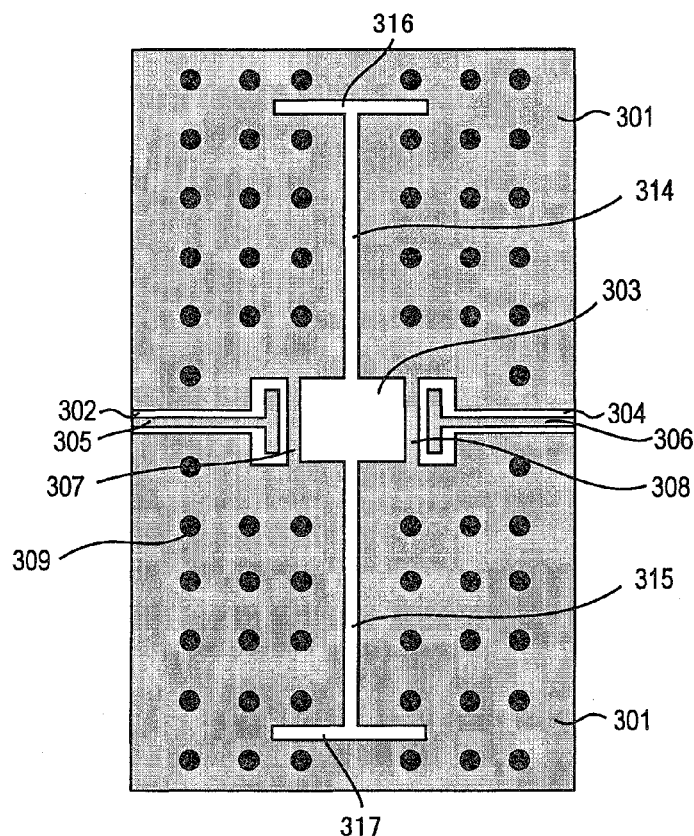
FIG. 37 is a plan view illustrating another structure of the substrate shown in FIG. 1.

FIG. 37 is a plan view illustrating another structure of the substrate shown in FIG. 1. With reference to FIG. 37, the substrate 200L is identical with the substrate 200K shown in FIG. 35 except that slits 316 and 317 are added.

The slit 316 is formed in the main surface of the dielectric (not illustrated), by cutting out a part of the conductive plate 301, so as to be connected substantially perpendicular to one end of the slit 314. The slit 316 has a certain length and extends out from both sides of the slit 314 by the same length. The slit 317 is formed in the main surface of the dielectric (not illustrated), by cutting out a part of the conductive plate 301, so as to be connected substantially perpendicular to one end of the slit 315. The slit 317 has the same length as the slit 316 and extends out from both sides of the slit 315 by the same length.

Figure 38:
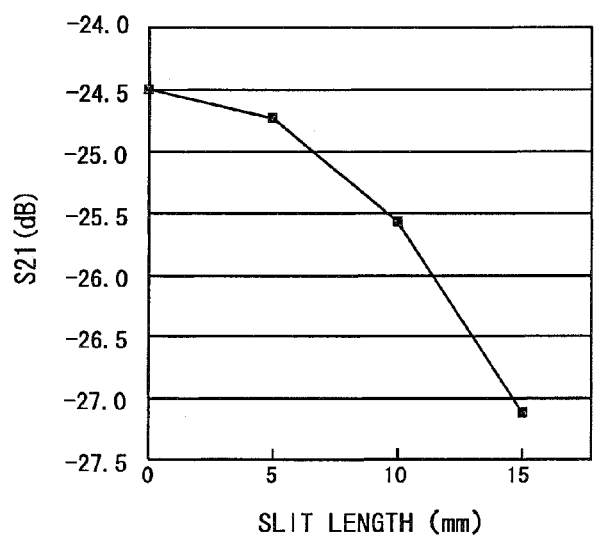
FIG. 38 is a graph illustrating the relationship between the length of the slits shown in FIG. 37 and the S21.

FIG. 38 is a graph illustrating the relationship between the length of the slits 316 and 317 shown in FIG. 37 and the S21. In FIG. 38, the longitudinal axis represents the S21, and the abscissa axis represents the slit length. The S21 is a transfer characteristic of a current flowing from the conductive plate 301, which is on one side of the slits 314 and 315, to the conductive plate 301, which is on the other end of the slits 314 and 315.

With reference to FIG. 38, the transfer characteristic S21 decreases as the length of the slits 316 and 317 increases from 5 mm to 10 mm and to 15 mm. This is because, by forming the slits 316 and 317, a current is prevented from flowing around from the conductive plate 301, which is on one side of the slits 314 and 315, to the conductive plate 301, which is on the other side of the slits 314 and 315, through a part of the conductive plate 301 where the slits 314 and 315 are not formed. The longer the length of the slits 316 and 317 is, the more the current is prevented from flowing around.

Therefore, with the substrate 200L, more return current flows across the conductive plates 21 to 23 in the electric element, and the effective inductance of the conductive plates 11 and 12 becomes further smaller than the self inductance.

As described above, the substrate 200L comprises the slits 302 to 304 and 314 to 317 and the conductor parts 305 to 308. Therefore, the substrate 200L conducts the current I to the conductive plates 11 and 12 in the electric element 100, and the return current Ir to the conductive plates 21 to 23 in the electric element 100. As a result, in electric circuit device 101 using the substrate 200L, the conductive plates 11 and 12 magnetically connect with the conductive plates 21 to 23, and the effective inductance of the conductive plates 11 and 12 becomes smaller than the self inductance of the conductive plates 11 and 12.

Therefore, the substrate 200L also allows for considerable reduction in the impedance of the electric circuit device 101.

Further, in the electric circuit device 101 comprising the substrate 200L, a direct current is supplied from the power source 90 to the CPU 110, and an unwanted high frequency current generated in the CPU 110 is confined within the electric element 100.

Figure 39:
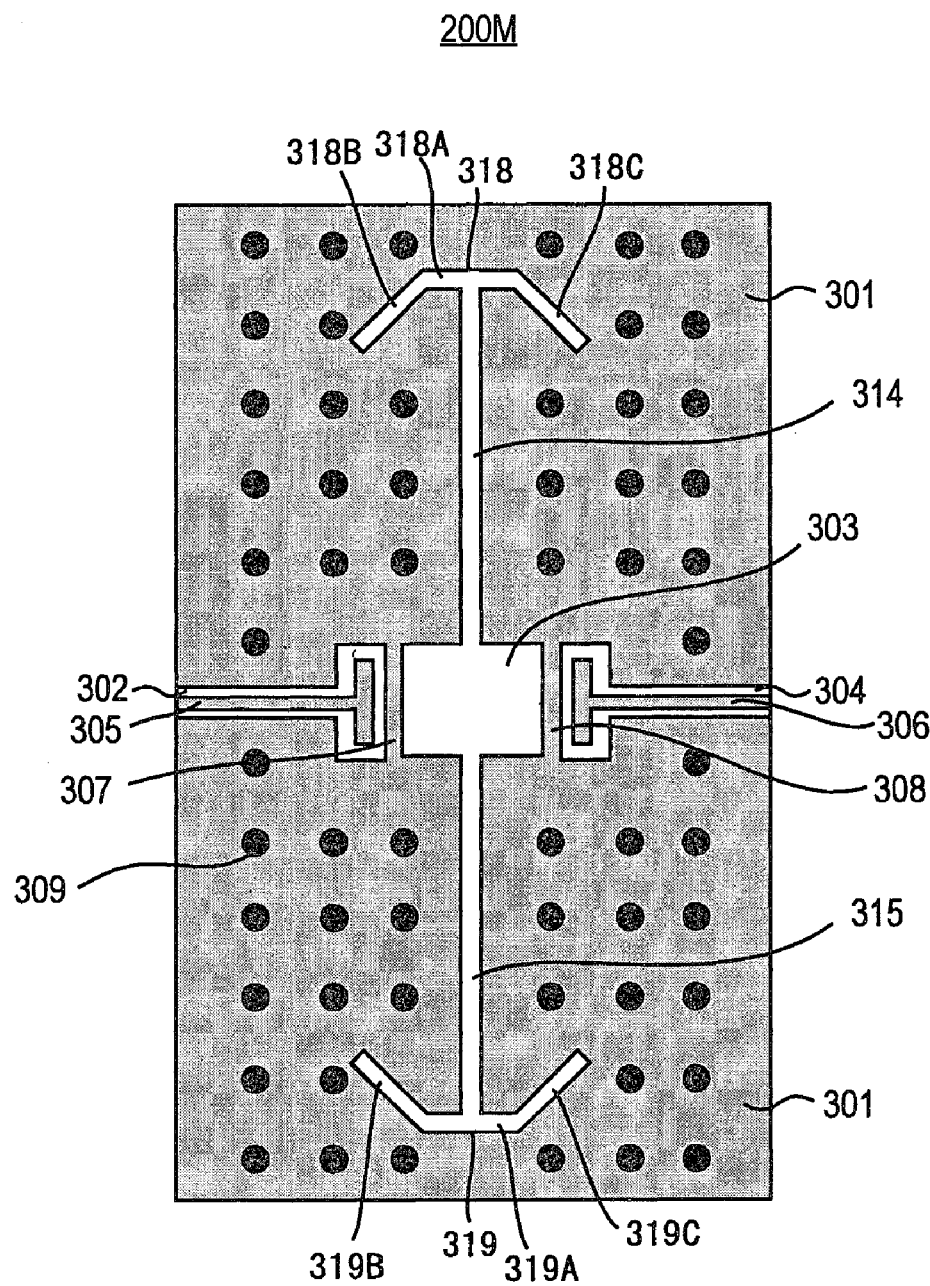
FIG. 39 is a plan view illustrating another structure of the substrate shown in FIG. 1.

FIG. 39 is a plan view of another structure of the substrate 200 shown in FIG. 1. With reference to FIG. 39, the substrate 200M is identical with the substrate 200L shown in FIG. 37 except that the slit 316 and 317 of the substrate 200L are respectively replaced with slits 318 and 319.

The slit 318 is formed in the main surface of the dielectric (not illustrated), by cutting out a part of the conductive plate 301, so as to be connected to one end of the slit 314. The slit 319 is formed in the main surface of the dielectric (not illustrated), by cutting out a part of the conductive plate 301, so as to be connected to one end of the slit 315.

The slit 318 comprises straight parts 318A, 318B and 318C. The straight part 318A is formed substantially perpendicular to the slit 314. The straight part 318B extends out from one end of the straight part 318A at an angle to the straight part 318A. The straight part 318C extends out from the other end of the straight part 318A at an angle to the straight part 318A. As a result, the straight parts 318B and 318C are respectively disposed on either end of the straight part 318A so as to form a substantial upside-down-U shape toward the slit 303.

The slit 319 comprises the straight parts 319A, 319B and 319C.

The straight part 319A is formed substantially perpendicular to the slit 315. The straight part 319B extends out from one end of the straight part 319A at an angle to the straight part 319A. The straight part 319C extends out from the other end of the straight part 319A at an angle to the straight part 319A. As a result, the straight parts 319B and 319C are respectively disposed on either end of the straight part 319A so as to form a substantial upside-down-U shape toward the slit 303.

The slits 318 and 319, as well as the slits 316 and 317, decreases the transfer characteristic S21 and prevents the current from flowing around from the conductive plate 301, which is on one side of the slits 314 and 315, to the conductive plate 301, which is on the other side of the slits 314 and 315, through a part of the conductive plate 301 where the slits 314 and 315 are not formed. Therefore, the slits 303, 314, 315, 318, and 319 prevents the return current Ir from flowing across the conductive plate 301.

As described above, the substrate 200M comprises the slits 302 to 304, 314, 315, 318, and 319 and the conductor parts 305 to 308. Therefore, the substrate 200M conducts the current I to the conductive plates 11 and 12 in the electric element 100, and the return current Ir to the conductive plates 21 to 23 in the electric element 100. As a result, in the electric circuit device 101 using the substrate 200M, the conductive plates 11 and 12 magnetically connect with the conductive plates 21 to 23, and the effective inductance of the conductive plates 11 and 12 becomes smaller than the self inductance of the conductive plates 11 and 12.

Therefore, the substrate 200M also allows for considerable reduction in the impedance of the electric circuit device 101.

In the electric circuit device 101 comprising the substrate 200M, a direct current is supplied from the power source 90 to the CPU 110, and an unwanted high frequency current generated in the CPU 110 is confined within the electric element 100.

Figure 40:
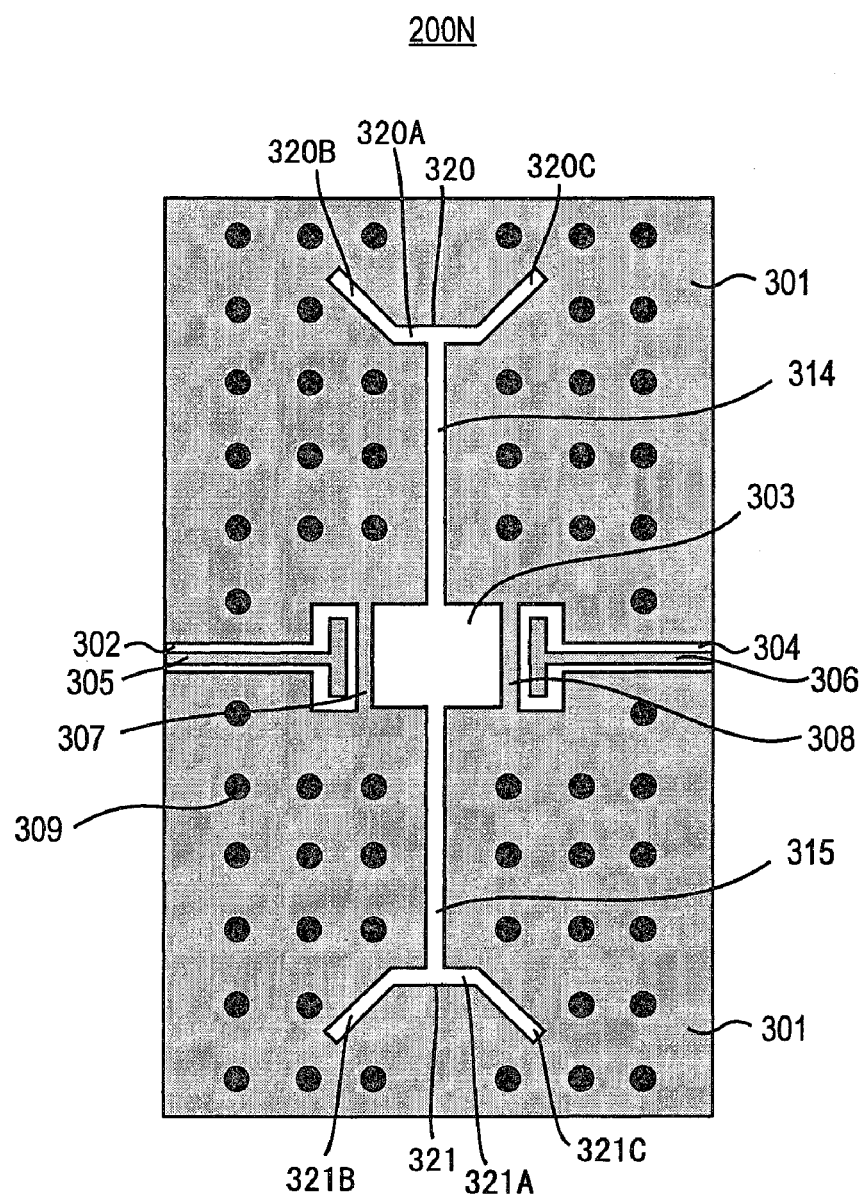
FIG. 40 is a plan view illustrating another structure of the substrate shown in FIG. 1.

FIG. 40 is a plan view illustrating another structure of the substrate 200 shown in FIG. 1. With reference to FIG. 40, the substrate 200N is identical with the substrate 200L shown in FIG. 37 except that the slits 316 and 317 of the substrate 200L are respectively replaced with slits 320 and 321.

The slit 320 is formed in the main surface of the dielectric (not illustrated), by cutting out a part of the conductive plate 301, so as to be connected to one end of the slit 314. The slit 321 is formed in the main surface of the dielectric (not illustrated), by cutting out a part of the conductive plate 301, so as to be connected to one end of the slit 315.

The slit 320 comprises straight parts 320A, 320B and 320C. The straight part 320A is formed substantially perpendicular to the slit 314. The straight part 320B extends out from one end of the straight part 320A at an angle to the straight part 320A. The straight part 320C extends out from the other end of the straight part 320A at an angle to the straight part 320A. As a result, the straight parts 320B and 320C are respectively disposed on either end of the straight part 318A so as to form a substantial U shape in the direction opposite to the direction toward the slit 303.

The slit 321 comprises straight parts 321A, 321B and 321C. The straight part 321A is formed substantially perpendicular to the slit 315. The straight part 321B extends out from one end of the straight part 321A at an angle to the straight part 321A. The straight part 321C extends out from the other end of the straight part 321A at an angle to the straight part 321A. As a result, the straight parts 321B and 321C are respectively disposed on either end of the straight part 321A so as to form a substantial U shape in the direction opposite to the direction toward the slit 303.

The slits 320 and 321, as well as the slits 316 and 317, decreases the transfer characteristic S21 and prevents the current form flowing around from the conductive plate 301, which is on one side of the slits 314 and 315, to the conductive plate 301, which is on the other side of the slits 314 and 315, through a part of the conductive plate 301 where the slits 314 and 315 are not formed. As a result, the slits 303, 314, 315, 320, and 321 prevent the return current Ir from flowing across the conductive plate 301.

As described above, the substrate 200N comprises the slits 302 to 304, 314, 315, 320, and 321 and the conductor parts 305 to 308. Therefore, the substrate 200N conducts the current I to the conductive plates 11 and 12 in the electric element 100, and the return current Ir to the conductive plates 21 to 23 in the electric element 100. As a result, in the electric circuit device 101 using the substrate 200N, the conductive plates 11 and 12 magnetically connect with the conductive plates 21 to 23, and the effective inductance of the conductive plates 11 and 12 becomes smaller than the self inductance of the conductive plates 11 and 12.

Therefore, the substrate 200N also allows for considerable reduction in the impedance of the electric circuit device 101.

Further, in the electric circuit device 101 comprising the substrate 200N, a direct current is supplied from the power source 90 to the CPU 110, and an unwanted high frequency current generated in the CPU 110 is confined within the electric element 100.

FIGS. 37, 39 and 40 illustrate the substrates 200L, 200M and 200N comprising the slits described above, however, that invention is not limited to these slits. Generally, a substrate having the structure as shown in FIGS. 37, 39 and 40 has only to comprise a slit of a shape that prevents a high frequency current from flowing from one side of the slit to the other side of the slit.

Figure 41:
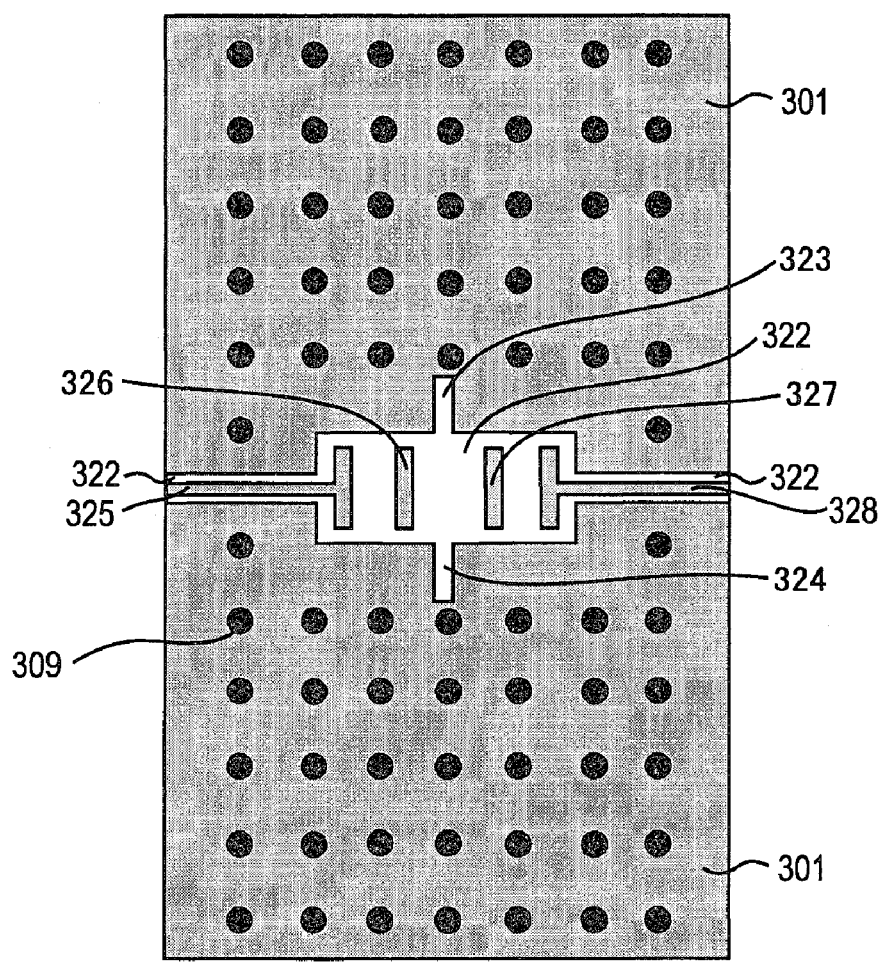
FIG. 41 is a plan view illustrating another structure of the substrate shown in FIG. 1.

FIG. 41 is a plan view illustrating another structure of the substrate 200 shown in FIG. 1. With reference to FIG. 41, the substrate 200P is identical with the substrate 200F shown in FIG. 30 except that the slits 302 to 304 of the substrate 200F are replaced with slits 322 to 324.

The slit 322 is formed in the main surface of the dielectric (not illustrated) by cutting out a part of the conductive plate 301. By forming the slit 322, conductor parts 325 to 328 are formed on the main surface of the dielectric (not illustrated).

The slit 323 is formed in the main surface of the dielectric (not illustrated) by cutting out a part of the conductive plate 301 and connected to one end of the slit 322. The slit 324 is formed in the main surface of the dielectric (not illustrated) by cutting out a part of the conductive plate 301 and connected to the other end of the slit 322.

Upon producing an electric circuit device with the substrate 200P, the conductor parts 325 and 328 constitute signal lines. The conductive plate 301 and the other conductive plate are connected to ground potential. The anode electrodes 10C and 10D are respectively connected to the conductor parts 325 and 328, while the cathode electrodes 20E and 20F are respectively connected to the conductor parts 326 and 327. As a result, more return current flows across the conductive plates 21 to 23 than across the conductive plate 301 and the other conductive plate of the substrate 200P.

As described above, the substrate 200P comprises the slits 322 to 324 and the conductor parts 325 to 328. Therefore, the substrate 200P conducts the current I to the conductive plates 11 and 12 in the electric element 100, and the return current Ir to the conductive plates 21 to 23 in the electric element 100. As a result, in the electric circuit device 101 using the substrate 200P, the conductive plates 11 and 12 magnetically connect with the conductive plates 21 to 23, and the effective inductance of the conductive plates 11 and 12 becomes smaller than the self inductance of the conductive plates 11 and 12.

Therefore, the substrate 200P also allows for considerable reduction in the impedance of the electric circuit device 101.

Further, in the electric circuit device 101 comprising the substrate 200P, a direct current is supplied from the power source 90 to the CPU 110, and an unwanted high frequency current generated in the CPU 110 is confined within the electric element 100.

Figure 42:
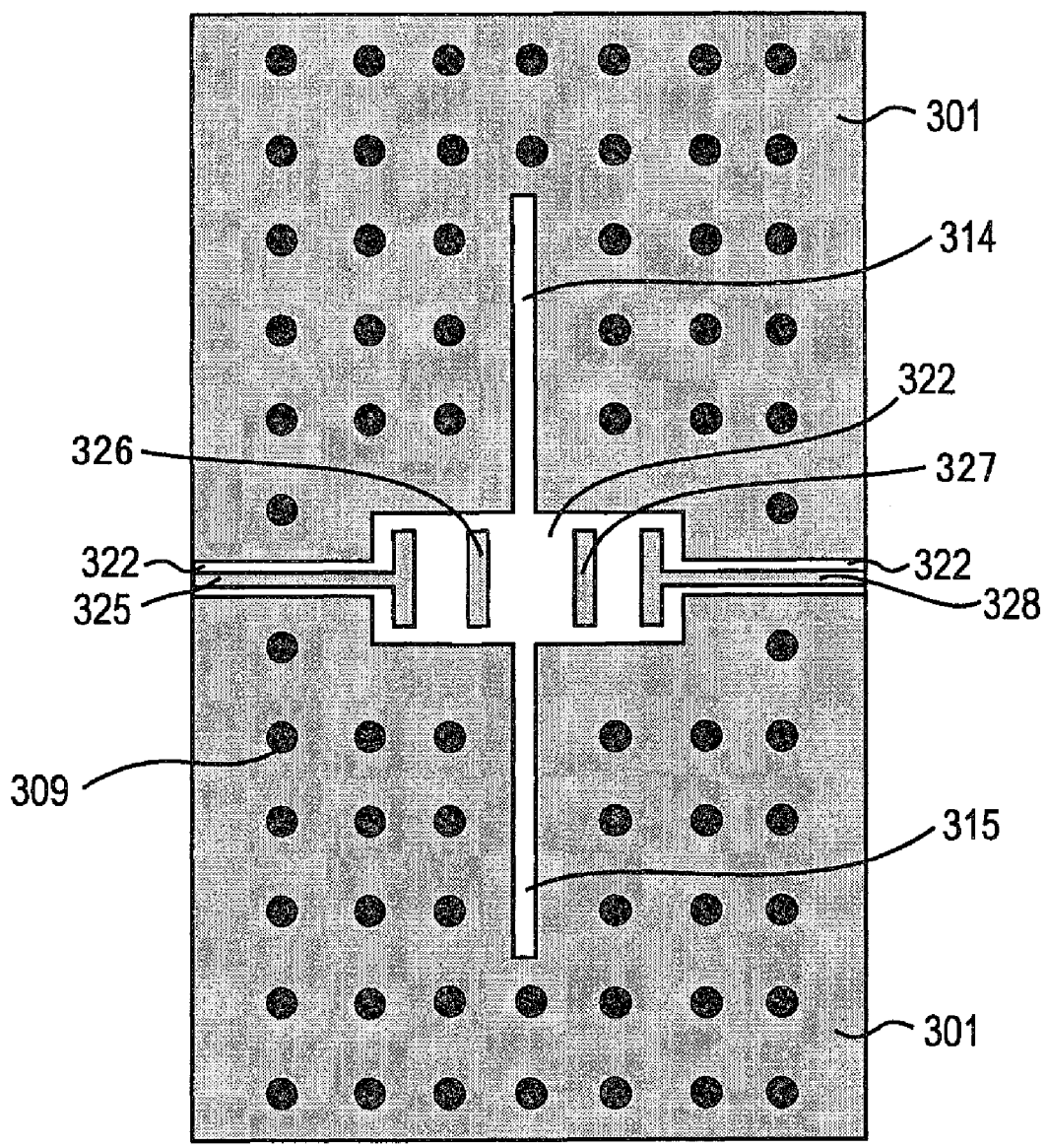
FIG. 42 is a plan view illustrating another structure of the substrate shown in FIG. 1.

FIG. 42 is a plan view illustrating another structure of the substrate 200 shown in FIG. 1. With reference to FIG. 42, the substrate 200Q is identical with the substrate 200P shown in FIG. 41 except that the slits 323 and 324 of the substrate 200P are respectively replaced with slits 314 and 315.

The slits 314 and 315 are formed in the main surface of the dielectric (not illustrated), by cutting out a part of the conductive plate 301, so as to be connected to the slit 322. The combined slits 322, 314 and 315 are formed in a part of the substrate 200Q in the direction perpendicular to the longitudinal direction of the conductor parts 325 and 328 constituting the signal lines.

As described above, the substrate 200Q comprises the slits 314, 315 and 322 and the conductor parts 325 to 328. Therefore, the substrate 200Q conducts the current I to the conductive plates 11 and 12 in the electric element 100, and the return current Ir to the conductive plates 21 to 23 in the electric element 100. As a result, in the electric circuit device 101 using the substrate 200Q, the conductive plates 11 and 12 magnetically connect with the conductive plates 21 to 23, and the effective inductance of the conductive plates 11 and 12 becomes smaller than the self inductance of the conductive plates 11 and 12.

Therefore, the substrate 200Q also allows for considerable reduction in the impedance of the electric circuit device 101.

Further, in the electric circuit device 101 comprising the substrate 200Q, a direct current is supplied form the power source 90 to the CPU 110, and an unwanted high frequency current generated in the CPU 110 is confined within the electric element 100.

Figure 43:
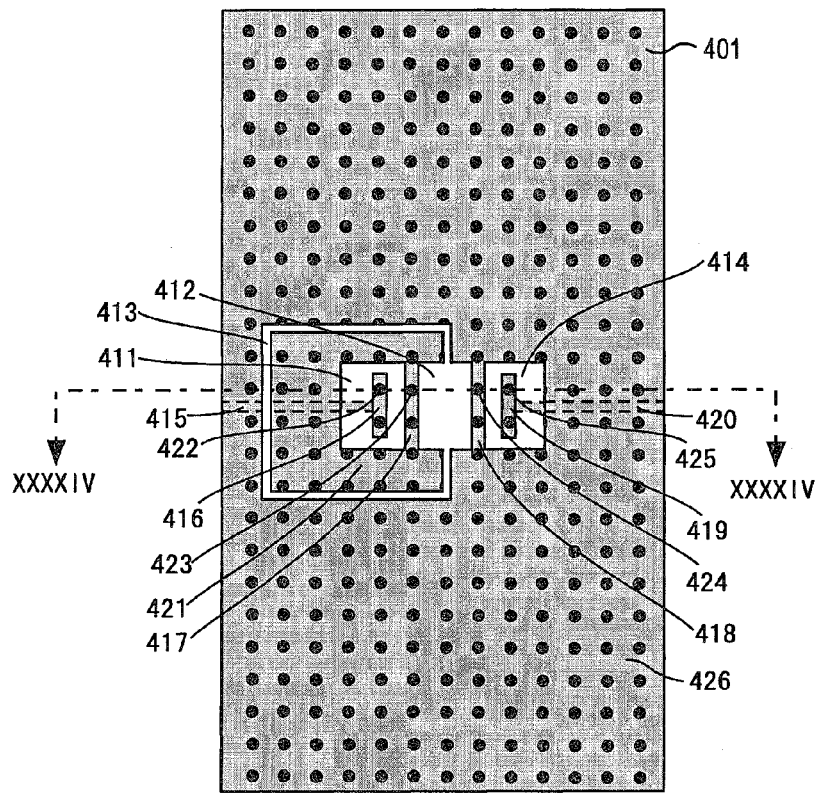
FIG. 43 is a plan view illustrating another structure of the substrate shown in FIG. 1.
Figure 44:
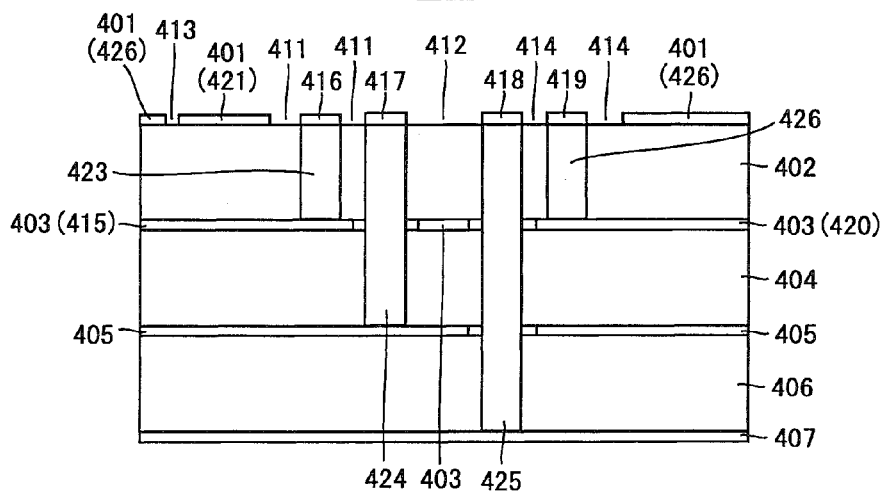
FIG. 44 is a cross sectional view of the substrate taken along line XXXXIV-XXXXIV shown in FIG. 43.

FIG. 43 is a plan view illustrating another structure of the substrate 200 shown in FIG. 1. FIG. 44 is a cross sectional view of the substrate 200R taken along line XXXXIV-XXXXIV shown in FIG. 43. With reference to FIGS. 43 and 44, the substrate 200R comprises conductive plates 401, 403, 405, and 407, dielectrics 402, 404, and 406, slits 411, 412, 413, and 414, and conductor parts 415, 416, 417, 418, 419, 420, 421, and 426.

The conductive plate 401 is formed on the surface of the dielectric 402. The conductive plate 403 is formed on the surface of the dielectric 404. The conductive plate 405 is formed on the surface of the dielectric 406. The conductive plate 407 is formed on the back surface of the dielectric 406. The dielectric 404 on which the conductive plate 403 is formed is laminated on the dielectric 406 on which the conductive plates 405 and 407 are formed. The dielectric 402 on which the conductive plate 401 is formed is laminated on the dielectric 404 on which the conductive plate 403 is formed.

The slits 411 to 414 are formed on the surface of the dielectric 402 by cutting out a part of the conductive plate 401. The slits 411, 412 and 414 are disposed in a straight line in the width direction of the substrate 200R. Both ends of the slit 413 are connected to the slit 412, and the slit 413 surrounds the slit 411. In this case, the width of the slit 413 is determined according to the wavelength of the high frequency current and the relative permittivity of the dielectric 402, and set to a value so that no high frequency current flows from the conductor part 421 formed inside the slit 413 to the conductor part 426 formed outside the slit 413.

As a result, the conductive plate 401 is separated into the conductor part 421 and the conductor part 426. In addition, the conductor parts 416 to 419 are formed on the dielectric 402. In this case, both ends of the conductor part 417 are connected to the conductor part 421, while both ends of the conductor part 418 are connected to the conductor part 426.

The conductor part 415 is formed on the surface of the dielectric 404 by cutting out a part of the conductive plate 403. The conductor part 415 is connected to the conductor part 416 through the via holes 423. The conductor part 420 is formed on the surface of the dielectric 404 by cutting out a part of the conductive plate 403. The conductor part 420 is connected to the conductor part 419 through via holes 426.

The conductor part 417 is connected to the conductive plate 405 through the via holes 424, while the conductor part 418 is connected to the conductive plate 407 through the via holes 425. Note that the conductor part 421 is connected to the conductive plate 405 through via holes, while the conductor part 426 is connected to the conductive plate 407 through via holes. The conductive plates 401, 405 and 407 are connected to ground potential.

Upon producing the electric circuit device with the substrate 200R, the conductor parts 415, 416, 419, and 420 and the via holes 423 and 426 constitute signal lines. The anode electrode 10C is connected to the conductor part 415. The anode electrode 10D is connected to the conductor part 420. The cathode electrode 20E is connected to the conductor part 417. The cathode electrode 20F is connected to the conductor part 418. As a result, the return current flows across the conductive plates 21 to 23 in the electric element 100.

As described above, the return current flows across the conductive plates 21 to 23 in the electric element 100 because the conductor parts 417 and 418, to which the cathode electrodes 20E and 20F are connected, are respectively connected to the conductor parts 421 and 426 which are separated by the slit 413, while the conductor parts 421 and 426 are respectively connected to the different conductive plates 405 and 407.

As described above, with the substrate 200R, the return current is completely conducted to the conductive plates 21 to 23 in the electric element 100, and the effective inductance of the conductive plates 11 and 12 becomes smaller than the self inductance. Accordingly, the impedance of the electric circuit device 101 is reduced.

In the electric circuit device 101 using the substrate 200R, a direct current is supplied from the power source 90 to the CPU 110, and an unwanted high frequency current generated in the CPU 110 is confined within the electric element 100.

Figure 45:
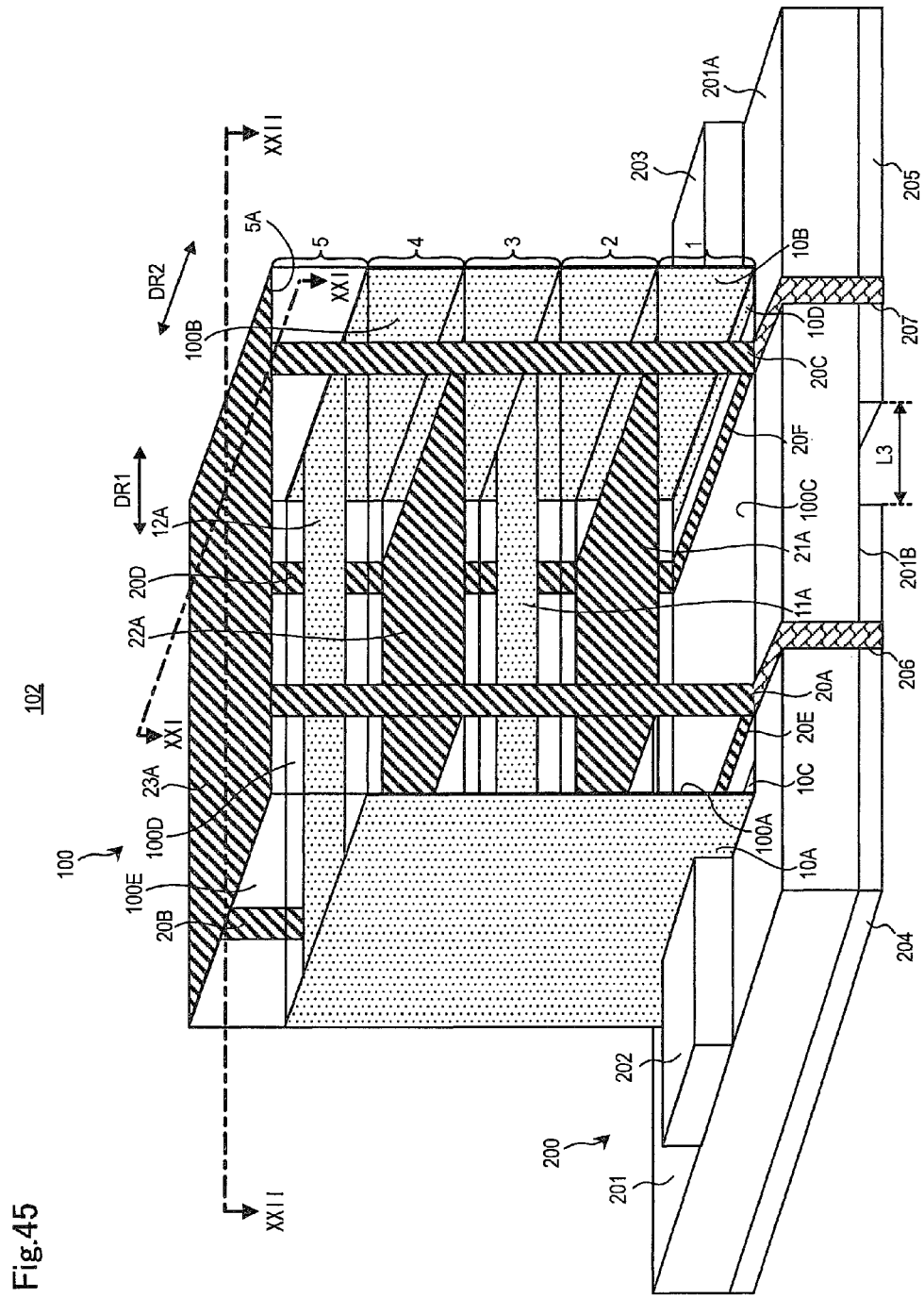
FIG. 45 is a conceptual diagram illustrating another structure of the electric circuit device accordingly to Embodiment 1.

FIG. 45 is a conceptual diagram illustrating another structure of the electric circuit device accordingly to Embodiment 1. The electric circuit device according to Embodiment 1 may be an electric circuit device 102 shown in FIG. 45. With reference to FIG. 45, the electric circuit device 102 is identical with the electric circuit device 101 shown in FIG. 1 except that the electric element 100 of the electric circuit device 101 is replaced with an electric element 100A.

The electric element 100A is identical with the electric element 100 shown in FIG. 2 except that the conductive plates 11, 12 and 21 to 23 of the electric element 100 are respectively replaced with conductive plates 11A, 12A and 21A to 23A.

The conductive plate 21A is disposed between the dielectric layers 1 and 2. The conductive plate 11A is disposed between the dielectric layers 2 and 3. The conductive plate 22A is disposed between the dielectric layers 3 and 4. The conductive plate 12A is disposed between the dielectric layers 4 and 5. The conductive plate 23A is disposed on the main surface 5A of the dielectric layer 5.

One end of each of the conductive plates 11A and 12A is connected to the side anode electrode 10A, and the other end is connected to the side anode electrode 10B. One end of each of the conductive plates 21A to 23A is connected to the side cathode electrodes 20A and 20B, and the other end is connected to the side cathode electrodes 20C and 20D.

The cross sectional view of the electric element 100A taken along line XXI-XXI is identical with the cross sectional view of the electric element 100 shown in FIG. 21, while the cross sectional view of the electric element 100A taken along line XXII-XXII is identical with the cross sectional view of the electric element 100 shown in FIG. 22, except that the conductive plates 11, 12 and 21 to 23 shown in FIGS. 21 and 22 are replaced with the conductive plates 11A, 12A and 21A to 23A.

Figure 46:
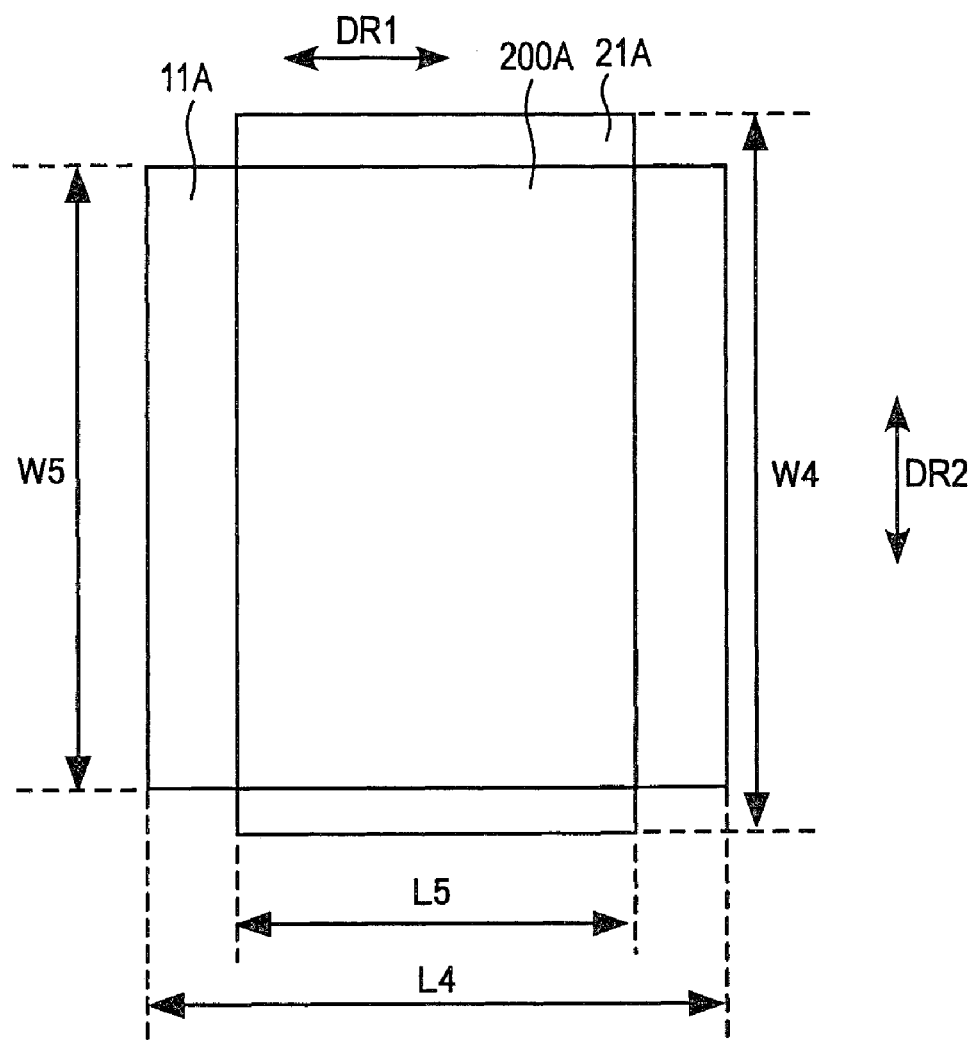
FIG. 46 is another plan view of two adjacent conductive plates.

FIG. 46 is another plan view of two adjacent conductive plates. With reference to FIG. 46, the conductive plate 11A has a length L4 and a width W5, while the conductive plate 21A has a length L5 and a width W4. The length L4 and the width W5 are W5$\geq$L4, and the length L5 and the width W4 are W4$\geq$L5. Accordingly, the conductive plates 11A and 21A are longer in the width direction DR2 than in the longitudinal direction DR1.

The conductive plate 12A has the same size as the conductive plate 11A. The conductive plates 22A and 23A have the same size as the conductive plate 21A.

When projected onto a plain surface, the conductive plates 11A and 21A have an overlap 200A. The overlap 200A between the conductive plate 11A and the conductive plate 21A has the length L5 and the width W5. The overlaps between the conductive plate 11A and the conductive plate 22A, between the conductive plate 12A and the conductive plate 22A, and between the conductive plate 12A and the conductive plate 23A have the same length L5 and the width W5 as the overlap 200A. In Embodiment 3, the length L5 and the width W5 are set to obtain W5$\geq$L5.

When the width W5 of the overlap 200A is equal to or longer than the length L5, as illustrated in FIG. 15, the current I1 flowing across the conductive plate 11A flows across the overlap 200A in the substantial center thereof in the width direction DR2, while the current I2 flowing across the conductive plate 21A flows near the ends of the overlap 200A in the width direction DR2. As a result, as described above, the effective inductance of the conductive plate 11A and 12A becomes smaller than the self inductance of the conductive plates 11A and 12A by a relatively small amount.

The electric circuit device 102, however, comprises the conductive plates 204 and 205 disposed with the certain distance L3 from each other, and therefore, the conductive plates 204 and 205 conduct the return current Ir (=the current I2) to the conductive plates 21A to 23A in the electric element 100A.

As a result, compared to the case where the substrate 200 includes on the main surface 201B a conductive plate electrically connected between the cathode electrodes 20E and 20F, more return current flows across the conductive plates 21A to 23A, and the effective inductance of the conductive plates 11A and 12A becomes smaller than the self inductance of the conductive plates 11A and 12A by a relatively large amount.

Therefore, even when the width W5 of the overlap 200A is equal to or longer than the length L5, by employing the conductive plates 204 and 205 electrically separated from each other in the direction to which the return current Ir flows, the inductance of the electric circuit device 102 is reduced.

Figure 47:
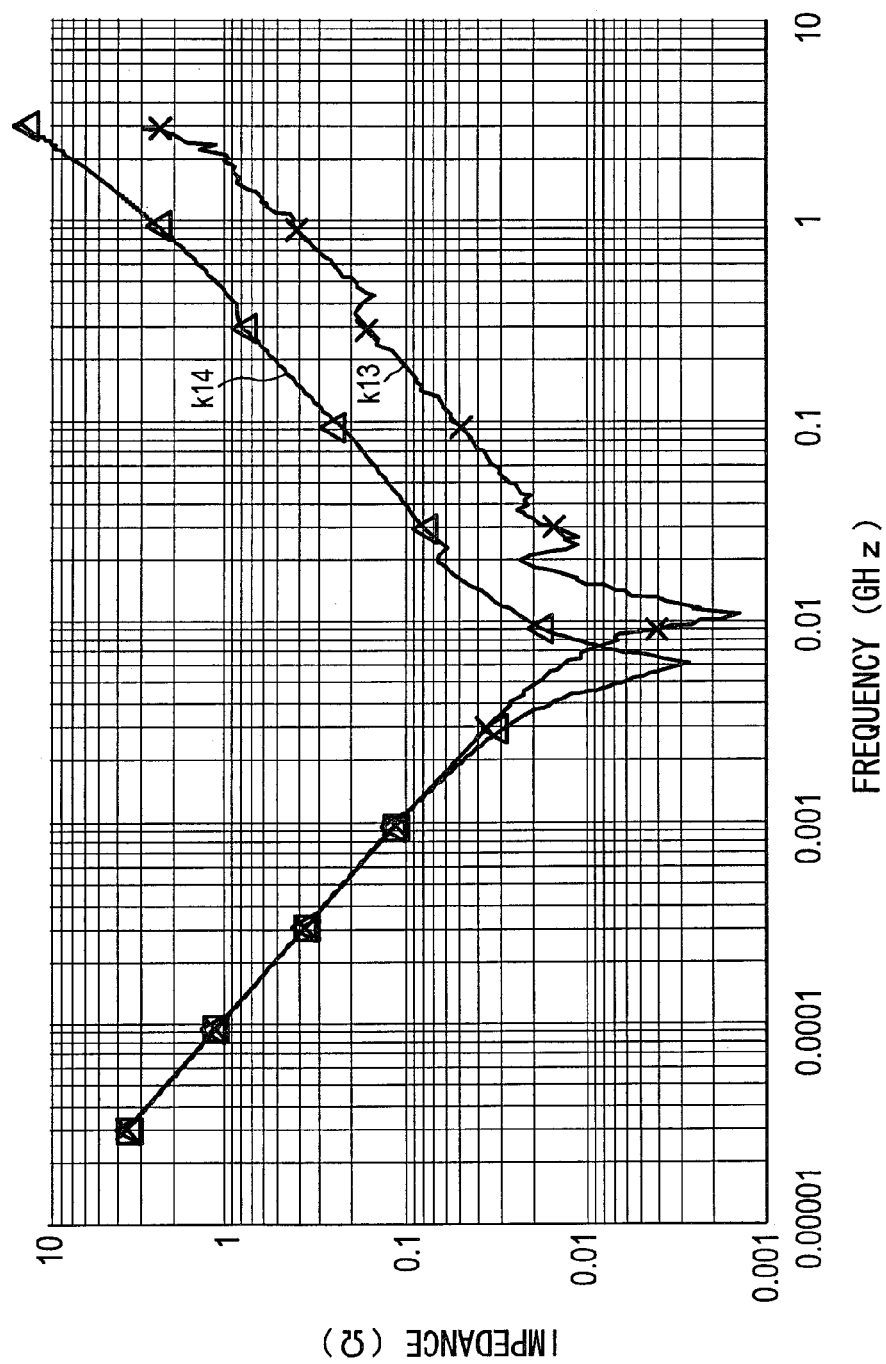
FIG. 47 is a graph illustrating the dependence of the impedance on the frequency in the electric circuit device shown in FIG. 45.

FIG. 47 is a graph illustrating the dependence of the impedance on the frequency in the electric circuit device 102 shown in FIG. 45. In FIG. 47, the abscissa axis represents the frequency, and the longitudinal axis represents the impedance. Curve k13 shows the dependence of the impedance on the frequency obtained when the overlap 200A has the width W5 equal to or longer than the length L5 and the separated conductive plates 204 and 205 are employed. Curve k14 shows the dependence of the impedance on the frequency obtained when the overlap 200A has the width W5 equal to or longer than the length L5 and the electrically conducted conductive plates 204 and 205 are employed.

With reference to FIG. 47, in the low frequency range of 0.006 GHz or lower, the capacitance is dominant. In the high frequency range of 0.01 GHz or higher, the inductance is dominant.

In the low frequency range of 0.006 GHz or lower where the capacitance is dominant, the impedance (curve k13) of the electric circuit device 102 obtained when the conductive plates 204 and 205 are electrically cut off is substantially equal to the impedance (curve k14) of the electric circuit device 102 obtained when the conductive plates 204 and 205 are electrically conducted.

On the other hand, in the high frequency range of 0.01 GHz or higher where the inductance is dominant, the impedance (curve k13) of the electric circuit device 102 obtained when the conductive plates 204 and 205 are electrically cut off is smaller than the impedance (curve k14) of the electric circuit device 102 obtained when the conductive plates 204 and 205 are electrically conducted.

Therefore, even when the with W5 of the overlap 200A is equal to or longer than the length L5, by employing the electrically cut-off conductive plates 204 and 205 in the substrate 200, the inductance of the electric circuit device 102 is reduced.

The electric circuit device 102 may include, in stead of the substrate 200, any of the substrates 200A, 200B, 200C, 200D, 200E, 200F, 200G, 200H, 200J, 200K, 200L, 200M, 200N, 200P, 200Q, and 200R. Any of the substrates 200A, 200B, 200C, 200D, 200E, 200F, 200G, 200H, 200J, 200K, 200L, 200M, 200N, 200P, 200Q, and 200R allow for, as well as the substrate 200, the impedance reduction of the electric circuit device 102.

Further, with any of the substrates 200A, 200B, 200C, 200D, 200E, 200F, 200G, 200H, 200J, 200K, 200L, 200M, 200N, 200P, 200Q, and 200R, as well as the substrate 200, an unwanted high frequency current generated in the CPU 110 is confined within the electric element 100.

Therefore, in the electric circuit device 102, when the overlap 200A between the conductive plates 11A and 12A and the conductive plates 21A to 23A has the width W5 equal to or longer than the length L5, the substrates 200, 200A, 200B, 200C, 200D, 200E, 200F, 200G, 200H, 200J, 200K, 200L, 200M, 200N, 200P, 200Q, and 200R reduce the impedance in the high frequency range where the inductance is dominant.

Further, the substrates 200, 200A, 200B, 200C, 200D, 200E, 200F, 200G, 200H, 200J, 200K, 200L, 200M, 200N, 200P, 200Q, and 200R confine an unwanted high frequency current generated in the CPU 110 within the electric element 100.

In the above, it is described that all of the dielectric layers 1 to 5 are formed of the same dielectric material (BaTiO$_3$), however, this invention is not limited to it: the dielectric layers 1 to 5 may respectively be formed of a different dielectric material, or two types of dielectric materials. Generally, the dielectric layers 1 to 5 have only to be formed of one of more dielectric materials. In this case, preferably, each dielectric material forming the dielectric layers 1 to 5 has the relative permittivity of 3000 or greater.

In addition to BaTiO$_3$, the dielectric material includes, for example, Ba(Ti,Sn)O$_3$, Bi$_4$Ti$_3$O$_{12}$, (Ba,Sr,Ca)TiO$_3$, (Ba,Ca)(Zr,Ti)O$_3$, (Ba,Sr,Ca)(Zr,Ti)O$_3$, SrTiO$_3$, CaTiO$_3$, PbTiO$_3$, $Pb(Zn,Nb)O_3$, $Pb(Fe,W)O_3$, $Pb(Fe,Nb)O_3$, $Pb(Mg,Nb)O_3$, $Pb(Ni,W)O_3$, $Pb(Mg,W)O_3$, $Pb(Zr,Ti)O_3$, $Pb(Li,Fe,W)O_3$, $Pb_5Ge_3O_{11}$, and $CaZrO_3$.

Further, in the above, it is described that the anode electrodes 10C and 10D, the side anode electrodes 10A and 10B, the conductive plates 11, 12 and 21 to 23, the side cathode electrodes 20A, 20B, 20C, and 20D, and the cathode electrodes 20E and 20F are formed of nickel (Ni), however, this invention is not limited to it the anode electrodes 10C and 10D, the side anode electrodes 10A and 10B, the conductive plates 11, 12 and 21 to 23, the side cathode electrodes 20A, 20B, 20C, and 20D, and the cathode electrodes 20E and 20F may be formed of any of silver (Ag), palladium (Pd), silver-palladium alloy (Ag—Pd), platinum (Pt), gold (Au), copper (Cu), rubidium (Ru), and tungsten (W).

Further, in the above, it is described that the electric element 100 includes the dielectric layers 1 to 5, however, this invention is not limited to them: the electric element 100 may not include the dielectric layers 1 to 5. This is because, even without the dielectric layers 1 to 5, the conductive plates 11 and 12 magnetically interfere with the conductive plates 21 to 23, and the impedance of the electric element 100 is reduced as described above.

Further, in the above, it is described that the number of the conductive plate connected to the anode electrodes 10C and 10D is two (the conductive plates 11 and 12) and that the number of the conductive plate connected to the cathode electrodes 20E and 20F is three (the conductive plates 21 to 23), however, this invention is not limited to these numbers: the electric element 100 has only to include n (n is a positive integer) conductive plate connected to the anode electrodes 10C and 10D and m (m is a positive integer) conductive plate connected to the cathode electrodes 20E and 20F. In this case, the electric element 100 includes j (j=m+n) dielectric layers. This is because, if at least one conductive plate is connected to the anode electrodes 10C and 10D and to the cathode electrodes 20E and 20F, respectively, the magnetic interference is produced therebetween, and the effect inductance is reduced.

With this invention, as the current flowing across the electric element 100 increases, the number of conductive plate connected to the anode electrodes 10C and 10D and the number of the conductive plate connected to the cathode electrodes 20E and 20F are increased. This is because, when a plurality of conductive plates are connected to the anode electrodes 10C and 10D and to the cathode electrodes 20E and 20F, respectively, the plurality of conductive plates are connected between the two anode electrodes (10C and 10D) or between the two cathode electrodes (20E and 20F) in parallel with each other and if the number of the conductive plates connected to the anode electrodes 10C and 10D and to the cathode electrodes 20E and 20F is increased, the current flowing across the electric element 100 increases.

Further, with this invention, in order to relatively reduce the impedance of the electric element 100, the number of the conductive plates connected to the electrodes 10C and 10D and to the cathode electrodes 20E and 20F is increased. This is because, if the number of the conductive plates connected to the electrodes 10C and 10D and to the cathode electrodes 20E and 20F is increased, the number of the capacitors connected in parallel with each other increase, which results in an increase in the effective capacitance of the electric element 100 and an reduction in the impedance.

Further, in the above, it is described that the conductive plates 11 and 12 are disposed in parallel with the conductive plates 21 to 23, however, this invention is not limited to that: the conductive plates 11 and 12 and the conductive plates 21 to 23 may be disposed so that the distance from the conductive plates 11 and 12 to the conductive plates 21 to 23 changes in the longitudinal direction DR1.

Further, in the above, it is described that the electric element 100 is connected to the CPU 110, however, this invention is not limited to that: the electric element 100 may be connected to any electric load circuit operable at a certain frequency.

Further, in the above, it is described that the electric element 100 is used as a noise filter to confine an unwanted high frequency current generated in the CPU 110 within the vicinity of the CPU 110, however, this invention is not limited to that: the electric element 100 is also used as a capacitor. The electric element 100, as described above, includes the four capacitors connected in parallel with each other, and therefore, it may be used as a capacitor.

More specifically, the electric element 100 is used in a laptop computer, a CD-RW/DVD recorder/player, a game console, an information appliance, a digital camera, an in-vehicle equipment, an in vehicle digital equipment, a peripheral circuit for the MPU, a DC/DC converter or the like.

Therefore, an electric element that is used in a laptop computer, a CD-RW/DVD recorder/player or the like as a capacitor and, in between the power source 90 and the CPU 110, functions as a noise filter to confine an unwanted high frequency current generated in the CPU 110 within the vicinity of the CPU 110 is also a type of the electric element 100 according to the present invention.

Accordingly to Embodiment 1, the electric circuit device 101 comprises the electric element 100, and the substrates 200, 200A, 200B, 200C, 200D, 200E, 200F, 200G, 200H, 200J, 200K, 200L, 200M, 200N, 200P, 200Q, and 200R, while the electric circuit device 102 comprises the electric element 100A and the substrates 200, 200A, 200B, 200C, 200D, 200E, 200F, 200G, 200H, 200J, 200K, 200L, 200M, 200N, 200P, 200Q, and 200R. Therefore, the substrates 200, 200A, 200B, 200C, 200D, 200E, 200F, 200G, 200H, 200J, 200K, 200L, 200M, 200N, 200P, 200Q, and 200R conducts the current I to the conductive plates 11 and 12 in the electric element 100 or to the conductive plates 11A and 12A in the electric element 100A while conducting the return current Ir of the current I to the conductive plates 21 to 23 in the electric element 100 or to the conductive plates 21A to 23A in the electric element 100A. As a result, the conductive plates 11 and 12 magnetically connect with the conductive plates 21 to 23, and the effective inductance of the conductive plates 11 and 12 becomes smaller than the self inductance of the conductive plates 11 and 12. Likewise, the conductive plates 11A and 12A magnetically connect with the conductive plates 21A to 23A, and the effective inductance of the conductive plates 11A and 12A becomes smaller than the self inductance of the conductive plates 11A and 12A.

Therefore, according to the present invention, the impedance of the electric circuit devices 101 and 102 is reduced. Further, an unwanted high frequency current generated in the CPU 110 is confined within the electric element 100.

Embodiment 2

Figure 48:
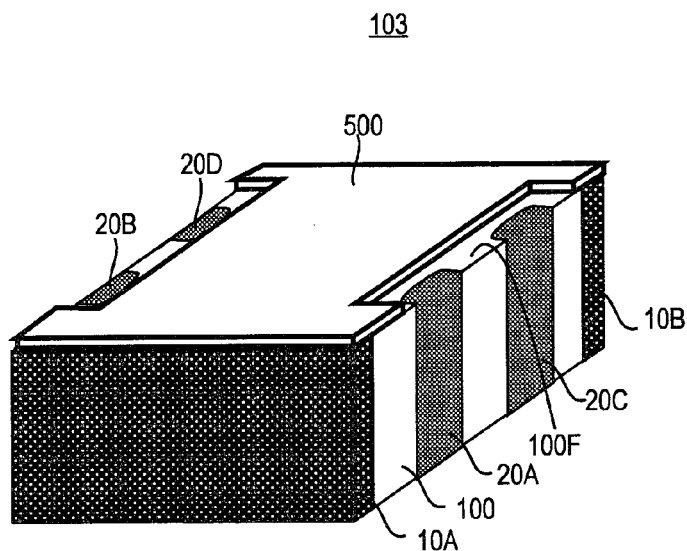
FIG. 48 is a perspective view illustrating the structure of an electric circuit device according to Embodiment 2.

FIG. 48 is a perspective view illustrating the structure of an electric circuit device according to Embodiment 2. With reference to FIG. 48, the electric circuit device 103 according to Embodiment 2 comprises the electric element 100 and a conductive plate 500.

Note that, in the electric circuit device 103, the conductive plate 23 of the electric element 100 is removed. The side anode electrode 10A is formed on the whole side surface 100A of the electric element 100 and a part of the bottom surface 100C, the front surface 100D, the back surface 100E, and the top surface 100F of the electric element 100A. The side anode electrode 10B is formed on the whole side surface 100B of the electric element 100 and a part of the bottom surface 100C, the front surface 100D, the back surface 100E, and the top surface 100F of the electric element 100A. The side cathode electrodes 20A, 20B, 20C, and 20D are also formed on a part of the top surface 100F of the electric element 100.

The conductive plate 500 is disposed on the top surface 100F of the electric element 100 and connected to the side anode electrodes 10A and 10B. The conductive plate 500 is formed of any of silver, copper, gold, aluminum, brass, nickel, iron, platinum, tin, and lead.

Figure 49:
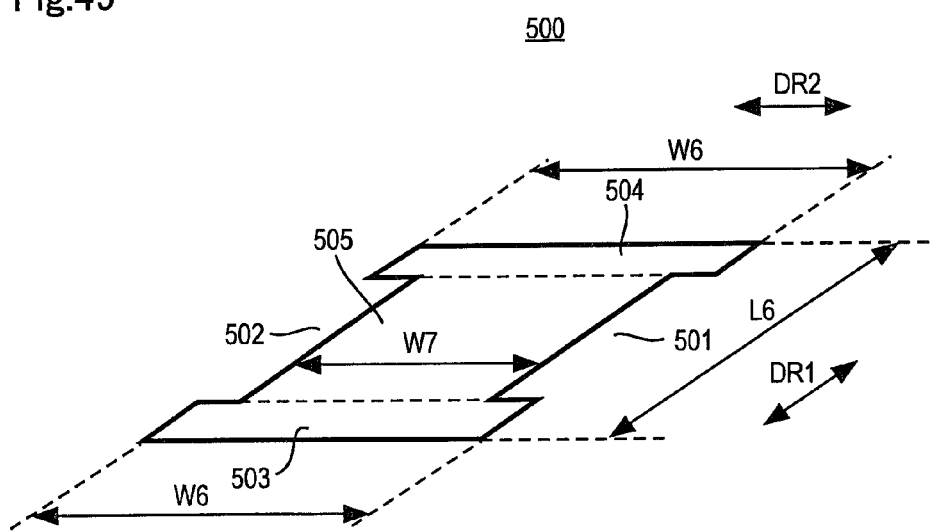
FIG. 49 is a perspective view of the conductive plate shown in FIG. 48.

FIG. 49 is a perspective view of the conductive plate 500 shown in FIG. 48. With reference to FIG. 49, the conductive plate 500 includes cut-outs 501 and 502. Accordingly, the conductive plate 500 includes wide parts 503 and 504 and narrow part 505. The narrow part 505 is disposed between the wide part 503 and the wide part 504.

The cut-out 501 is a cut-out to dispose a part of the side cathode electrodes 20A and 20C on a main surface (=the top surface 100F) of the electric element 100, and the cut-out 502 is a cut-out to dispose a part of the side cathode electrodes 20B and 20D on a main surface (=the top surface 100F) of the electric element 100.

The conductive plate 500 has a length L6 in the direction DR1 to which the current flows across the conductive plates 11 and 12 in the electric element 100. This length L6 is substantially equal to the length of the electric element 100 in the direction DR1.

Further, the wide parts 503 and 504 of the conductive plate 500 have a width W6 in a direction DR2 perpendicular to the direction DR1. The narrow part 505 of the conductive plate 500 has a width W7. The width W6 has the same width as the electric element 100 in the direction DR2. The width W7 is smaller than the width W6. In this case, the width W6 is set to, for example, 5 mm, while the width W7 is set to, for example, 3 mm.

Figure 50:
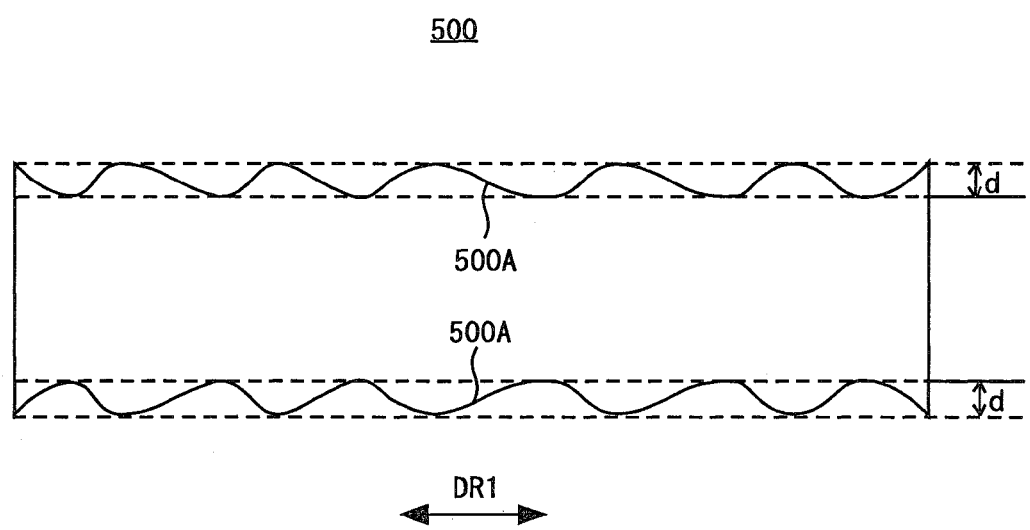
FIG. 50 is a cross sectional view of the conductive plate shown in FIG. 49 taken along the longitudinal direction.

FIG. 50 is a cross sectional view of the conductive plate 500 shown in FIG. 49 taken along the longitudinal direction DR1. With reference to FIG. 50, the conductive plate 500 includes a ridged surface 500A. Note that the ridged surface 500A is not formed only on the top and bottom surfaces of the conductive plate 500, but also on both of the side surfaces in the width direction DR2 of the conductive plate 500. The ridged surface 500A has a depth d. The depth d is set to the skin depth $d_S$ to which, when an alternating current flows across the conductor, the alternating current flows under the influence of the skin effect. As a result, the ridged surface 500A of the conductive plate 500 becomes discontinuous in the longitudinal direction DR1 and therefore, the conductive plate 500 conducts an direct current, and little alternating current.

Table 1 illustrates the relationship between the skin depth $d_S$ caused by the skin effect and the frequency of the respective metal materials forming the conductive plate 500.

TABLE 1

| | | Frequency (GHz) | | | | | | | |
|---|---|---|---|---|---|---|---|---|---|
| | | 0.1 | 0.3 | 0.5 | 1 | 3 | 5 | 10 | 30 |
| Skin Depth (μm) | Silver | 6.44 | 3.72 | 2.88 | 2.04 | 1.18 | 0.91 | 0.64 | 0.37 |
| | Copper | 6.61 | 3.82 | 2.96 | 2.09 | 1.21 | 0.93 | 0.66 | 0.38 |
| | Gold | 7.86 | 4.54 | 3.52 | 2.49 | 1.44 | 1.11 | 0.79 | 0.45 |
| | Aluminum | 7.96 | 4.59 | 3.56 | 2.52 | 1.45 | 1.13 | 0.80 | 0.46 |

TABLE 1-continued

| | | Frequency (GHz) | | | | | | | |
|---|---|---|---|---|---|---|---|---|---|
| | | 0.1 | 0.3 | 0.5 | 1 | 3 | 5 | 10 | 30 |
| | Brass | 9.87 | 5.70 | 4.41 | 3.12 | 1.80 | 1.40 | 0.99 | 0.57 |
| | Nickel | 13.0 | 7.50 | 5.81 | 4.11 | 2.37 | 1.84 | 1.30 | 0.75 |
| | Iron | 15.9 | 9.19 | 7.12 | 5.03 | 2.91 | 2.25 | 1.59 | 0.92 |
| | Platinum | 16.6 | 9.58 | 7.42 | 5.25 | 3.03 | 2.35 | 1.66 | 0.96 |
| | Tin | 16.8 | 9.69 | 7.50 | 5.31 | 3.06 | 2.37 | 1.68 | 0.97 |
| | Lead | 22.5 | 13.0 | 10.1 | 7.12 | 4.11 | 3.18 | 2.25 | 1.30 |

As illustrated in Table 1, with respect to the skin effect, the higher the frequency is, the less the skin depth $d_S$ is. In addition, the electric circuit device 103 includes the electric element 100, and therefore, the impedance decreases in response to the reduction in the effective inductance as described above. In the electric circuit device 103, the conductive plate 500 supplies to the CPU 110 an direct current supplied from the power source 90. The conductive plate 500 also suppresses by means of the skin effect an unwanted high frequency current generated in the CPU 110 and conducts the unwanted high frequency current to the conductive plates 21 to 23 in the electric element 100 to prevent the unwanted high frequency current from leaking toward the power source 90.

Therefore, the depth d of the ridged surface 500A of the conductive plate 500 is determined according to the frequency of an unwanted high frequency current generated by the CPU 110 (an electric load circuit) connected to the electric circuit device 103.

More specifically, when the CPU 110 generates an unwanted high frequency current of the frequency range between f1 to f2 (f1<f2), the depth d is set to the skin depth given by the lowest frequency f1 of the frequency f1 to f2. This is because the skin depth given by the lowest frequency f1 is the deepest of skin depths given by the frequencies included in the range between f1 to f2 and therefore, the high frequency current having the frequency f1 to f2 is prevented from flowing across the conductive plate 500.

Figure 51:
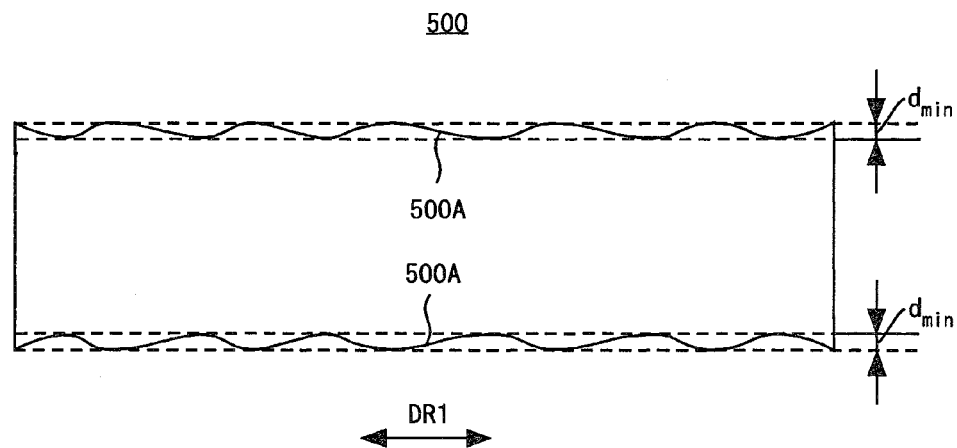
FIG. 51 is a first conceptual diagram illustrating the depth range of the ridged surface shown in FIG. 50.
Figure 52:
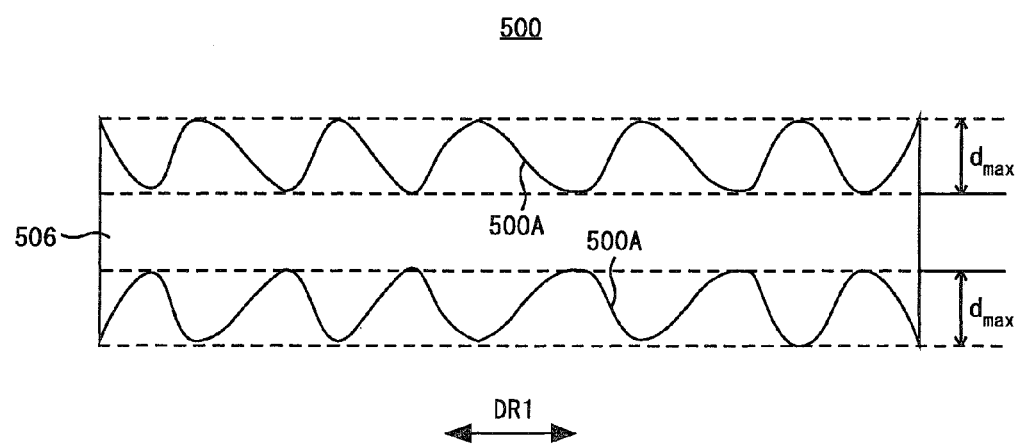
FIG. 52 is a second conceptual diagram illustrating the depth range of the ridged surface shown in FIG. 50.

FIGS. 51 and 52 are first and second conceptual diagrams illustrating the range of the depth d of the ridged surface 500A shown in FIG. 50. With reference to FIG. 51, the ridged surface 500A of the conductive plate 500 has a depth equal to or greater than the minimum depth $d_{min}$. This minimum depth $d_{min}$ is the depth with which more alternating component is conducted to the conductive plates 11 and 12 in the electric element 100 than the alternating component of a current that flows across the conductive plates 11 and 12 in the electric element 100 when the surface of the conductive plate 500 is flat. More specifically, the minimum depth $d_{min}$ is less than the skin depth $d_S$ caused by the skin effect and suppresses the alternating component of a current that flows by the skin effect across the surface layer of the conductive plate 500 when the surface of the conductive plate 500 is flat. Preferably, the minimum depth $d_{min}$ is set to a depth that is less than the skin depth determined by the highest frequency of a high frequency current(=the alternating component of a current) generated in the CPU 110 and suppresses a high frequency current having the highest frequency and flowing by the skin effect across the surface layer of the conductive plate 500.

Figure 53:
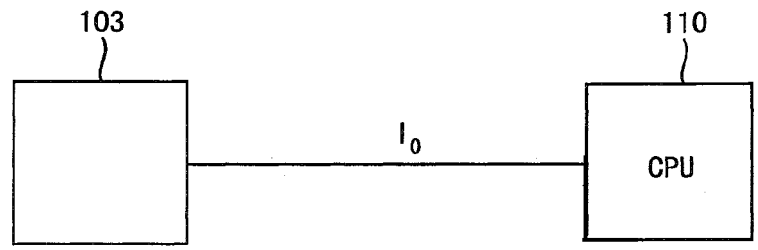
FIG. 53 is a first conceptual diagram illustrating the connection pattern of the electric circuit device and the CPU.
Figure 54:
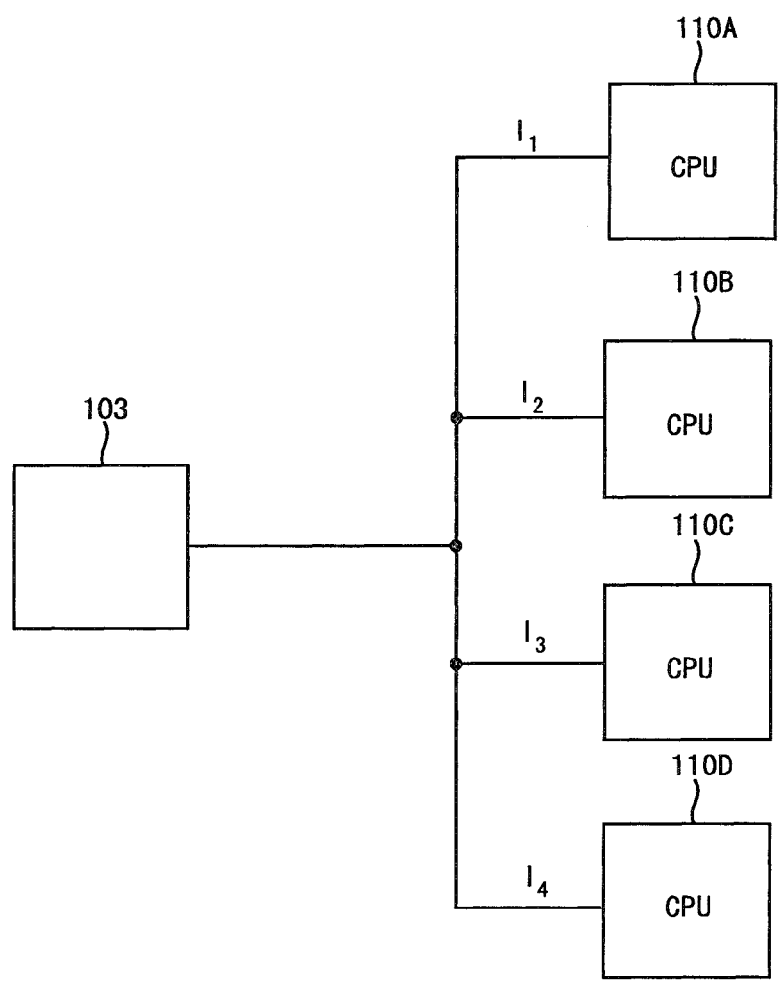
FIG. 54 is a second conceptual diagram illustrating the connection pattern of the electric circuit device and the CPU.

With reference to FIG. 52, the ridged surface 500A of the conductive plate 500 has a depth equal to or less than the maximum depth $d_{max}$. The maximum depth $d_{max}$ is determined according to the current value of a direct current supplied to the CPU 110 (an electric load circuit) connected to the electric circuit device 103. FIGS. 53 and 54 are first and second conceptual diagrams illustrating the connection pattern of the electric circuit device 103 and the CPU 110.

With reference to FIG. 53, when the one CPU 110 is connected to the electric circuit device 103, the electric circuit device 103 supplies a direct current $I_0$ to the CPU 110. When the ridged surface 500A of the conductive plate 500 has the maximum depth $d_{max}$, the direct current I flows across the area 506 of the conductive plate 500A, and the current value of the direct current $I_0$ is determined by the cross-section area of the area 506. The cross-section area S of the area 506 is given by $S=(D-2\times d_{max})\times(W7-2\times d_{max})$ in which D is the thickness of the conductive plate 500 the surface of which is flat and $\rho$ is the resistivity of the conductive plate 500. The direct current I is given by $I_0=V\times(D-2\times d_{max})\times(W7-2\times d_{max})/(\rho\times L6)$ in which V is the voltage applied when the direct current I is applied.

Given the current value of the direct current $I_0$ and the voltage value of the voltage V, the maximum depth $d_{max}$ of the ridged surface 500A of the conductive plate 500 is determined by $I_0=V\times(D-2\times d_{max})\times(W7-2\times d_{max})/(\rho\times L6)$ since the thickness D, the resistivity $\rho$, the width W7, and the length L6 are already-known.

With reference to FIG. 54, when the four CPUs 110A, 110B, 110C, and 110D are connected, in parallel with each other, to the electric circuit device 103, the electric circuit device 103 applies to the conductive plate 500 a direct current of $I_1+I_2+I_3+I_4$, which is the total of the direct currents $I_1$, $I_2$, $I_3$, and $I_4$ respectively supplied to the CPUs 110A, 110B, 110C, and 110D. Therefore, the maximum depth $d_{max}$ of the ridged surface 500A of the conductive plate 500 is determined by $I_1+I_2+I_3+I_4=V\times(D-2\times d_{max})\times W7/(\rho\times L6)$. When j (j is a positive integer equal to or larger than 2) CPUs 110 are connected, in parallel with each other, to the electric circuit device 103, the maximum depth $d_{max}$ of the ridged surface 500A of the conductive plate 500 is determined by $I_1+I_2+\ldots+I_j=V\times(D-2\times d_{max})\times(W7-2\times d_{max})/(\rho\times L6)$.

Note that when the current value of each of the direct currents $I_1$, $I_2$, $I_3$, and $I_4$, which are respectively supplied to the CPUs 110A, 110B, 110C, and 110D, is equal to one another, the maximum depth $d_{max}$ of the ridged surface 500A of the conductive plate 500 is determined by $4\times I_1=V\times(D-2\times d_{max})\times W7/(\rho\times L6)$. When j CPUs 110 are connected, in parallel with each other, to the electric circuit device 103 and the current value of respective direct currents supplied to each CPU 110 is equal to one another, the maximum depth $d_{max}$ of the ridged surface 500A of the conductive plate 500 is determined by $j\times I_1=V\times(D-2\times d_{max})\times(W7-2\times d_{max})/(\rho\times L6)$.

With the methods described above, the minimum depth $d_{min}$ and the maximum depth $d_{max}$ of the ridged surface 500A of the conductive plate 500 are determined. The depth d of the ridged surface 500A of the conductive plate 500 has only to be set to the depth equal to or greater than the minimum depth $d_{min}$. Or, preferably, the depth d of the ridged surface 500A of the conductive plate 500 has only to be set to the depth equal to or greater than the skin depth $d_S$. Further, preferably, the depth d of the ridged surface 500A of the conductive plate 500 has only to be set to the depth equal to or greater than the skin depth $d_S$, which is determined by the highest frequency of the frequencies of a high frequency current generated by the CPU 110. Further, preferably, the depth d of the ridged surface 500A of the conductive plate 500 has only to be set to the depth equal to or greater than the minimum depth $d_{min}$ and equal to or less than the maximum depth $d_{max}$. Further, preferably, the depth d of the ridged surface 500A of the conductive plate 500 has only to be set to the depth equal to or greater than the skin depth $d_S$ and equal to or less than the maximum depth $d_{max}$. Further, preferably, the depth d of the ridged surface 500A of the conductive plate 500 has only to be set to the depth equal to or greater than the skin depth $d_S$, which is determined by the highest frequency of the frequencies of a high frequency current generated by the CPU 110, and equal to or less than the maximum depth $d_{max}$. Further, preferably, the depth d of the ridged surface 500A of the conductive plate 500 has only to be set to the depth equal to or greater than the skin depth $d_S$, which is determined by the lowest frequency of the frequencies of a high frequency current generated by the CPU 110, and equal to or less than the maximum depth $d_{max}$.

Note that in FIGS. 50 to 52, the ridged surface 500A is illustrated as having the same shape on both the top and bottom surfaces, however, this invention is not limited to that: the ridged surface 500A may have ridges with different shapes on the front and bottom surfaces, respectively.

The electric circuit device 103 is disposed on the substrate 200. In this case, the side anode electrode 10A is connected to the conductive plate 202. The side anode electrode 10B is connected to the conductive plate 203. The side cathode electrodes 20A and 20B are connected to the conductive plate 204 via a conductor (not illustrated). The side cathode electrodes 20C and 20D are connected to the conductive plate 205 via a conductor (not illustrated).

Accordingly, the electric circuit device 103 receives the current I to the side anode electrode 10A through the conductive plate 202. The conductive plate 500 of the electric circuit device 103 conducts the direct component of the current I to the side anode electrode 10B, and the alternating component of the current I to the conductive plates 11 and 12 in the electric element 100. Therefore, the direct component of the current I flows from the side anode electrode 10A to the conductive plate 500 to the side anode electrode 10B, and to the conductive plate 203, while the alternating component of the current I flows from the side anode electrode 10A to the conductive plates 11 and 12 to the side anode electrode 10B, and to the conductive plate 203.

The skin effect of the conductive plate 500 restrains the return current Ir of the current I from flowing across the conductive plate 500. Therefore, the return current Ir flows from the conductive plate 205 of the substrate 200 to the cathode electrodes 20C and 20D through a conductor (not illustrated), then in the electric element 100, from the side cathode electrodes 20C and 20D to the conductive plates 21 and 22 and to the side cathode electrodes 20A and 20B, and then, through a conductor, to the conductive plate 204.

As a result, the conductive plates 11 and 12 in the electric element 100 magnetically connect with the conductive plates 21 and 22, and the effective inductance of the conductive plates 11 and 12 becomes smaller than the self inductance of the conductive plates 11 and 12.

Therefore, according to the present invention, the impedance of the electric circuit device 103 is reduced.

In addition, an unwanted high frequency current generated in the CPU 110, namely the return current Ir of the current I, is confined within the electric element 100 and prevented from leaking toward the power source 90.

Further, in the electric circuit device 103, the direct component flows across the conductive plate 500 disposed outside the electric element 100 (=on the top surface 100F) and therefore, temperature rise in the electric element 100 is alleviated.

Figure 55:
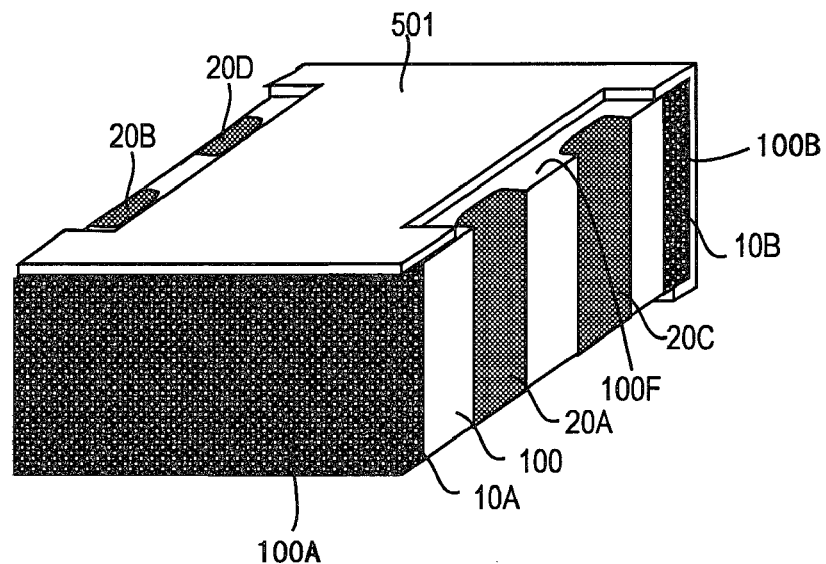
FIG. 55 is another perspective view illustrating the structure of the electric circuit device according to Embodiment 2.

FIG. 55 is another perspective view illustrating the structure of the electric circuit device according to Embodiment 2. The electric circuit device according to Embodiment 2 may be an electric circuit device 104 shown in FIG. 55. With reference to FIG. 55, the electric circuit device 104 is identical with the electric circuit device 103 shown in FIG. 48 except that the conductive plate 500 of the electric circuit device 103 is replaced with a conductive plate 501.

The conductive plate 501 is disposed on the tops surface 100F, the side surface 100B and a part of the bottom surface 100C of the electric element 100 and connected to the side anode electrodes 10A and 10B. The conductive plate 501 is formed of any of silver, copper, gold, aluminum, brass, nickel, iron, platinum, tin, and lead. The conductive plate 501 has the same ridged surface as the ridged surface 500A of the conductive plate 500.

Just like the conductive plate 500, the ridges of the conductive plate 501 have a depth equal to the skin depth caused by the skin effect. Therefore, the conductive plate 501 conducts the direct component of the current I therethrough and the alternating component of the current I to the conductive plates 11 and 12 in the electric element 100.

As a result, in the electric circuit device 104, the conductive plates 11 and 12 magnetically connect with the conductive plates 21 and 22, and the effective inductance of the conductive plates 11 and 12 becomes smaller than the self inductance of the conductive plates 11 and 12.

Therefore, according to the present invention, the impedance of the electric circuit device 104 is reduced.

Further, an unwanted high frequency current generated by the CPU 110 is confined within the electric element 100 and prevented from leaking toward the power source 90.

Further, the contact area between the conductive plate 501 and the side anode electrode 10B is larger than that between the conductive plate 500 and the side anode electrode 10B. Therefore, the contact resistance between the conductive plate 501 and the side anode electrode 10B is reduced, and the temperature rise in the contacting area between the conductive plate 501 and the side anode electrode 10B is alleviated.

Note that, in the electric circuit device 104, in stead of the conductive plate 501, a conductive plate having a larger contact area with the side anode electrode 10A may be used.

Figure 56:
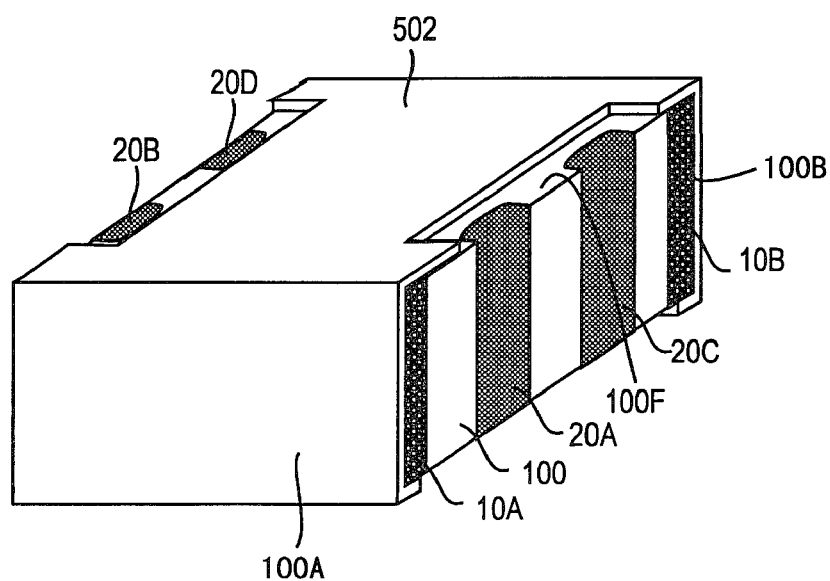
FIG. 56 is further another perspective view illustrating the structure of the electric circuit device according to Embodiment 2.

FIG. 56 is further another perspective view illustrating the structure of the electric circuit device according to Embodiment 2. The electric circuit device according to Embodiment 2 may be an electric circuit device 105 shown in FIG. 56.

With reference to FIG. 56, the electric circuit device 105 is identical with the electric circuit device 103 shown in FIG. 48 except that the conductive plate 500 of the electric circuit device 103 is replaced with a conductive plate 502.

The conductive plate 502 is disposed on the top surface 100F, the side surfaces 100A and 100B, and a part of the bottom surface 100C of the electric element 100 and connected to the side anode electrodes 10A and 10B. The conductive plate 502 is formed of any of silver, copper, gold, aluminum, brass, nickel, iron, platinum, tin, and lead. The conductive plate 502 has the same ridged surface as the ridged surface 500A of the conductive plate 500.

Just like the conductive plate 500, the ridges of the conductive plate 502 have a depth equal to the skin depth caused by the skin effect. Therefore, the conductive plate 502 conducts the direct component of the current I therethrough and the alternating component of the current I to the conductive plates 11 and 12 in the electric element 100.

As a result, in the electric circuit device 105, the conductive plates 11 and 12 magnetically connect with the conductive plates 21 and 22, and the effective inductance of the conductive plates 11 and 12 becomes smaller than the self inductance of the conductive plates 11 and 12.

Therefore, according to the present invention, the impedance of the electric circuit device 105 is reduced.

Further, an unwanted high frequency current generated in the CPU 110 is confined within the electric element 100 and prevented from leaking toward the power source 90.

Further, the contact area between the conductive plate 502 and the side anode electrodes 10A and 10B is larger than that between the conductive plate 500 and the side anode electrodes 10A and 10B. Therefore, the contact resistance between the conductive plate 502 and the side anode electrodes 10A and 10B is reduced, and temperature rise in the contacting area between the conductive plate 502 and the side anode electrodes 10A and 10B is alleviated.

Figure 57:
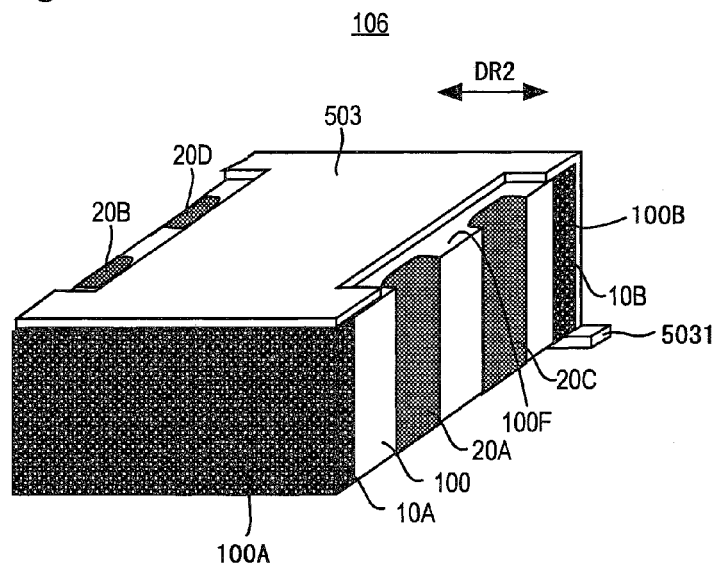
FIG. 57 is further another perspective view illustrating the structure of the electric circuit device according to Embodiment 2.

FIG. 57 is another perspective view illustrating the structure of the electric circuit device according to Embodiment 2. The electric circuit device according to Embodiment 2 may be an electric circuit device 106 shown in FIG. 57.

With reference to FIG. 57, the electric circuit device 106 is identical with the electric circuit device 103 shown in FIG. 48 except that the conductive plate 500 of the electric circuit device 103 is replaced with a conductive plate 503.

The conductive plate 503 is disposed on the top surface 100F, the side surface 100B, and a part of the bottom surface 100C of the electric element 100 and connected to the side anode electrodes 10A and 10B. The conductive plate 503 has an extension 5031 extending out in width direction DR2 of the electric element 100. Note that FIG. 57 only illustrates the extension 5031 extending out in one direction of the width direction DR2 of the electric element 100, however, the conductive plate 503 actually has an extension extending out in the opposite direction to the extension 5031.

The conductive plate 503 is formed of any of silver, copper, gold, aluminum, brass, nickel, iron, platinum, tin, and lead. The conductive plate 503 has the same ridged surface as the ridged surface 500A of the conductive plate 500.

Just like the conductive plate 500, the ridges of the conductive plate 503 have a depth equal to the skin depth caused by the skin effect, Therefore, the conductive plate 503 conducts the direct component of the current I therethrough, and the alternating component of the current I to the conductive plates 11 and 12 in the electric element 100.

As a result, in the electric circuit device 106, the conductive plates 11 and 12 magnetically connect with the conductive plates 21 and 22, and the effective inductance of the conductive plates 11 and 12 becomes smaller than the self inductance of the conductive plates 11 and 12.

Therefore, according to the present invention, the impedance of the electric circuit device 106 is reduced.

Further, an unwanted high frequency current generated in the CPU 110 is confined within the electric element 100 and prevented from leaking toward the power source 90.

Further, the contact area between the conductive plate 503 and the side anode electrode 10B is larger than that between the conductive plate 500 and the side anode electrode 10B. Therefore, the contact resistance between the conductive plate 503 and the side anode electrode 10B is reduced, and temperature rise in the contacting area between the conductive plate 503 and the side anode electrode 10B is alleviated.

Further, the conductive plate 503 has the extension 5031 and therefore, when the electric circuit device 106 is disposed on the substrate 200, the contact area with the conductive plate 203 becomes larger. Therefore, the contact resistance between the electric circuit device 106 and the substrate 200 is reduced, and temperature rise in the contacting area between the electric circuit device 106 and the substrate 200 is alleviated.

Figure 58:
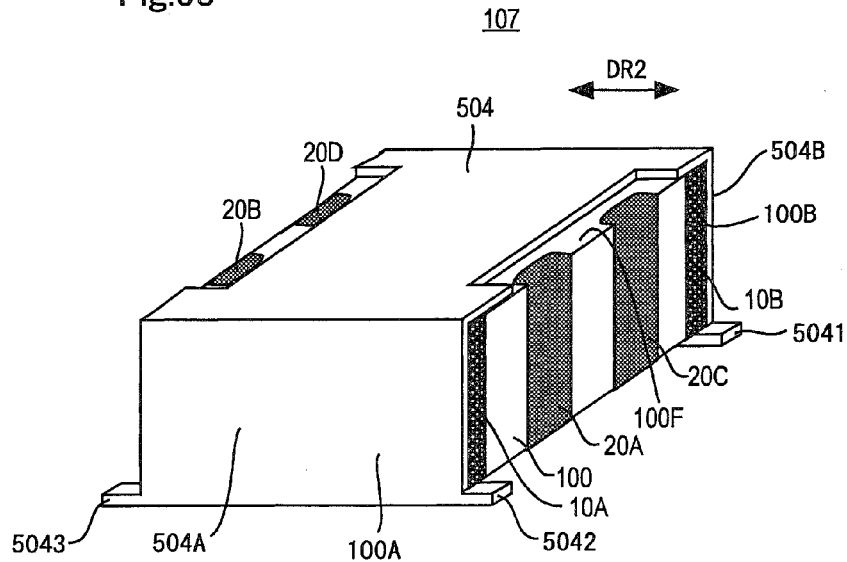
FIG. 58 is further another perspective view illustrating the structure of the electric circuit device according to Embodiment 2.

FIG. 58 is another perspective view illustrating the structure of the electric circuit device according to Embodiment 2.

The electric circuit device according to Embodiment 2 may be an electric circuit device 107 shown in FIG. 58.

With reference to FIG. 58, the electric circuit device 107 is identical with the electric circuit device 103 shown in FIG. 48 except that the conductive plate 500 of the electric circuit device 103 is replaced with a conductive plate 504.

The conductive plate 504 is disposed on the top surface 100F, the side surfaces 100A and 100B, a part of the bottom surface 100C of the electric element 100 and has connections 504A and 504B. The conductive plate 504 is connected to the side anode electrode 10A via the connection 504A, and to the side anode electrode 10B via the connection 504B. The connection 504A has extensions 5042 and 5043 extending out in the width direction DR2 of the electric element 100, while the connection 504B has an extension 5041 extending out in the width direction DR2 of the electric element 100. Note that although FIG. 58 only illustrates the three extensions 5041 to 5043 extending out in the width direction DR2 of the electric element 100, the connection 504B actually has an extension extending out in the opposite direction to the extension 5041.

The conductive plate 504 is formed of any of silver, copper, gold, aluminum, brass, nickel, iron, platinum, tin, and lead. The conductive plate 504 has the same ridged surface as the ridged surface 500A of the conductive plate 500.

Just like the conductive plate 500, the ridges of the conductive plate 504 have a depth equal to the skin depth caused by the skin effect. Therefore, the conductive plate 504 conducts the direct component of the current I therethrough, and the alternating component of the current I to the conductive plates 11 and 12 in the electric element 100.

As a result, in the electric circuit device 107, the conductive plates 11 and 12 magnetically connect with the conductive plates 21 and 22, and the effective inductance of the conductive plates 11 and 12 becomes smaller than the self inductance of the conductive plates 11 and 12.

Therefore, according to the present invention, the impedance of the electric circuit device 107 is reduced.

Further, an unwanted high frequency current generated in the CPU 110 is confined within the electric element 100 and prevented from leaking toward the power source 90.

Further, the contact area between the conductive plate 504 and the side anode electrodes 10A and 10B is larger than that between the conductive plate 500 and the side anode electrodes 10A and 10B. Therefore, the contact resistance between the conductive plate 504 and the side anode electrodes 10A and 10B is reduced, and temperature rise in the contacting area between the conductive plate 504 and the side anode electrodes 10A and 10B is alleviated.

Further, the conductive plate 504 has the extensions 5041 to 5043 and therefore, when the electric circuit device 107 is disposed on the substrate 200, the contact area with the conductive plates 202 and 203 becomes larger. Therefore, the contact resistance between the electric circuit device 107 and the substrate 200 is reduced, and temperature rise in the contacting area between the electric circuit device 107 and the substrate 200 is alleviated.

Figure 59:
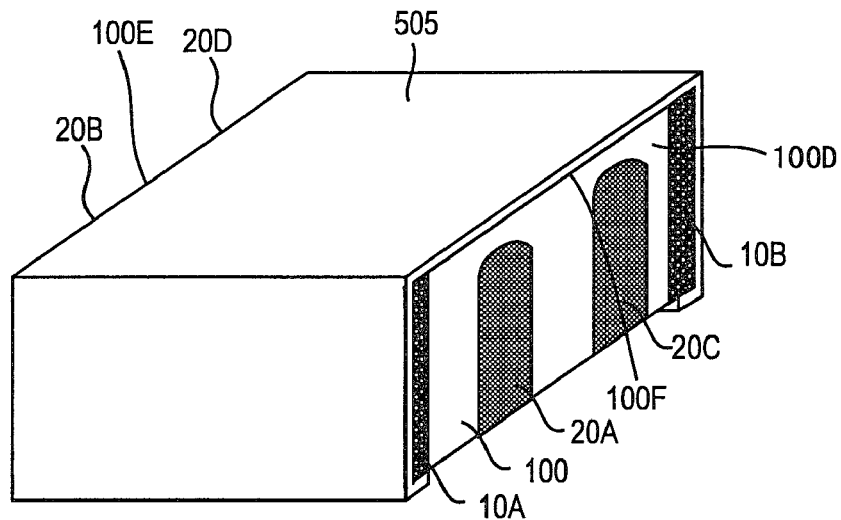
FIG. 59 is further another perspective view illustrating the structure of the electric circuit device according to Embodiment 2.

FIG. 59 is another perspective view illustrating the structure of the electric circuit device according to Embodiment 2. The electric circuit device according to Embodiment 2 may be an electric circuit device 108 shown in FIG. 59.

With reference to FIG. 59, the electric circuit device 108 is identical with the electric circuit device 103 shown in FIG. 48 except that the conductive plate 500 of the electric circuit device 103 is replaced with a conductive plate 505. In the electric circuit device 108, the side cathode electrodes 20A and 20C of the electric element 100 are disposed on the front surface 100D of the electric element 100, while the side cathode electrodes 20B and 20D are disposed on the back surface 100E of the electric element 100.

The conductive plate 505 has the same width W6 as the wide parts 503 and 504 of the conductive plate 500. The conductive plate 505 is disposed to the top surface 100F, the side surfaces 100A and 100B and a part of the bottom surface 100C of the electric element 100 and connected to the side anode electrodes 10A and 10B.

The conductive plate 505 is formed of any of silver, copper, gold, aluminum, brass, nickel, iron, platinum, tin, and lead. The conductive plate 505 has the same ridged surface as the ridged surface 500A of the conductive plate 500.

Just like the conductive plate 500, the ridges of the conductive plate 505 have a depth equal to the skin depth caused by the skin effect. Therefore, the conductive plate 505 conducts the direct component of the current I therethrough, and the alternating component of the current I to the conductive plates 11 and 12 in the electric element 100.

As a result, in the electric circuit device 108, the conductive plates 11 and 12 magnetically connect with the conductive plates 21 and 22, and the effective inductance of the conductive plates 11 and 12 becomes smaller than the self inductance of the conductive plates 11 and 12.

Therefore, according to the present invention, the impedance of the electric circuit device 108 is reduced.

Further, an unwanted high frequency current generated in the CPU 110 is confined within the electric element 100 and prevented from leaking towards the power source 90.

Further, the contact area between the conductive plate 505 and the side anode electrodes 10A and 10B is larger than that between the conductive plate 500 and the side anode electrodes 10A and 10B. Therefore, the contact resistance between the conductive plate 505 and the side anode electrodes 10A and 10B is reduced, and temperature rise in the contacting area between the conductive plate 505 and the side anode electrodes 10A and 10B is alleviated.

Figure 60:
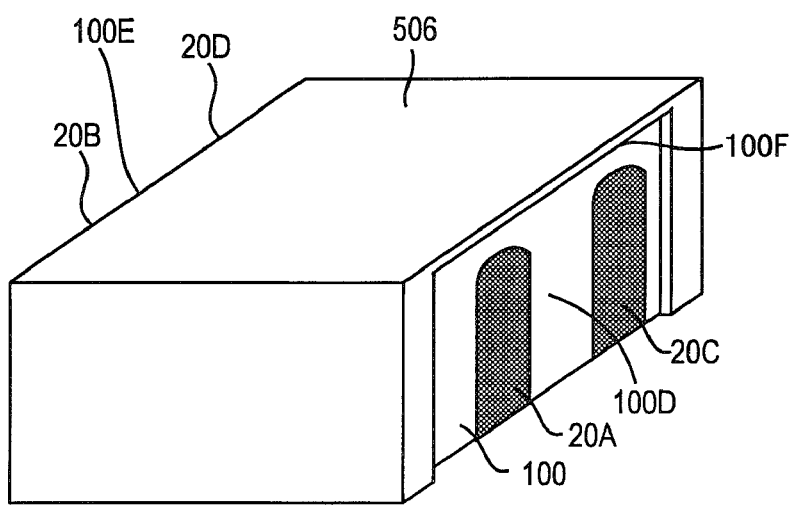
FIG. 60 is further another perspective view illustrating the structure of the electric circuit device according to Embodiment 2.

FIG. 60 is further another perspective view illustrating the structure of the electric circuit device according to Embodiment 2. The electric circuit device according to Embodiment 2 may be an electric circuit device 109 shown in FIG. 60.

With reference to FIG. 60, the electric circuit device 109 is identical with the electric circuit device 108 shown in FIG. 59 except that the conductive plate 505 of the electric circuit device 108 is replaced with a conductive plate 506.

The conductive plate 506 is disposed on the whole of the top surface 100F, the whole of the side surfaces 100A and 100B, a part of the bottom surface 100C, a part of the front surface 100D, and a part of the back surface 100E of the electric element 100 and connected to the side anode electrodes 10A and 10B.

The conductive plate 506 is formed of any of silver, copper, gold, aluminum, brass, nickel, iron, platinum, tin, and lead. The conductive plate 506 has the same ridged surface as the ridged surface 500A of the conductive plate 500.

Just like the conductive plate 500, the ridges of the conductive plate 506 have a depth equal to the skin depth caused by the skin effect. Therefore, the conductive plate 506 conducts the direct component of the current I therethrough, and the alternating component of the current I to the conductive plates 11 and 12 in the electric element 100.

As a result, in the electric circuit device 109, the conductive plates 11 and 12 magnetically connect with the conductive plates 21 and 22, and the effective inductance of the conductive plates 11 and 12 becomes smaller than the self inductance of the conductive plates 11 and 12.

Therefore, according to the present invention, the impedance of the electric circuit device 109 is reduced.

Further, an unwanted high frequency current generated in the CPU 110 is confined within the electric element 100 and prevented from leaking toward the power source 90.

Further, the contact area between the conductive plate 506 and the side anode electrodes 10A and 10B is larger than that between the conductive plate 505 and the side anode electrodes 10A and 10B. Therefore, the contact resistance between the conductive plate 506 and the side anode electrodes 10A and 10B is reduced, and temperature rise in the contacting area between the conductive plate 506 and the side anode electrodes 10A and 10B is alleviated.

Figure 61:
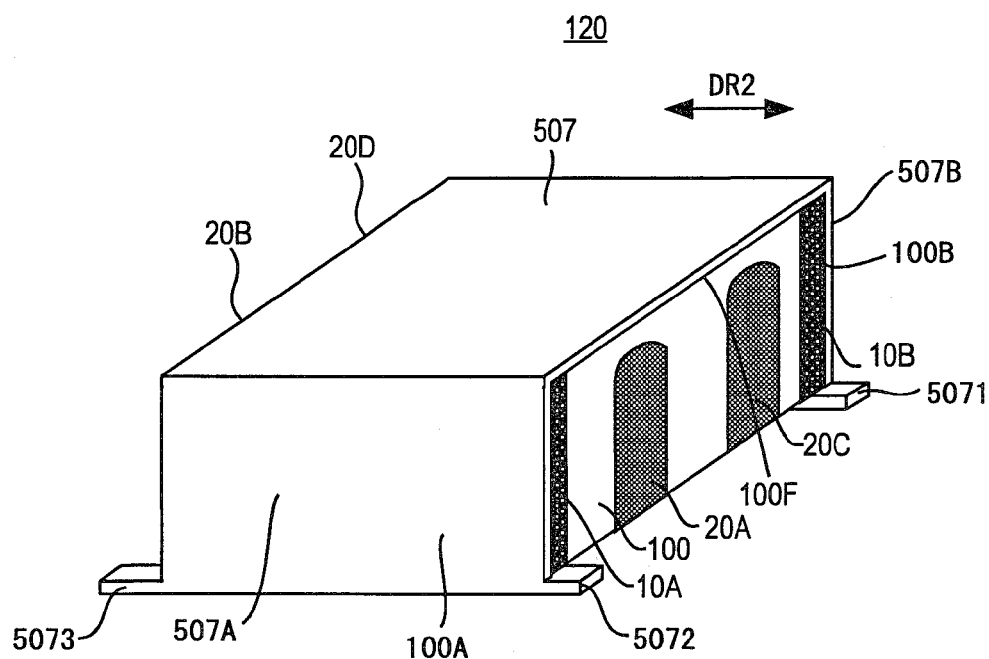
FIG. 61 is further another perspective view illustrating the structure of the electric circuit device according to Embodiment 2.

FIG. 61 is further another perspective view illustrating the structure of the electric circuit device according to Embodiment 2. The electric circuit device according to Embodiment 2 may be an electric circuit device 120 shown in FIG. 61.

With reference to FIG. 61, the electric circuit device 120 is identical with the electric circuit device 108 shown in FIG. 55 except that the conductive plate 505 of the electric circuit device 108 is replaced with a conductive plate 507.

The conductive plate 507 is disposed on the top surface 100F, the side surfaces 100A and 100B, and a part of the bottom surface 100C of the electric element 100 and has connections 507A and 507B. The conductive plate 507 is connected to the side anode electrode 10A via the connection 507A, and to the side anode electrode 10B via the connection 507B. The connection 507A has extensions 5072 and 5073 extending out in the width direction DR2 of the electric element 100, while the connection 507B has an extension 5071 extending out in the width direction DR2 of the electric element 100.

Note that FIG. 61 only illustrate the three extensions 5071 to 5073 extending out in the width direction DR2 of the electric element 100, however, the connection 507B actually has an extension extending out in the opposite direction to the extension 5071.

The conductive plate 507 is formed of any of silver, copper, gold, aluminum, brass, nickel, iron, platinum, tin, and lead. The conductive plate 507 has the same ridged surface as the ridged surface 500A of the conductive plate 500.

Just like the conductive plate 500, the ridges of the conductive plate 507 have a depth equal to the skin depth caused by the skin effect. Therefore, the conductive plate 507 conducts the direct component of the current I therethrough, and the alternating component of the current I to the conductive plates 11 and 12 in the electric element 100.

As a result, in the electric circuit device 120, the conductive plates 11 and 12 magnetically connect with the conductive plates 21 and 22, and the effective inductance of the conductive plates 11 and 12 becomes smaller than the self inductance of the conductive plates 11 and 12.

Therefore, according to the present invention, the impedance of the electric circuit device 120 is reduced.

Further, an unwanted high frequency current generated in the CPU 110 is confined within the electric element 100 and prevented from leaking toward the power source 90.

Further, the contact area between the conductive plate 507 and the side anode electrodes 10A and 10B is larger than that between the conductive plate 500 and the side anode electrodes 10A and 10B. Therefore, the contact resistance between the conductive plate 507 and the side anode electrodes 10A and 10B is reduced, and temperature rise in the contacting area between the conductive plate 507 and the side anode electrodes 10A and 10B is alleviated.

Further, the conductive plate 507 has the extensions 5071 to 5073 and therefore, when the electric circuit device 120 is disposed on the substrate 200, the contact area with the conductive plates 202 and 203 becomes larger. Therefore, the contact resistance between the electric circuit device 120 and the substrate 200 is reduced, and temperature rise in the contacting area between the electric circuit device 120 and the substrate 200 is alleviated.

Figure 62:
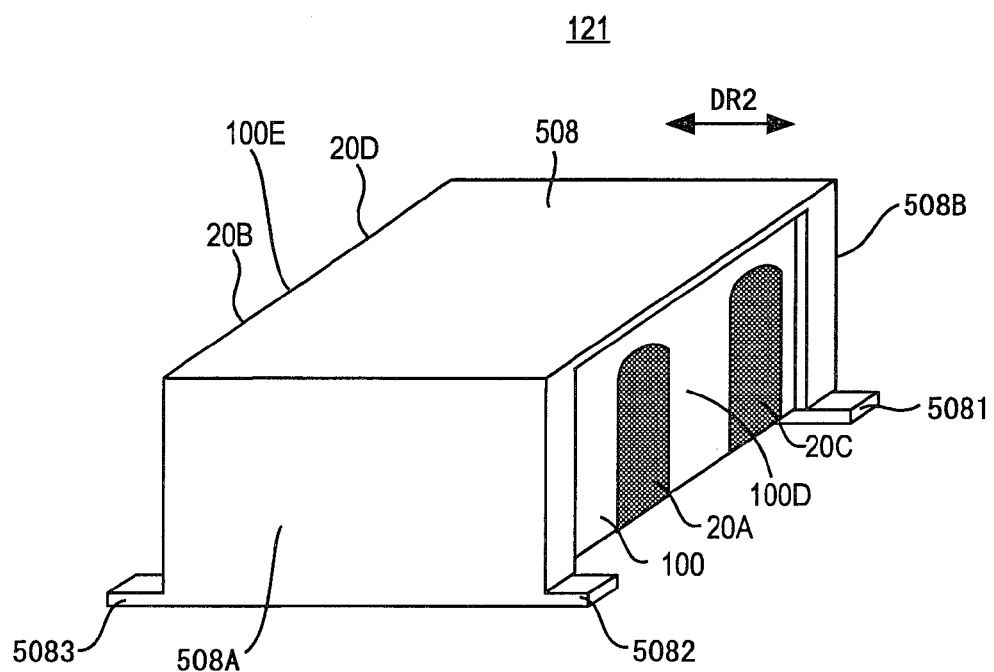
FIG. 62 is further another perspective view illustrating the structure of the electric circuit device according to Embodiment 2.

FIG. 62 is further another perspective view illustrating the structure of the electric circuit device according to Embodiment 2. The electric circuit device according to Embodiment 2 may be an electric circuit device 121 show in FIG. 62.

With reference to FIG. 62, the electric circuit device 120 is identical with the electric circuit device 109 shown in FIG. 60 except that the conductive plate 506 of the electric circuit device 109 is replaced with a conductive plate 508.

The conductive plate 508 is disposed on the top surface 100F, the side surfaces 100A and 100B, and a part of the bottom surface 100C of the electric element 100 and has connections 508A and 508B. The conductive plate 508 is connected to the side anode electrode 10A via the connection 508A, and to the side anode electrode 10B via the connection 508B. The connection 508A has extensions 5082 and 5083 extending out in the width direction DR2 of the electric element 100, while the connection 508B has an extension 5081 extending out in the width direction DR2 of the electric element 100. Note that FIG. 62 only illustrates the three extensions 5081 to 5083 extending out in the width direction DR2 of the electric element 100, however, the connection 508B actually has an extension extending out in the opposite direction to the extension 5081.

The conductive plate 508 is formed of any of silver, copper, gold, aluminum, brass, nickel, iron, platinum, tin, and lead. The conductive plate 508 has the same ridged surface as the ridged surface 500A of the conductive plate 500.

Just like the conductive plate 500, the ridges of the conductive plate 508 have a depth equal to the skin depth caused by the skin effect. Therefore, the conductive plate 508 conducts the direct component of the current I therethrough, and the alternating component of the current I to the conductive plates 11 and 12 in the electric element 100.

As a result, in the electric circuit device 121, the conductive plates 11 and 12 magnetically connect with the conductive plates 21 and 22, and the effective inductance of the conductive plates 11 and 12 becomes smaller than the self inductance of the conductive plates 11 and 12.

Therefore, according to the present invention, the impedance of the electric circuit device 121 is reduced.

Further, an unwanted high frequency current generated in the CPU 110 is confined within the electric element 100 and prevented from leaking toward the power source 90.

Further, the contact area between the conductive plate 508 and the side anode electrodes 10A and 10B is larger than that between the conductive plate 500 and the side anode electrodes 10A and 10B. Therefore, the contact resistance between the conductive plate 508 and the side anode electrodes 10A and 10B is reduced, and temperature rise in the contacting area between the conductive plate 508 and the side anode electrodes 10A and 10B is alleviated.

Further, the conductive plate 508 has the extensions 5081 to 5083 and therefore, when the electric circuit device 121 is disposed on the substrate 200, the contact area with the conductive plates 202 and 203 becomes larger. Therefore, the contact resistance between the electric circuit device 121 and the substrate 200 is reduced, and temperature rise in the contacting area between the electric circuit device 121 and the substrate 200 is alleviated.

Figure 63:
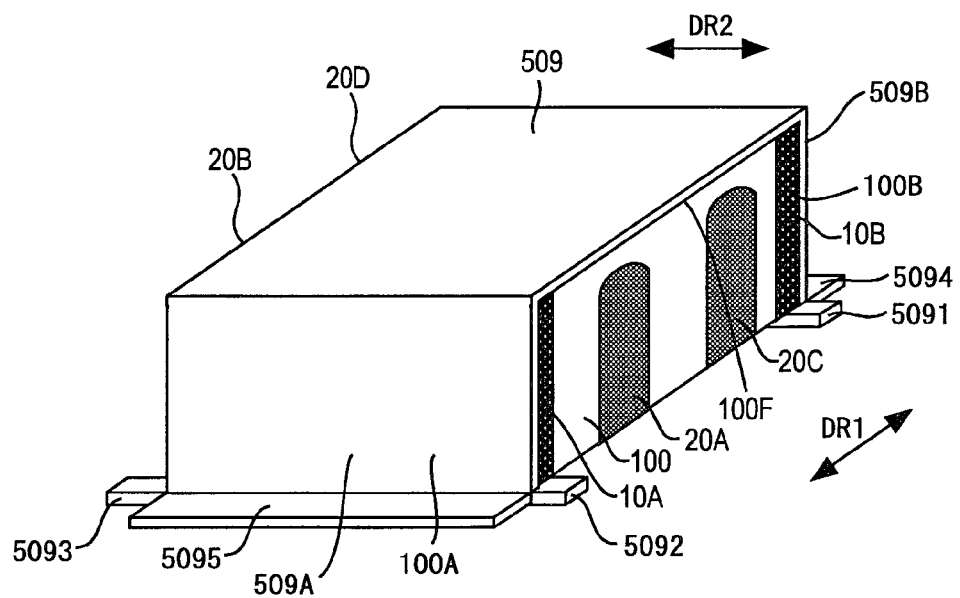
FIG. 63 is further another perspective view illustrating the structure of the electric circuit device according to Embodiment 2.

FIG. 63 is further another perspective view illustrating the structure of the electric circuit device according to Embodiment 2. The electric circuit device according to Embodiment 2 may be an electric circuit device 122 shown in FIG. 63.

With reference to FIG. 63, the electric circuit device 122 is identical with the electric circuit device 120 shown in FIG. 61 except that the conductive plate 507 of the electric circuit device 120 is replaced with a conductive plate 509.

The conductive plate 509 is disposed on the top surface 100F, the side surfaces 100A and 100B, and a part of the bottom surface 100C of the electric element 100 and has connections 509A and 509B. The conductive plate 509 is connected to the side anode electrode 10A via the connection 509A, and to the side anode electrode 10B via the connection 509B. The connection 509A has extensions 5092 and 5093 extending out in the width direction DR2 of the electric element 100, while the connection 509B has an extension 5091 extending out in the width direction DR2 of the electric element 100. Note that FIG. 63 only illustrates the three extensions 5091 to 5093 extending out in the width direction DR2 of the electric element 100, however, the connection 509B actually has an extension extending out in the opposite direction to the extension 5091.

The conductive plate 509 is formed of any of silver, copper, gold, aluminum, brass, nickel, iron, platinum, tin, and lead. The conductive plate 509 has the same ridged surface as the ridged surface 500A of the conductive plate 500.

Just like the conductive plate 500, the ridges of the conductive plate 509 have a depth equal to the skin depth caused by the skin effect. Therefore, the conductive plate 509 conducts the direct component of the current I therethrough, and the alternating component of the current I to the conductive plates 11 and 12 in the electric element 100.

As a result, in the electric circuit device 122, the conductive plates 11 and 12 magnetically connect with the conductive plates 21 and 22, and the effective inductance of the conductive plates 11 and 12 becomes smaller than the self inductance of the conductive plates 11 and 12.

Therefore, according to the present invention, the impedance of the electric circuit device 122 is reduced.

Further, an unwanted high frequency current generated in the CPU 110 is confined within the electric element 100 and prevented from leaking toward the power source 90.

Further, the contact area between the conductive plate 509 and the side anode electrodes 10A and 10B is larger than that between the conductive plate 500 and the side anode electrodes 10A and 10B. Therefore, the contact resistance between the conductive plate 509 and the side anode electrodes 10A and 10B is reduced, and temperature rise in the contacting area between the conductive plate 509 and the side anode electrodes 10A and 10B is alleviated.

Further, the conductive plate 509 includes the extensions 5091 to 5095 and therefore, when the electric circuit device 122 is disposed on the substrate 200, the contact area between the conductive plates 202 and 203 becomes larger. Therefore, the contact resistance between the electric circuit device 122 and the substrate 200 is reduced, and temperature rise in the contacting area between the electric circuit device 122 and the substrate 200 is alleviated.

Figure 64:
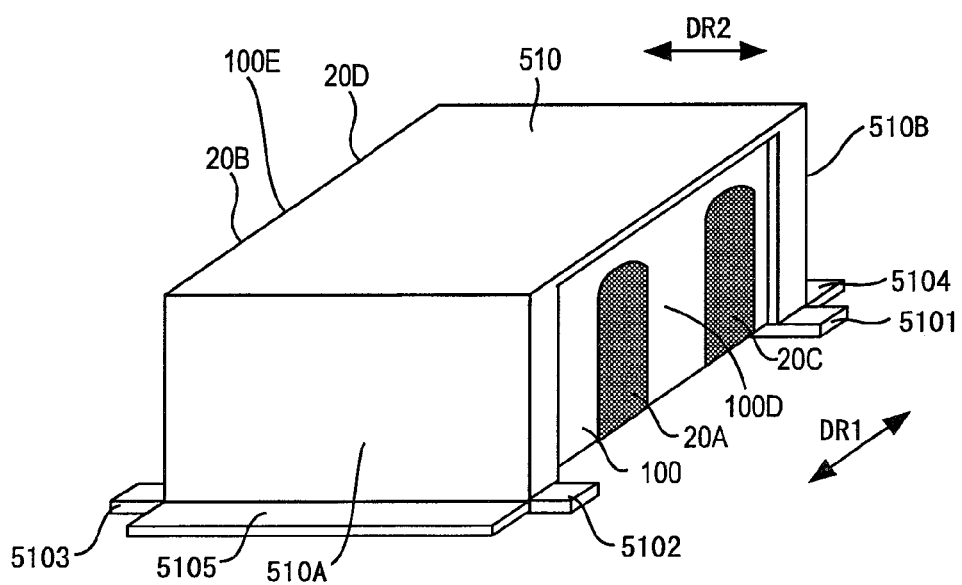
FIG. 64 is further another perspective view illustrating the structure of the electric circuit device according to Embodiment 2.

FIG. 64 is further anther perspective view illustrating the structure of the electric circuit device according to Embodiment 2. The electric circuit device according to Embodiment 2 may be an electric circuit device 123 shown in FIG. 64.

With reference to FIG. 64, the electric circuit device 123 is identical with the electric circuit device 121 shown in FIG. 62 except that the conductive plate 508 of the electric circuit device 121 is replaced with a conductive plate 510.

The conductive plate 510 is disposed on the top surface 100F, the side surfaces 100A and 100B and a part of the bottom surface 100C of the electric element 100 and includes connections 510A and 510B. The conductive plate 510 is connected to the side anode electrode 10A via the connection 510A, and to the side anode electrode 10B via the connection 510B. The connection 510A includes extensions 5102 and 5103 extending out in the width direction DR2 of the electric element 100, while the connection 510B includes an extension 5101 extending out in the width direction DR2 of the electric element 100. Note that FIG. 64 only illustrates the three extensions 5101 to 5103 extending out in the width direction DR2 of the electric element 100, however, the connection 510B actually comprises an extension extending out in the opposite direction to the extension 5101.

The conductive plate 510 is formed of any of silver, copper, gold, aluminum, brass, nickel, iron, platinum, tin, and lead. The conductive plate 510 has the same ridged surface as the ridged surface 500A of the conductive plate 500.

Just like the conductive plate 500, the ridges of the conductive plate 510 have a depth equal to the skin depth caused by the skin effect. Therefore, conductive plate 510 conducts the direct component of the current I therethrough, and the alternating component of the current I to the conductive plates 11 and 12 in the electric element 100.

As a result, in the electric circuit device 123, the conductive plates 11 and 12 magnetically connect with the conductive plates 21 and 22, and the effective inductance of the conductive plates 11 and 12 becomes smaller than the self inductance of the conductive plates 11 and 12.

Therefore, according to the present invention, the impedance of the electric circuit device 123 is reduced.

Further, an unwanted high frequency current generated in the CPU 110 is confined within the electric element 100 and prevented from leaking toward the power source 90.

Further, the contact area between the conductive plate 510 and the side anode electrodes 10A and 10B is larger than that between the conductive plate 500 and the side anode electrodes 10A and 10B. Therefore, the contact resistance between the conductive plate 510 and the side anode electrodes 10A and 10B is reduced, and temperature rise in the contacting area between the conductive plate 510 and the side anode electrodes 10A and 10B is alleviated.

Further, the conductive plate 510 includes the extensions 5101 to 5105 and therefore, when the electric circuit device 123 is disposed on the substrate 200, the contact area with the conductive plates 202 and 203 becomes larger. Therefore, the contact resistance between the electric circuit device 123 and the substrate 200 is reduced, and temperature rise in the contacting area between the electric circuit device 123 and the substrate 200 is alleviated.

As described above, the electric circuit devices 103 to 109 and 120 to 123 according to Embodiment 2 include the conductive plates 500 to 510 having the ridged surface 200A the ridges of which have a depth equal to or greater than the minimum depth $d_{min}$ caused by the skin effect and equal to or less than the maximum depth $d_{max}$. Therefore, the conductive plates 500 to 510 conduct the direct component of the current I therethrough, and the alternating component of the current I to the conductive plates 11 and 12 in the electric element 100. The return current Ir of the current I flows across the conductive plates 21 and 22 in the electric element 100.

As a result, the conductive plates 11 and 12 magnetically connect with the conductive plates 21 and 22, and the effective inductance of the conductive plates 11 and 12 becomes smaller than the self inductance of the conductive plates 11 and 12.

Therefore, according to the present invention, the impedance of the electric circuit devices 103 to 109 and 120 to 123 is reduced.

Further, an unwanted high frequency current generated in the CPU 110 is confined within the electric element 100 and prevented from leaking toward the power source 90.

When mounted onto the substrate, the electric circuit devices 103 to 109 and 120 to 123 are disposed on any of the above-described substrates 200, 200A, 200B, 200C, 200D, 200E, 200F, 200G, 200H, 200J, 200K, 200L, 200M, 200N, 200P, 200Q, and 200R.

As a result, in the electric circuit devices 103 to 109 and 120 to 123, the direct component of the current I flows across the conductive plates 500 to 510, while the alternating component of the current I flows across the conductive plates 11 and 12 in the electric element 100. The return current Ir of the current I flows across the conductive plates 21 and 22 in the electric element 100. More specifically, the alternating component of the current I is conducted to the conductive plates 11 and 12 in the electric element 100 by the conductive plates 500 to 510 disposed outside the electric element 100, while the return current Ir is conducted to the conductive plates 21 and 22 in the electric element 100 by the substrates 200, 200A, 200B, 200C, 200D, 200E, 200F, 200G, 200H, 200J, 200K, 200L, 200M, 200N, 200P, 200Q, and 200R.

Therefore, as described above, the impedance of the electric circuit devices 103 to 109 and 120 to 123 is further reduced.

Further, an unwanted high frequency current generated in the CPU 110 is confined within the electric element 100 and prevented from leaking toward the power source 90.

Note that the electric circuit devices 103 to 109 and 120 to 123 may include the electric element 100A in stead of the electric element 100.

The thickness of the conductive plates 500 to 510 may be determined according to the current value of the direct current supplied to the CPU 110. The conductive plates 500 to 510 may include a plurality of conductive plate strips instead of a single conductive plate.

The rest is the same as Embodiment 1.

In the above, it is described that the electric element 100 is connected between the power source 90 and the CPU 110, however, this invention is not limited to that: the electric element 100 has only to be connected between a first terminal and a second terminal. In this case, the side anode electrode 10A and the anode electrode 10C are disposed on the first terminal side, while the side anode electrode 10B and the anode electrode 10D are disposed on the second terminal side. The side cathode electrodes 20A and 20B and the cathode electrode 20E are disposed on the first terminal side, while the side cathode electrodes 20C and 20D and the cathode electrode 20F are disposed on the second terminal side.

Further, the electric circuit devices 103 to 109 and 120 to 123 may include a conductive plate having only an extension extending out in the longitudinal direction DR1 of the electric element 100. Generally, the electric circuit devices 103 to 109 and 120 to 123 have only to include a conductive plate having an extension extending out in the longitudinal direction DR1 and/or the width direction DR2 of the electric element 100.

Further, with the present invention, each of the substrates 200, 200A, 200B, 200C, 200D, 200E, 200F, 200G, 200H, 200J, 200K, 200L, 200M, 200N, 200P, 200Q, and 200R constitutes a current control member. Each of the conductive plates 500 to 510 constitutes a current control member.

Further, each pair of the conductive plates 11 and 12, and 11A and 12A, constitutes n first conductive plates or n second conductive plates. Each group of the conductive plates 21 to 23, and 21 to 23A, constitutes m second conductive plates or m third conductive plates.

Further, the side anode electrode 10A and the anode electrode 10C constitute a first anode electrode, while the side anode electrode 10B and the anode electrode 10D constitute a second anode electrode. The side cathode electrodes 20A and 20B and the cathode electrode 20E constitute a first cathode electrode, while the side cathode electrodes 20C and 20D and the cathode electrode 20F constitute a second cathode electrode.

Further, the conductive plate 202 and the conductor parts 305, 325, and 415, 416, and 422 constitute a first conductor part. The conductive plate 203 and the conductor parts 306, 328, 419, 420, and 425 constitute a second conductor part. The conductive plates 204, 209 and 212, the via holes BH1 and 423, and the conductor parts 307, 310, 326, and 417 constitute a third conductor part. The conductive plates 205, 210 and 213, the via holes BH2 and 424, and the conductor parts 308, 311, 327, and 418 constitute a fourth conductor part.

Further, the conductor parts 305, 325, 415, and 416 and the via hole 422 constitute a first conductor part. The conductor parts 306, 328, 419, and 420 and the via hole 425 constitute a second conductor part. The slits 303, 312 to 324, and 411 to 414 constitutes a first slit. The conductor parts 307, 310, 326, and 417 and the via hole 423 constitutes a third conductor part. The conductor parts 308, 311, 327, 418 and the via hole 424 constitute a fourth conductor part. The slits 303, 312 to 324, and 411 to 414 constitutes a second slit.

Further, the ridged surface 500A constitutes a ridged part. The connections 504A, 507A, 508A, 509A, and 510A constitutes a first connection. The connections 504B, 507B, 508B, 509B, and 510B constitutes a second connection.

The embodiments as have been described here are mere examples and should not be interpreted as restrictive. The scope of the present invention is determined by each of the claims, not by the written description of the embodiments, and embraces modifications within the meaning of, and equivalent to, the languages in the claims.

INDUSTRIAL APPLICABILITY

The present invention is applied to the electric circuit device the impedance of which is reduced by reducing the inductance. The present invention is also applied to the electric circuit device in which a high frequency current generated in the electric load circuit is prevented from leaking toward the power source.

The invention claimed is:

1. An electric circuit device comprising:
an electric element connected between first and second terminals; and
a current control member conducting the alternating component of a first current supplied from the first terminal at least to a conductive plate in the electric element, receiving from the second terminal a second current that is the return current of the first current, and conducting the alternating component of the received second current at least to a conductive plate in the electric element; wherein
the electric element includes:
n (n is a positive integer) first conductive plate each conducting the alternating component of the first current at least from the first terminal side to the second terminal side;
m (m is a positive integer) second conductive plate alternately laminated with the n first conductive plates and each conducting the alternating component of the second current at least from the second terminal side to the first terminal side, and a first anode electrode disposed on the first terminal side and connected to one end of the n first conductive plate;

a second anode electrode disposed on the second terminal side and connected to the other end of the n first conductive plate;

a first cathode electrode disposed on the first terminal side and connected to one end of the m second conductive plate; and a second cathode electrode disposed on the second terminal side and connected to the other end of the m second conductive plate; and the current control member is connected to the first and the second cathode electrodes and includes a conductor part having the impedance larger than the impedance of the m second conductive plates.

2. The electric circuit device according to claim 1, wherein the electric element further comprises:

the current control member conducts by the skin effect the alternating component of the first current to the n first conductive plate and conducts the direct component of the first current from the first anode electrode to the second anode electrode.

3. An electric circuit device comprising:

an electric element connected between first and second terminals; and a first conductive plate connected to both ends of the electric element wherein the electric element includes: a first anode electrode disposed on the first terminal side;

a second anode electrode disposed on the second terminal side;

a first cathode electrode disposed on the first terminal side;

a second cathode electrode disposed on the second terminal side;

n (n is a positive integer) second conductive plate connected to the first and second anode electrodes; and m (m is a positive integer) third conductive plate alternately laminated with the n second conductive plate and connected to the first and second cathode electrodes;

the first conductive plate is connected between the first and second anode electrodes and includes on the surface a ridged part having a depth equal to or greater than the minimum depth; and the minimum depth is a depth being less than the skin depth $d_s$ caused by the skin effect and suppressing the alternating component of a current flowing by the skin effect across the surface layer of the first conductive plate when the surface of the first conductive plate is flat, wherein the first conductive plate includes:

a first connection connecting the first anode electrodes and a second connection connecting the second anode electrode; wherein the first and second connections have a width wider than the width of the electric element.

4. An electric circuit device comprising:

an electric element connected between first and second terminals; and a first conductive plate connected to both ends of the electric element wherein the electric element includes: a first anode electrode disposed on the first terminal side;

a second anode electrode disposed on the second terminal side;

a first cathode electrode disposed on the first terminal side;

a second cathode electrode disposed on the second terminal side;

n (n is a positive integer) second conductive plate connected to the first and second anode electrodes; and m (m is a positive integer) third conductive plate alternately laminated with the n second conductive plate and connected to the first and second cathode electrodes;

the first conductive plate is connected between the first and second anode electrodes and includes on the surface a ridged part having a depth equal to or greater than the minimum depth; and the minimum depth is a depth being less than the skin depth $d_s$ caused by the skin effect and suppressing the alternating component of a current flowing by the skin effect across the surface layer of the first conductive plate when the surface of the first conductive plate is flat, wherein the first conductive plate includes:

a first connection connecting the first anode electrodes and a second connection connecting the second anode electrode; wherein the first and second connections have an extension extending out in the width direction of the electric element and/or the longitudinal direction of the electric element.

5. An electric circuit device comprising:

an electric element connected between first and second terminals; and a first conductive plate connected to both ends of the electric element wherein the electric element includes: a first anode electrode disposed on the first terminal side;

a second anode electrode disposed on the second terminal side;

a first cathode electrode disposed on the first terminal side;

a second cathode electrode disposed on the second terminal side;

n (n is a positive integer) second conductive plate connected to the first and second anode electrodes; and m (m is a positive integer) third conductive plate alternately laminated with the n second conductive plate and connected to the first and second cathode electrodes;

the first conductive plate is connected between the first and second anode electrodes and includes on the surface a ridged part having a depth equal to or greater than the minimum depth; and the minimum depth is a depth being less than the skin depth $d_s$ caused by the skin effect and suppressing the alternating component of a current flowing by the skin effect across the surface layer of the first conductive plate when the surface of the first conductive plate is flat, wherein the minimum depth is set to a depth being less than the skin depth determined by the highest frequency of the alternating current component generated by an electric load circuit connected to the electric element and suppressing the alternating current component having the highest frequency and flowing by the skin effect across the surface layer of the first conductive plate, wherein the ridged part has a depth equal to or greater than the skin depth, wherein
the ridged part has a depth equal to or greater than the skin depth and equal to or less than the maximum depth; and
the maximum depth is determined, when the number of the electric load circuit is one, based on the cross-section area of the first conductive plate required to conduct a direct current supplied to the one electric load circuit to the first conductive plate, and when j (j is an integer equal to or larger than 2) electric load circuits are connected to the electric element in parallel with each other, determined based on the cross-section area of the first conductive plate required to conduct direct currents supplied to all of the j electric load circuits to the first conductive plate.

6. The electric circuit device according to claim 5, wherein the skin depth is the skin depth at the lowest frequency of the frequencies of the alternating current component generated by the electric load circuit.

* * * * *